(12) United States Patent
Arai et al.

(10) Patent No.: US 8,741,699 B2
(45) Date of Patent: Jun. 3, 2014

(54) METHOD OF MANUFACTURING SEMICONDUCTOR DEVICE AND SEMICONDUCTOR DEVICE

(75) Inventors: Daisuke Arai, Kanagawa (JP); Yoshito Nakazawa, Kanagawa (JP); Ikuo Hara, Kanagawa (JP); Tsuyoshi Kachi, Kanagawa (JP); Yoshinori Hoshino, Kanagawa (JP); Tsuyoshi Tabata, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 118 days.

(21) Appl. No.: 13/479,360

(22) Filed: May 24, 2012

(65) Prior Publication Data
US 2012/0299056 A1 Nov. 29, 2012

(30) Foreign Application Priority Data

May 27, 2011 (JP) .................................. 2011-119601
Feb. 13, 2012 (JP) .................................. 2012-028261

(51) Int. Cl.
*H01L 21/332* (2006.01)
(52) U.S. Cl.
USPC ........................................................ 438/135
(58) Field of Classification Search
USPC ........................................ 438/135, 136, 138
See application file for complete search history.

(56) References Cited

U.S. PATENT DOCUMENTS

| 5,707,901 A * | 1/1998 | Cho et al. ....................... 438/595 |
| 8,053,859 B2 | 11/2011 | Lu et al. |
| 2003/0181000 A1* | 9/2003 | Mori .............................. 438/200 |
| 2006/0043495 A1* | 3/2006 | Uno et al. ...................... 257/382 |
| 2007/0029607 A1* | 2/2007 | Kouznetzov ................... 257/321 |
| 2009/0075433 A1* | 3/2009 | Aida et al. ..................... 438/138 |
| 2013/0093001 A1* | 4/2013 | Bhalla et al. ................... 257/329 |
| 2013/0234226 A1* | 9/2013 | Shen et al. ..................... 257/319 |

FOREIGN PATENT DOCUMENTS

| JP | 9-270513 A | 10/1997 |
| JP | 9-331063 A | 12/1997 |
| JP | 11-195784 A | 7/1999 |
| JP | 2001-515662 A | 9/2001 |
| JP | 2002-158356 A | 5/2002 |
| JP | 2007-42826 A | 2/2007 |
| JP | 2008-153454 A | 7/2008 |
| JP | 2008-532257 A | 8/2008 |
| JP | 2009-43952 A | 2/2009 |
| JP | 2009-123967 A | 6/2009 |
| JP | 2010-62262 A | 3/2010 |

* cited by examiner

*Primary Examiner* — Yu-Hsi D Sun
*Assistant Examiner* — Grant Withers
(74) *Attorney, Agent, or Firm* — Miles & Stockbridge P.C.

(57) ABSTRACT

Techniques capable of improving the yield of IGBTs capable of reducing steady loss, turn-off time, and turn-off loss are provided. Upon formation of openings in an interlayer insulting film formed on a main surface of a substrate, etching of a laminated insulating film of a PSG film and an SOG film and a silicon oxide film is once stopped at a silicon nitride film. Then, the silicon nitride film and the silicon oxide film are sequentially etched to form the openings. As a result, the openings are prevented from penetrating through an n-type source layer and a p$^+$-type emitter layer having a thickness of 20 to 100 nm and reaching the substrate.

8 Claims, 60 Drawing Sheets

US 8,741,699 B2

METHOD OF MANUFACTURING SEMICONDUCTOR DEVICE AND SEMICONDUCTOR DEVICE

CROSS-REFERENCE TO RELATED APPLICATION

The present application claims priorities from Japanese Patent Application No. 2011-119601 filed on May 27, 2011, and Japanese Patent Application No. 2012-28261 filed on Feb. 13, 2012, the contents of which are hereby incorporated by reference into this application.

TECHNICAL FIELD OF THE INVENTION

The present invention relates to manufacturing techniques of semiconductor devices and the semiconductor devices and particularly relates to the techniques effectively applied to manufacturing of planar-gate type IGBTs (Insulated Gate Bipolar Transistors).

BACKGROUND OF THE INVENTION

For example, Japanese Patent Application Laid-Open Publication No. 2009-123967 (Patent Document 1) discloses a method of manufacturing a semiconductor device, wherein a single-crystal silicon layer is epitaxially grown in openings in an oxide film formed in a main surface of a starting substrate, a polycrystalline silicon layer is grown on the oxide film, and defects etc. introduced into the single-crystal silicon layer and the polycrystalline silicon layer are then recovered by thermal treatment or laser annealing treatment.

Japanese Patent Application Laid-Open Publication No. 2009-43952 (Patent Document 2) discloses a method of manufacturing a semiconductor device, wherein a single-crystal thin film is formed in an active portion by epitaxial growth from second openings provided in a substrate oxide film, third openings corresponding to the second openings of the substrate oxide film are then formed in the single-crystal thin film, and the interiors of the third openings are buried again with an insulating film.

Japanese Patent Application Laid-Open Publication No. 2008-153454 (Patent Document 3) discloses a method of manufacturing a MOS-type semiconductor device including: a step of forming a second insulating film in a first opening formed in a main surface of a semiconductor substrate and forming a second opening in the second insulating film; a step of forming a cathode film by forming a first cathode film burying part of the first opening and forming a second cathode film burying the rest of the first opening; and a step of forming a gate insulating film and a gate electrode on the surface of the cathode film and then forming a base region and an emitter region in the first cathode film by ion implantation, wherein the first cathode film is formed by an epitaxial method.

Japanese Patent Application Laid-Open Publication No. 2008-532257 (Patent Document 4) discloses a semiconductor device, wherein latch-up is prevented by providing a buried insulating region partially between an $n^-$-drift layer and a first n-region thereabove, depletion of the $n^-$-drift layer in an off-state is facilitated by providing a p-region between the buried insulating region and the $n^-$-drift layer, and the heat generated in a channel region or the first n-region can be allowed to escape to a $p^+$-collector layer, which is a semiconductor substrate, by providing a second n-region between the first n-region and the $n^-$-drift layer.

Japanese Patent Application Laid-Open Publication No. 2007-42826 (Patent Document 5) discloses a semiconductor device, wherein a Box layer is bored at a location close to a scribe line of a diode active region and an edge region, and a $p^-$-buried region in contact with the Box layer is formed at an end of the Box layer in the diode active region side so as to reduce electric-field concentration and ensure a high withstand voltage.

Japanese Patent Application Laid-Open Publication No. 2001-515662 (Patent Document 6) discloses an SOI-IGBT, wherein a channel zone, a cell zone, and an intermediate zone are formed on an insulating layer provided on a semiconductor substrate and are connected to the semiconductor substrate via cut-away parts formed in the insulating layer.

Japanese Patent Application Laid-Open Publication No. H9-270513 (Patent Document 7) discloses a power device such as a power MOSFET having a high avalanche breakdown voltage obtained by burying an oxide film in an element and proactively utilizing an SOI structure.

Japanese Patent Application Laid-Open Publication No. H11-195784 (Patent Document 8) discloses an insulating-gate-type semiconductor element having a structure in which: gate electrodes with gate insulating films are disposed in a base region so as to narrow a carrier diffusion path, emitter regions are provided at both ends on the upper side of the gate insulating films, holes which have passed through the diffusion path easily gather in the emitter regions and do not easily gather in the emitter region of a parasitic transistor, and the resistance of the base region is reduced.

Japanese Patent Application Laid-Open Publication No. H9-331063 (Patent Document 9) discloses a gate-trench-type high withstand voltage IGBT, wherein an insulating layer is buried in a region of an $n^-$-silicon substrate between gate trenches disposed at a predetermined pitch.

Japanese Patent Application Laid-Open Publication No. 2002-158356 (Patent Document 10) discloses a MIS semiconductor device such as an IGBT which enables miniaturization, etc. of an emitter structure by forming gate electrodes on a semiconductor substrate via an insulating film and forming p-base regions and $n^+$-emitter regions in a thin-film semiconductor layer formed, via the insulating film, on the gate electrodes from the surface of the semiconductor substrate and through a coupling semiconductor part and causing an emitter layer to be a thin film.

Japanese Patent Application Laid-Open Publication No. 2010-62262 (Patent Document 11) discloses an IGBT having: a base layer; a buried insulating film having an opening; a surface semiconductor layer connected to the base layer below the opening; a p-type channel formation layer, an $n^+$-type source layer, and a $p^+$-type emitter layer formed in the surface semiconductor layer; a gate electrode formed on the surface semiconductor layer via a gate insulating film; an $n^+$-type buffer layer; and a p-type collector layer, etc., wherein the content that the thickness of the surface semiconductor layer is 20 to 100 nm is described.

SUMMARY OF THE INVENTION

The structure of an IGBT which has been studied by the inventors of the present invention and to which the present invention has not yet been applied will be explained with reference to a cross-sectional view of main part of an IGBT shown in FIG. 55.

For example, as described in above-described Patent Document 11, the IGBT has the structure in which: a plurality of surface semiconductor layers 54 composed of $n^-$-type single-crystal silicon are formed, via buried insulating films 53, above a main surface of a base layer 52 composed of $n^-$-type single-crystal silicon; and the base layer 52 and the surface semiconductor layers 54 are mutually connected through openings 55 formed in the buried insulating films 53. A plurality of active regions are defined above the main surface of the base layer 52 by a plurality of field insulating films 56, which are thicker than the buried insulating films 53, and the surface semiconductor layers 54 are formed in the plurality of active regions, respectively. The thicknesses of the above-described surface semiconductor layers 54 are set to 100 nm or less, more desirably in the range of 40 to 20 nm in order to reduce the steady loss, turn-off time, and turn-off loss of the IGBT (see above-described Patent Document 11).

A p-type channel layer 57, an $n^+$-type source layer 58, and a $p^+$-type emitter layer 59 are formed in the surface semiconductor layer 54 above the buried insulating films 53. A gate electrode 61 composed of polycrystalline silicon is formed above each of the surface semiconductor layers 54 via a gate insulating film 60. An interlayer insulating film 64 composed of a silicon oxide such as a PSG (Phospho Silicate Glass) film is formed so as to cover the gate electrode 61 above the surface semiconductor layers 54 and the field insulating films 56. In the interlayer insulating film 64, openings 65, which reach the surface semiconductor layers 54 (the $n^+$-type source layer 58 and the $p^+$-type emitter layer 59), and openings (illustration omitted), which reach the gate electrodes 61, are formed. Above the interlayer insulating film 64, an emitter pad (emitter electrode) 66, which is connected to the $n^+$-type source layer 58 and the $p^+$-type emitter layer 59 at the bottom of the openings 65, and a gate pad (illustration omitted), which is connected to the gate electrode 61 at the bottom of the opening that reaches the gate electrode 61, are formed so as to be separated from each other. On the back surface of the base layer 52, an n-type buffer layer 68, a p-type collector layer 69, and a collector electrode 70 are formed in this order from the side close to the base layer 52.

Upon formation of the openings 65 in the interlayer insulating film 64, the interlayer insulating film 64 composed of the silicon oxide is processed while using the surface semiconductor layers 54 composed of single-crystal silicon and the gate electrodes 61 composed of polycrystalline silicon as an etching stopper layer by using photolithography techniques and dry etching techniques. However, the thickness of the interlayer insulating film 64 is, for example, 600 nm, and the thickness of the surface semiconductor layer 54 is, for example, 20 to 100 nm; therefore, if over-etching is carried out in order to avoid opening defects of the openings 65, in some cases, the openings 65 penetrate through the surface semiconductor layers 54 ($n^+$-type source layer 58 and the $p^+$-type emitter layer 59) and penetrate through the buried insulating films 53 further below them, and the openings 65 reach the base layer 52. If the openings 65 reach the base layer 52, the emitter pad 66, which is buried in the openings 65, and the base layer 52 are connected to each other, and operation defects of the IGBT are caused.

If the thickness of the surface semiconductor layers 54 is reduced to, for example, 20 to 100 nm, the problem of reduction in breakdown tolerance caused by, for example, concentration of hole currents, which flow from the collector side to the emitter side upon collection of the hole currents, on an end of the $p^+$-type emitter layer 59 becomes obvious.

It is an object of the present invention to provide techniques capable of improving the yield of IGBTs capable of reducing the steady loss, turn-off time, and turn-off loss.

The above and other preferred aims and novel characteristics of the present invention will be apparent from the description of the present specification and the accompanying drawings.

The typical ones of the inventions disclosed in the present application will be briefly described as follows.

This embodiment is a method of manufacturing a semiconductor device including an IGBT. First, a plurality of thick-film portions composed of an insulating film and having a first thickness and a plurality of thin-film portions having a second thickness thinner than the first thickness are formed on a main surface of a substrate exhibiting n-type conductivity type, a separated portion reaching the substrate is formed in the thin-film portion, and a surface semiconductor layer exhibiting n-type conductivity type is formed on the thin-film portion so as to bury the spacing portion. Then, a p-type channel layer is formed in the surface semiconductor layer, and a $p^+$-type emitter layer having a higher concentration than the p-type channel layer is formed in the surface semiconductor layer so as to be in contact with the p-type channel layer. Then, a gate insulating film is formed on a surface of the surface semiconductor layer, a gate electrode is formed on the gate insulating film, and an $n^-$-type source layer is then formed in the surface semiconductor layer in both sides of the gate electrode. Then, a sidewall is formed on a side surface of the gate electrode, and an $n^+$-type source layer having a higher concentration than the $n^-$-type source layer is then formed in the surface semiconductor layer in both sides of the sidewall. Then, an interlayer insulating film composed of a laminated film of a first oxide film, a nitride film, and a second oxide film is formed on the main surface of the substrate, the second oxide film is then etched while using the nitride film as an etching stopper, and, subsequently, the nitride film and the first oxide film are sequentially etched to form openings, which reach the $p^+$-type emitter layer and the $n^+$-type source layer, in the interlayer insulating film. Then, an emitter electrode electrically connected to the $p^+$-type emitter layer and the $n^+$-type source layer is formed on the $p^+$-type emitter layer and the $n^+$-type source layer.

This embodiment also provides a semiconductor device including an IGBT. The semiconductor device has: a p-type collector layer; an n-type buffer layer formed on the p-type collector layer; an n-type base layer formed on the n-type buffer layer; a plurality of buried insulating films formed on the n-type base layer and having a first thickness; openings formed in the plurality of buried insulating films, respectively; and an insulating film formed around the plurality of buried insulating films, having a second thickness larger than the first thickness, and defining a plurality of active regions. Furthermore, the semiconductor device has: n-type surface semiconductor layers formed respectively on the plurality of buried insulating films in the plurality of active regions; a p-type channel layer formed in the n-type surface semiconductor layer; a $p^+$-type emitter layer formed so as to be in contact with the p-type channel layer in the n-type surface semiconductor layer; and an $n^-$-type source layer and an $n^+$-type source layer formed in the n-type surface semiconductor layer. The impurity concentration of the $p^+$-type emitter layer is higher than the impurity concentration of the p-type channel layer, and the impurity concentration of the $n^-$-type source layer is higher than the impurity concentration of the n-type surface semiconductor layer. Furthermore, the semiconductor device has: a gate insulating film selectively formed on a part of a surface of the n-type surface semiconductor layer; and a gate electrode formed on the gate insulating film. The gate electrode is extending along a first direction, and the insulating film is separated from the gate electrode and extending along the first direction; the $n^-$-type source layer and the $n^+$-type source layer and the $p^+$-type emitter layer are alternately disposed along the first direction in a single belt-like region between the gate electrode and the insulating film in a top view. The n⁻-type source layer and the n⁺-type source layer and the p⁺-type emitter layer are opposed to each other along a second direction orthogonal to the first direction with the gate electrode interposed therebetween in the top view; and the n⁻-type source layer and the n⁺-type source layer and the p⁺-type emitter layer are alternately disposed along the second direction in the top view.

The effects obtained by typical aspects of the present invention will be briefly described below.

The yield of the IGBTs capable of reducing the steady loss, turn-off time, and turn-off loss can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In addition, when mentioning about materials etc., specified materials are main materials and thus subsidiary components, additives, additional components etc. are not excluded unless otherwise clearly mentioning that the materials are not main materials or the materials are not main ones in principle or from the situation. For example, a silicon member is not only pure silicon except the case specifying something and thus using additive impurities, binary, ternary, or other alloys (e.g., SiGe), and so forth are included. Further, in the following embodiments, when citing silicon nitride, not only $Si_3N_4$ but also an insulating film of nitrided silicon having a similar composition is included.

Moreover, in some drawings used in the embodiments, hatching is used even in a plan view so as to make the drawings easy to see. Note that components having the same function are denoted by the same reference symbols in principle throughout the drawings for describing the embodiment, and the repetitive description thereof will be omitted. Hereinafter, embodiments of the present invention will be described in detail with reference to the accompanying drawings.

(First Embodiment)

<<Semiconductor Device>>

Figure 1:
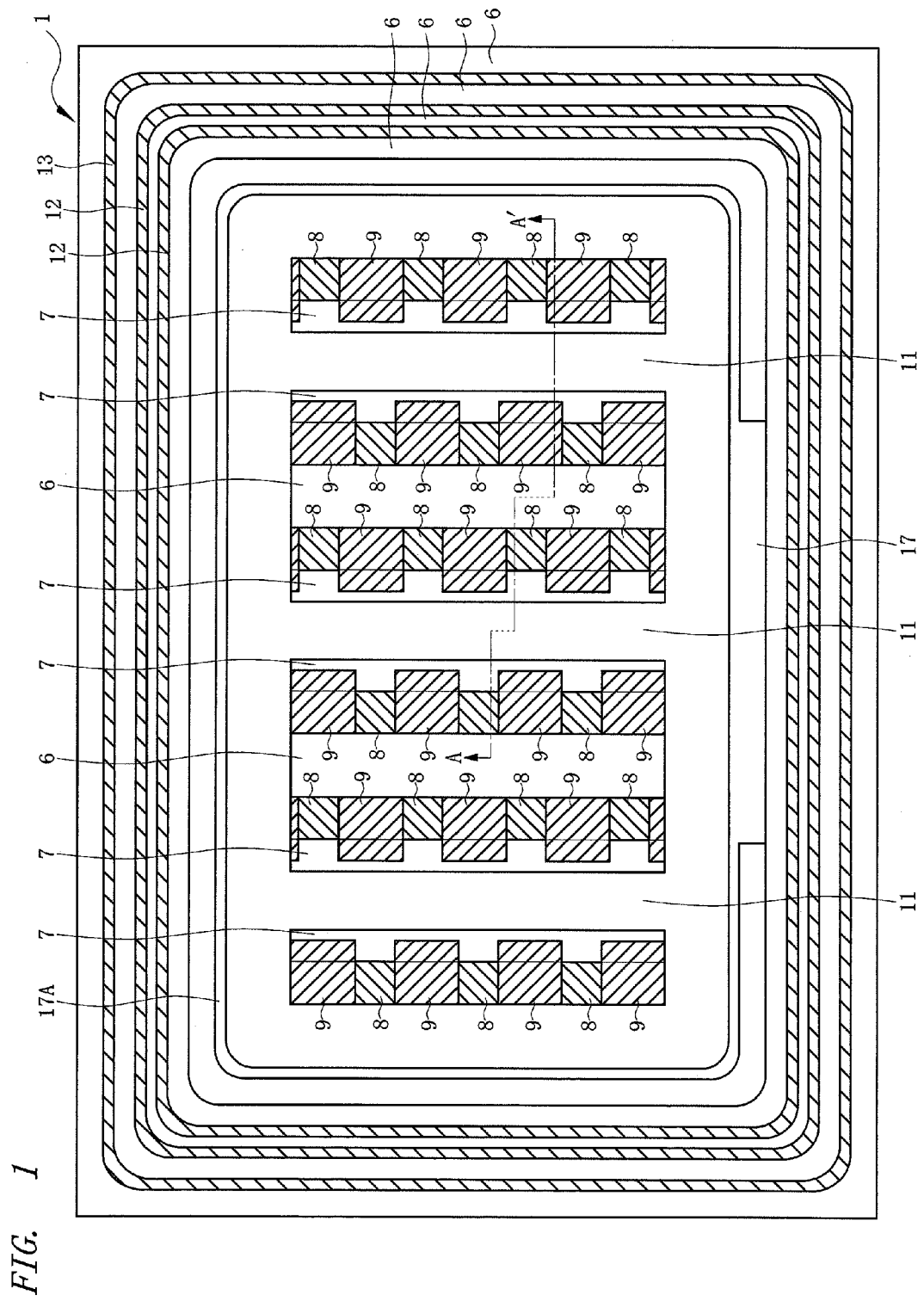
FIG. 1 is a plan view of main part of a semiconductor chip for forming IGBTs according to a first embodiment of the present invention.
Figure 2:
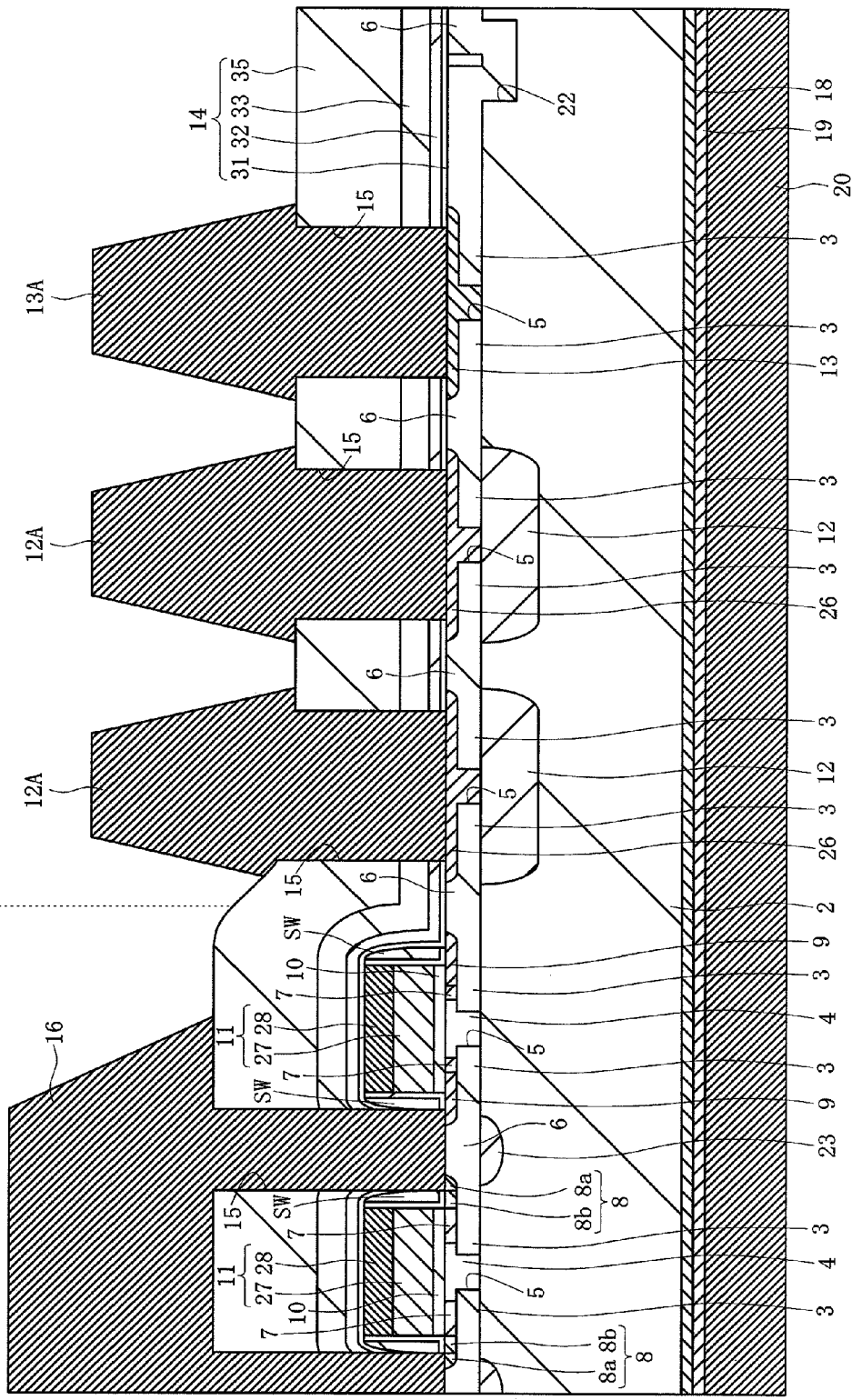
FIG. 2 is a cross-sectional view of main part showing an active portion and a peripheral portion of the semiconductor chip forming the IGBTs according to the first embodiment of the present invention (the active portion is shown by the cross-sectional view of main part corresponding to the cross section taken along the line A-A' shown in FIG. 1)

A semiconductor device including IGBTs according to a first embodiment of the present invention will be explained by using FIG. 1 and FIG. 2. FIG. 1 is a plan view of main part of a semiconductor chip on which the IGBTs are formed, and FIG. 2 is a cross-sectional view of main part showing an active portion and a peripheral portion of the semiconductor chip (the active portion is shown by the cross-sectional view of main part corresponding to the cross section taken along the line A-A' shown in FIG. 1). A part of the active portion of the semiconductor chip shown in FIG. 1 is shown in and enlarged manner.

Elements of the IGBTs are formed in the active portion of the semiconductor chip 1. The elements of the IGBTs have, for example, a structure in which: a plurality of surface semiconductor layers 4 composed of an n⁻-type single-crystal silicon are formed on a main surface (surface) of a base layer 2 composed of an n⁻-type single-crystal silicon via buried insulating films 3, and the base layer 2 and the surface semiconductor layers 4 are mutually connected through openings (spacing portions) 5 formed in the buried insulating films 3. A plurality of active regions are defined on the main surface of the base layer 2 by a plurality of insulating films 6 thicker than the above-described buried insulating films 3, and the surface semiconductor layers 4 are formed in the plurality of active regions, respectively. The thickness of the base layer 2 is, for example, 70 μm to 100 μm. This thickness is determined in accordance with the withstand voltage of the IGBTs. For example, if the withstand voltage is 600 V, the thickness is 60 μm to 100 μm; and, if the withstand voltage is 1200 V, the thickness is 120 μm to 150 μm. The thickness of the surface semiconductor layer 4 is set to be 100 nm or less, more desirably to a range within 20 to 40 nm in order to reduce the steady loss, turn-off time, and turn-off loss of the IGBTs.

In the surface semiconductor layers 4 above the buried insulating films 3, p-type channel layers 7, n-type source layers 8 composed of $n^+$-type source layers 8a and $n^-$-type source layers 8b, and $p^+$-type emitter layers (p-type back gate layer) 9 are formed. The impurity concentration in the $n^+$-type source layer 8a is higher than the impurity concentration in the $n^-$-type source layer 8b, and the n"-type source layer 8b is formed in the p-type channel layer 7 side (between the p-type channel layer 7 and the $n^+$-type source layer 8a). The impurity concentration in the $p^+$-type emitter layer 9 is higher than the impurity concentration in the p-type channel layer 7.

Gate electrodes 11 are patterned on the surface semiconductor layers 4 via gate insulating films 10, wherein a belt-like pattern in which all the gate electrodes 11 are mutually coupled is formed in a top view. Part of the gate electrodes 11 has a pattern that surrounds the plurality of surface semiconductor layers 4 in the top view. The gate electrode 11 is composed of, for example, a laminated film in which a polycrystalline silicon film 27 and a tungsten silicide layer 28 are deposited sequentially from the bottom.

The above-described n-type source layer 8 and the above-described $p^+$-type emitter layer 9 cannot be formed in the same cross section. Therefore, in the top view, the n-type source layers 8 and the $p^+$-type emitter layers 9 are alternately disposed in a single belt-like region between the gate electrode 11 and the insulating film 6. Breakdown tolerance is increased by causing the flat-surface area of the n-type source layers 8 to be smaller than the flat-surface area of the $p^+$-type emitter layers 9. The above-described p-type channel layer 7 is formed between the gate electrode 11 and the buried insulating film 3. The p-type channel layers 7 are connected to the $p^+$-type emitter layers 9 to fix the electric potential thereof; therefore, deteriorations in characteristics due to formation of parasitic MOS can be prevented.

Sidewalls SW are formed on the side surfaces of the gate electrodes 11. If a high-concentration impurity is ion-implanted into the surface conductive layers 4 below the side surfaces of the gate electrodes 11 while using the gate electrodes 11 as masks, there has been a concern that crystal defects are generated in the surface conductive layers 4 below the side surfaces of the gate electrodes 11 due to thermal treatment thereafter. Therefore, generation of the crystal defects in the surface semiconductor layers 4 below the side surfaces of the gate electrodes 11 is prevented by forming sidewalls SW on the side surfaces of the gate electrodes 11 and ion-implanting a high-concentration impurity into the surface conductive layers 4 below ends of the sidewalls SW while using the sidewalls SW as masks. Thus, the low-concentration n⁻-type source layers 8b are formed in the surface conductive layers 4 in the vicinity below the side surfaces of the gate electrodes 11, and the high-concentration n⁺-type source layers 8a are formed in the surface conductive layers 4 in the vicinity below the ends of the sidewalls SW.

P-type wells 23 are formed in the base layer 2 below the plurality of thick insulating films 6 of the active portion. A junction withstand voltage is maintained by a depletion layer expanding to the base layer 2 from the pn-junction part of the p-type channel layer 7 and the base layer 2; however, the junction withstand voltage can be further increased by subsidiarily providing the p-type well 23.

In the peripheral portion of the semiconductor chip 1, a plurality of p-type field limiting rings (Field Limiting Rings) 12 are formed so as to surround the above-described active portion in the top view, and, furthermore, an n-type guard ring (channel stopper) 13 is formed so as to surround the plurality of p-type field limiting rings 12.

The p-type field limiting rings 12 are formed by introducing an impurity exhibiting the p-type into the base layer 2. The p-type field limiting rings 12 are structured so as to be connected to $p^+$-type semiconductor layers 26 (formed in a manner similar to that of the above-described surface semiconductor layers 4 and having an impurity concentration equivalent to the impurity concentration in the $p^+$-type emitter layers 9), to which an impurity exhibiting the p-type has been introduced, through the openings 5 formed in the buried insulating film 3, and the voltage thereof is fixed by a field limiting ring electrode 12A. FIG. 1 shows an example in which two p-type field limiting rings 12 are formed; however, a larger number of the rings may be formed. When the plurality of p-type field limiting rings 12 as described above are formed, electric fields are shared by the plurality of p-type field limiting rings 12; therefore, a high withstand voltage of the IGBTs according to the first embodiment is enabled.

The n-type guard ring 13, which is formed so as to surround the plurality of p-type field limiting rings 12, has the function of protecting the elements of the IGBTs in the semiconductor chip 1 after the semiconductor chip 1 is diced from a semiconductor wafer. The n-type guard ring 13 is formed in a manner similar to the above-described surface semiconductor layers 4 and has the structure to which an impurity exhibiting the n-type is introduced, and the voltage thereof is fixed by a guard-ring electrode 13A. The n-type guard ring 13 has an impurity concentration equivalent to the impurity concentration in the $n^+$-type source layers 8a.

Furthermore, in the active portion and the peripheral portion of the semiconductor chip 1, an interlayer insulating film 14 is formed so as to cover the elements of the IGBTs, the p-type field limiting rings 12, and the n-type guard ring 13. The interlayer insulating film 14 is composed of, for example, a laminated film in which a silicon oxide film 31, a silicon nitride film 32, a silicon oxide film 33, and a laminated insulating film 35 of a PSG (Phospho Silicate Glass) film and a SOG (Spin On Glass) film are deposited sequentially from the bottom. In the interlayer insulating film 14, openings 15 which reach the n-type source layers 8, the $p^+$-type emitter layers 9, the gate electrodes 11, the $p^+$-type semiconductor layers 26, and the n-type guard ring 13 are formed.

In the state in which the openings 15 are formed, emitter pads (emitter electrodes) 16 connected to the n-type source layers 8 and the $p^+$-type emitter layers 9, the field limiting ring electrodes 12A connected to the $p^+$-type semiconductor layers 26, and the guard ring electrode 13A connected to the n-type guard ring 13 are formed on the interlayer insulating film 14 to be mutually separated. Furthermore, a gate finger 17A connected to the gate electrodes 11 is formed so as to surround the above-described active portion. The gate finger 17A is connected to the gate electrodes 11 through the openings (illustration omitted) formed in the interlayer insulating film 14 therebelow and is formed to be continuous to gate pads 17. The emitter pads 16, etc. are formed of, for example, Al (aluminum).

Furthermore, a polyimide film (illustration omitted) is formed so as to cover the emitter pads 16, etc. Openings which expose the surfaces of part of the emitter pads 16 and the surfaces of part of the gate pads 17 are formed in the polyimide film. These openings serve as bonding pads for connecting bonding wires for electrically connecting the semiconductor chip 1 to the outside. In accordance with needs, an opening which exposes the surface of part of the guard ring electrode 13A is sometimes formed in the above-described polyimide film.

An n-type buffer layer 18, a p-type collector layer 19, and a collector electrode 20 are formed on the back surface of the base layer 2 in this order from the side close to the base layer 2. In order to increase the speed of switching and reduce switching loss, it is desired to reduce the amount of hole injection from the back surface, and the concentration of an impurity introduced into the p-type collector layer 19 and exhibiting the p-type has to be reduced. However, a low impurity concentration increases the specific resistance of the p-type collector layer 19. Therefore, the p-type collector layer 19 is required to be formed to be thin in order to reduce the series resistance component thereof, and the thickness thereof is preferred to be, for example, 5 µm or less. Furthermore, in the case in which the fact that the diffusion coefficient of B (boron) which is the impurity exhibiting p-type conductivity type introduced into the p-type collector layer 19 is small is taken into consideration, the thickness of the p-type collector layer 19 is preferred to be, for example, 1 µm or less. The collector electrode 20 is formed of: a metal film in which an Al (aluminum) film, a Ti (titanium) film, a Ni (nickel) film, and an Au (gold) film are stacked in this order from the side close to the p-type collector layer 19; a metal film in which a Ni (nickel) film, a Ti (titanium) film, a Ni (nickel) film, and an Au (gold) film are stacked in this order from the side close to the p-type collector layer 19; or a metal film in which a Ti (titanium) film, a Ni (nickel) film, and an Au (gold) film are stacked in this order from the side close to the p-type collector layer 19.

The IGBTs according to the present first embodiment has a characteristic in the arrangement of the n-type source layers 8 and the p$^+$-emitter layers 9; and, by virtue of this, reduction in the breakdown tolerance upon collection of hole currents can be prevented even when the thickness of the surface semiconductor layers 4 (p$^+$-type emitter layers 9) is as thin as, for example, 20 to 100 nm. The collection of the hole currents occur, for example, upon turn-off from an on-state. In some cases, the hole currents are collected in order to prevent breakdown caused by load short-circuit. The load short-circuit refers to the state in which, for example, when the IGBT is turned on with a load coil forgotten to be connected, a power-supply voltage is applied between a collector and an emitter, and a large current flows; and, if this state is obtained, the amount of heat generation is extremely increased, and the risk of latch-up is increased.

Figure 56:
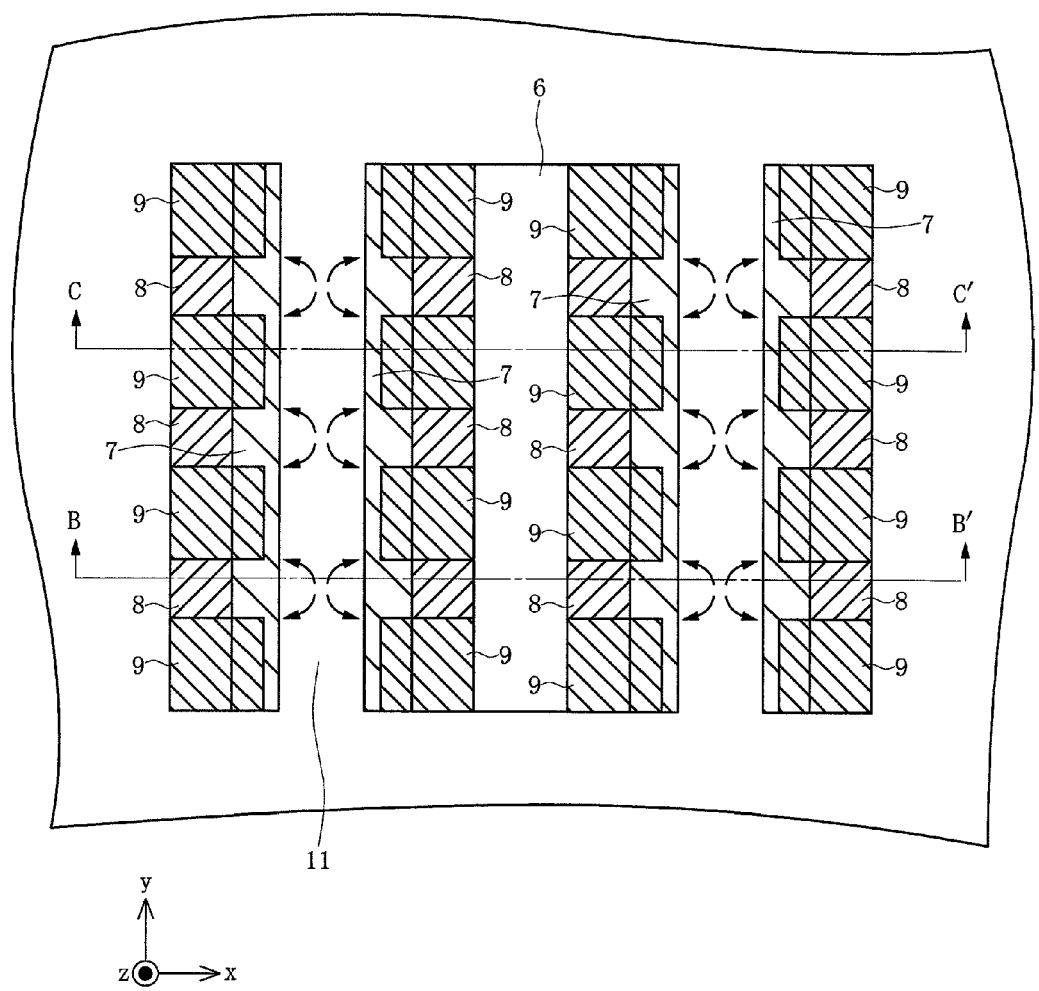
FIG. 56 is a plan view of main part showing, in an enlarged manner, a part of the active portion of the semiconductor chip studied by the inventors of the present invention.
Figure 57:
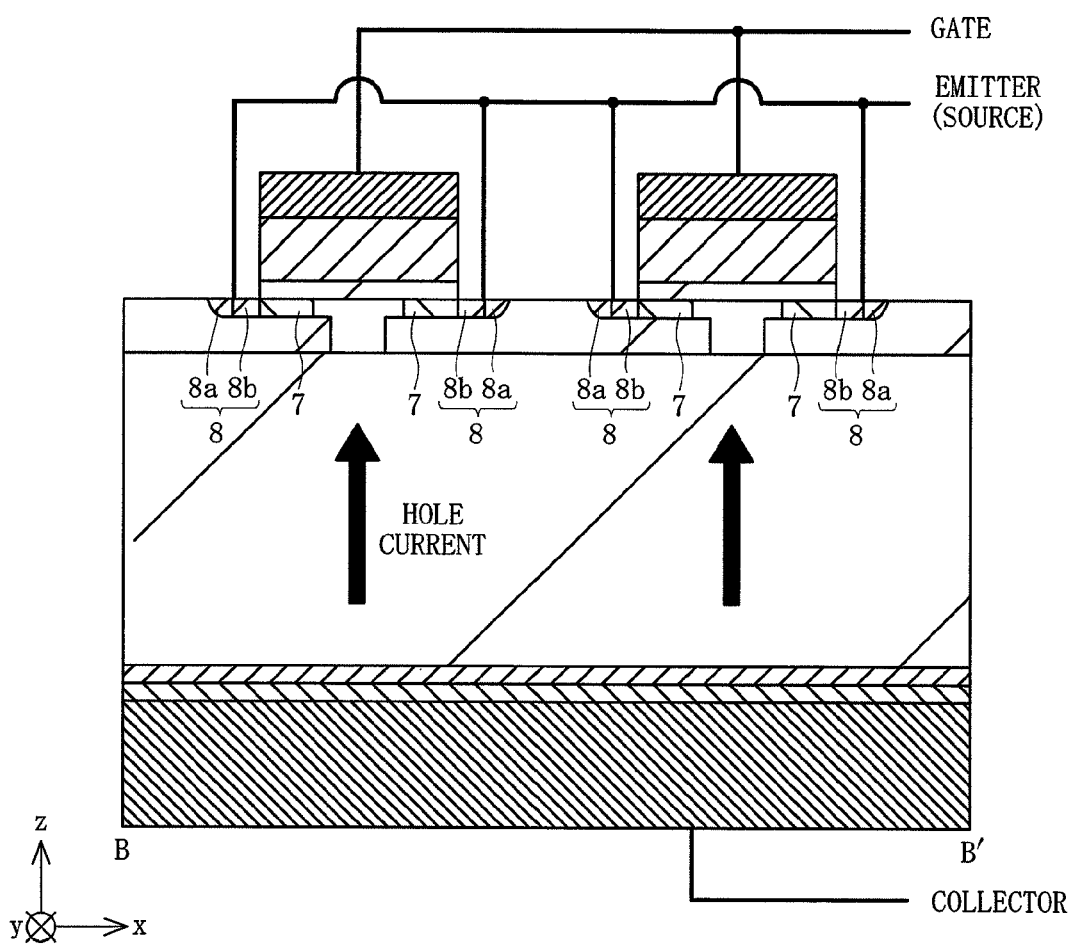
FIG. 57 is a cross-sectional view of main part corresponding to the cross section taken along the line B-B' shown in FIG. 56.
Figure 58:
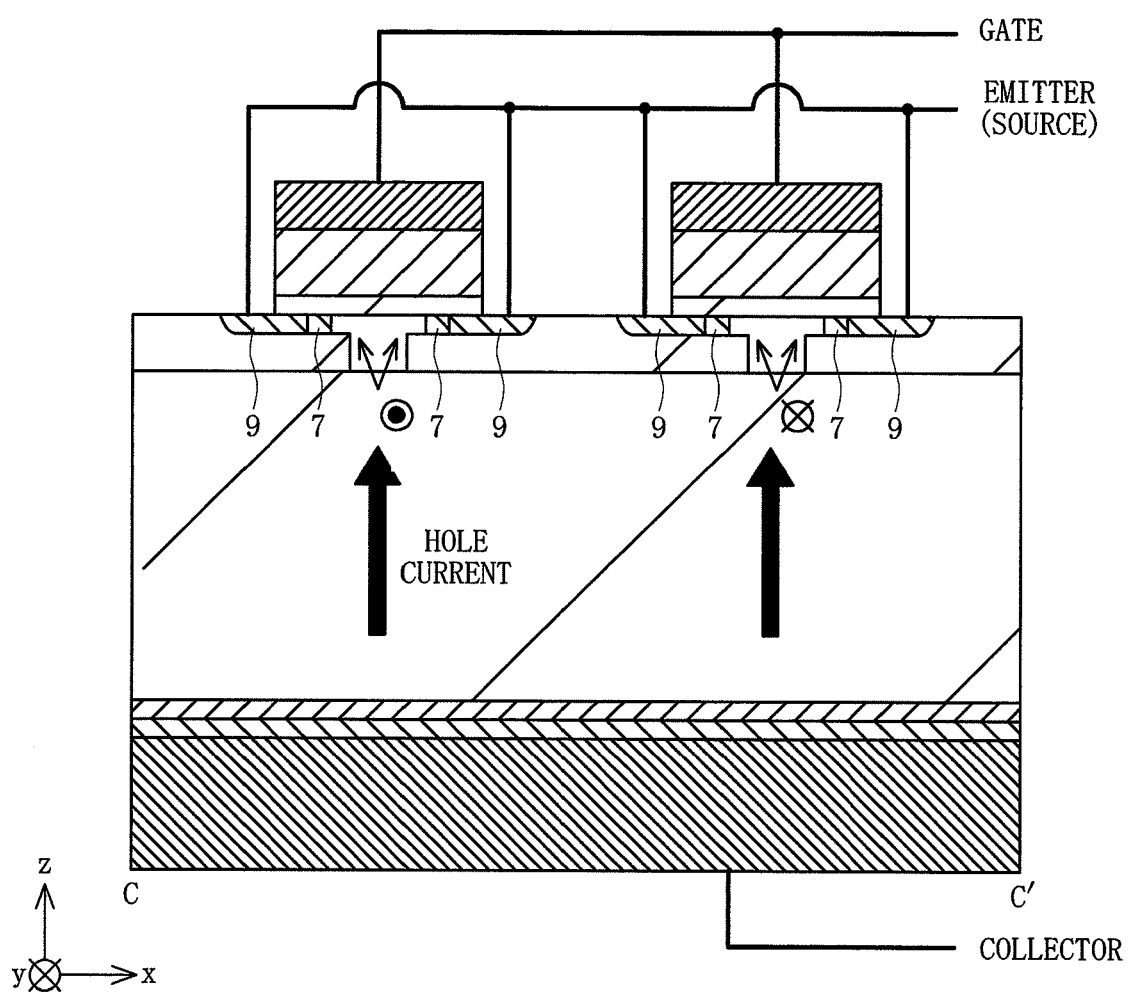
FIG. 58 is a cross-sectional view of main part corresponding to the cross section taken along the line C-C' shown in FIG. 56.
Figure 59:
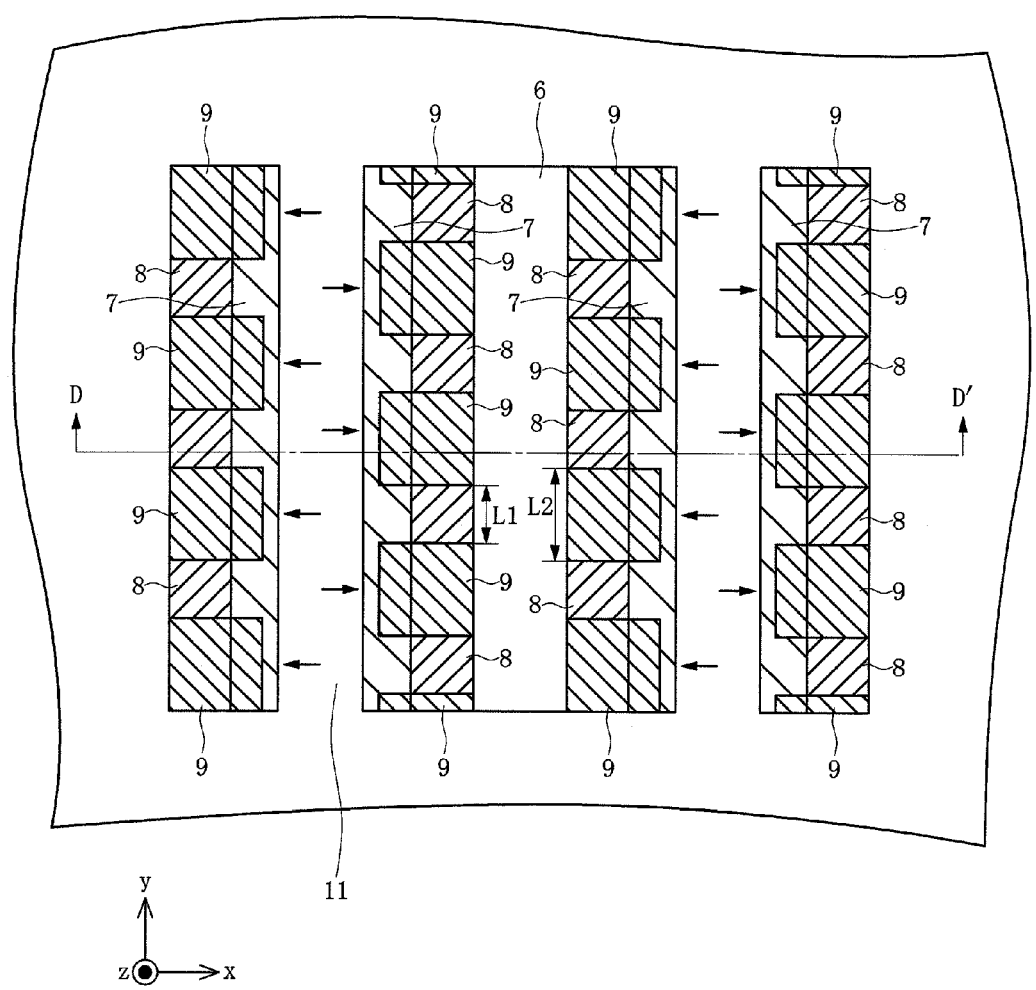
FIG. 59 is a plan view of main part showing, in an enlarged manner, part of the above-described IGBTs of FIG. 1.
Figure 60:
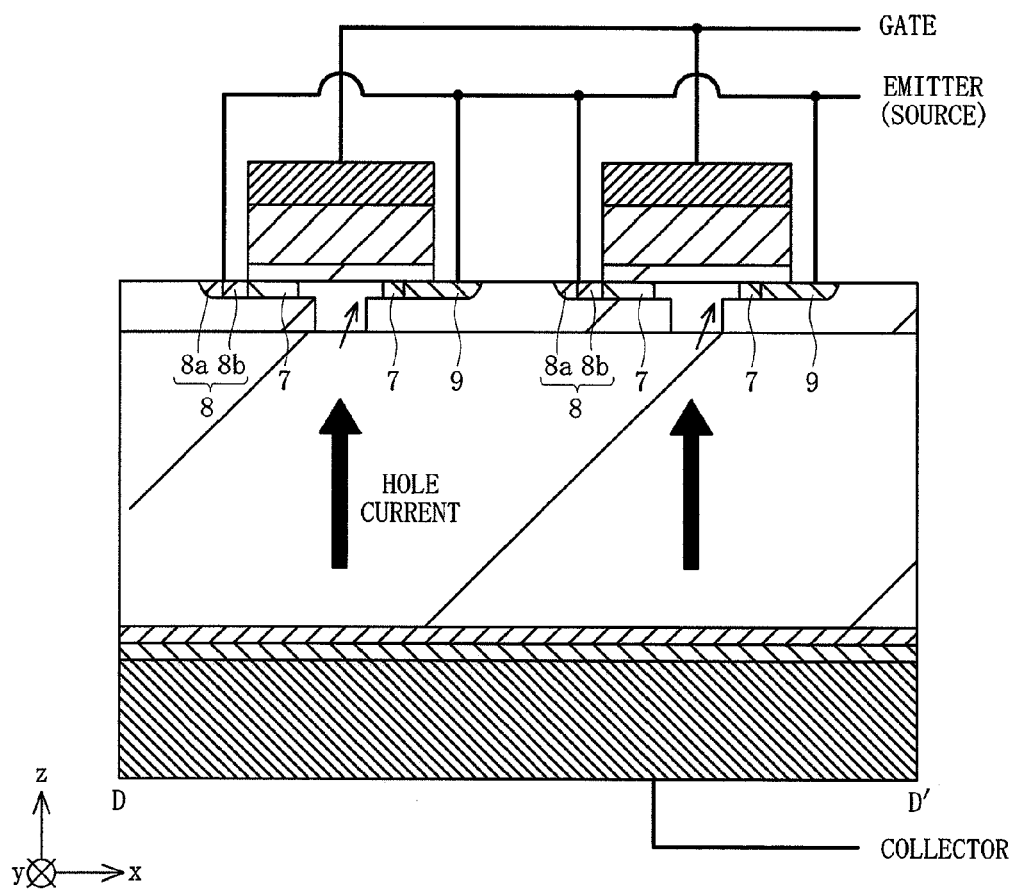
FIG. 60 is a cross-sectional view of main part corresponding to the cross section taken along the line D-D' shown in FIG. 59.

Hereinafter, the configuration of the above-described n-type source layers 8 and the above-described p$^+$-emitter layers 9 will be explained in detail by using FIGS. 56 to 60. FIG. 56 is a plan view of main part showing, in an enlarged manner, part of an active portion of an IGBT-forming semiconductor chip studied by the present inventors; FIG. 57 is a cross-sectional view of main part corresponding to the cross section taken along the line B-B' shown in FIG. 56; and FIG. 58 is a cross-sectional view of main part corresponding to the cross section taken along the line C-C' shown in FIG. 56. FIG. 59 is a plan view of main part showing, in an enlarged manner, part of the above-described IGBTs of FIG. 1, and FIG. 60 is a cross-sectional view of main part corresponding to the cross section taken along the line D-D' shown in FIG. 59.

First, the configuration of the n-type source layers 8 and the p$^+$-emitter layers 9 studied before the present invention will be explained below with reference to FIGS. 56 to 58 (see above-described Patent Document 11).

As shown in FIG. 56, regarding the n-type source layers 8 and the p$^+$-emitter layers 9 to which the present invention has not yet been applied, the n-type source layers 8 and the p$^+$-type emitter layers 9 are alternately disposed in a y-direction in a single belt-like region between a gate electrode 11 and an insulating film 6, which are extending in the y-direction (first direction), in a top view. However, in an x-direction (second direction) orthogonal to the y-direction, the n-type source layer 8 and the n-type source layer 8 or the p$^+$-type emitter layer 9 and the p$^+$-type emitter layer 9 are opposed to each other with the gate electrode 11 interposed therebetween, and only the plurality of n-type source layers 8 are disposed or only the plurality of p$^+$-type emitter layers 9 are disposed. Thus, the n-type source layers 8 and the p$^+$-type emitter layers 9 are not alternately disposed in the x-direction.

Incidentally, upon collection of hole currents, the holes which have been present at a high concentration in the collector side compared with those in the emitter side pass through a base layer 2 and flow into emitter electrodes 16 further via the p-type channel layers 7 and the p$^+$-type emitter layers 9.

However, as shown in FIG. 57, in the n-type source layers 8, the hole currents which have flowed along a z-direction (third direction: the direction from the collector side toward the emitter side) orthogonal to the x-direction and the y-direction cannot be collected in the x-direction. Therefore, the hole currents flow in the y-direction and find the part to which they are collected.

On the other hand, as shown in FIG. 58, in the p$^+$-type emitter layers 9, the hole currents which have flowed along the z-direction can be collected in the x-direction. Furthermore, the hole currents which have flowed along the y-direction can be collected at the same time.

Therefore, the hole currents which have flowed to the vicinity of the n-type source layers 8 along the z-direction are collected by the p$^+$-type emitter layers 9; however, in this process, as shown by arrows in above-described FIG. 56, the hole currents flow along the y-direction and are collected while they are concentrated at ends of the p$^+$-type emitter layers 9.

Therefore, problems of reduction in the breakdown tolerance occur, for example, (1) since the hole currents flow along the y-direction, voltage drop occurs to cause parasitic latch-up operation, and the elements of the IGBTs are disrupted by temperature increase caused by resistance components; and (2) the hole currents are concentrated at the ends of the p$^+$-type emitter layers 9, and junction breakdown occurs at the ends of the p$^+$-type emitter layers 9. Particularly, the problem of the junction breakdown caused by the hole currents concentrated at the ends of the p$^+$-type emitter layers 9 is serious in the IGBT in which a surface semiconductor layer 4 has a thickness of, for example, 20 to 100 nm since, if the thickness of the surface semiconductor layer 4 is reduced, the thickness of the p$^+$-type emitter layers 9 is also reduced, and the area of the ends of the p$^+$-type emitter layers 9 is also reduced.

However, the above-described problem of reduction in breakdown tolerance can be avoided by applying the configuration of the n-type source layers 8 and the p$^+$-emitter layers 9 according to the present invention. The configuration of the n-type source layers 8 and the p$^+$-emitter layers 9 according to the present first embodiment will be explained below with reference to FIGS. 59 and 60.

As shown in FIG. 59, in a top view, the n-type source layers 8 and the p$^+$-type emitter layers 9 are alternately disposed along the y-direction in a single belt-like region between the gate electrode 11 and the insulating film 6, which are extending in the y-direction (first direction). In the top view, along the x-direction (second direction) orthogonal to the y-direction, the n-type source layers 8 and the p$^+$-type emitter layers 9 are opposed to each other with the gate electrode 11 interposed therebetween; and, in the top view, the n-type source layers 8 and the p$^+$-type emitter layers 9 are alternately disposed along the x-direction (second direction).

Furthermore, the y-direction length (L2) of the p$^+$-type emitter layer 9 is made equal to the y-direction length (L1) of the n-type source layer 8 or larger than the y-direction length (L1) of the n-type source layer 8 so as to increase the width for collecting the hole currents. For example, an appropriate range of the y-direction length (L2) of the p$^+$-type emitter layer 9 is conceived to be about one to three times of the y-direction length (L1) of the n-type source layer 8, and about two to three times thereof is conceived to be the most suitable. In the case in which the y-direction length (L2) of the p$^+$-type emitter layer 9 and the y-direction length (L1) of the n-type source layer 8 are the same, the width for collecting the hole currents can be increased by increasing the x-direction length of the p$^+$-type emitter layer 9 than the x-direction length of the n-type source layer 8.

Furthermore, in the top view, the n-type source layers 8 and the p$^+$-type emitter layers 9 are alternately disposed in the y-direction in a single belt-like region between the gate electrode 11 and the insulating film 6, which are extending in the y-direction (first direction), and the p$^+$-type emitter layers 9 are formed at both ends of the above-described single belt-like region.

In this manner, when the configuration of the n-type source layers 8 and the p$^+$-emitter layers 9 according to the first embodiment is applied, the n-type source layers 8 and the p$^+$-type emitter layers 9 are alternately disposed along the y-direction in the single belt-like region between the gate electrode 11 and the insulating film 6, which are extending (in the y-direction (first direction) in the top view). Furthermore, in the top view, along the x-direction (second direction) orthogonal to the y-direction, the n-type source layer 8 and the p$^+$-type emitter layer 9 are opposed to each other with the gate electrode 11 interposed therebetween; and, in the top view, the n-type source layers 8 and the p$^+$-type emitter layers 9 are alternately disposed along the x-direction (second direction). As shown in FIG. 60, the hole currents which have flowed along the z-direction flow along the x-axis direction instead of flowing along the y-axis direction.

Therefore, when hole currents are to be collected by the p$^+$-type emitter layers 9, the hole currents do not concentrate at the ends of the p$^+$-type emitter layers 9, but are collected by the surfaces in contact with the p-type channel layers 7 as shown by arrows in above-described FIG. 59; therefore, even when the thickness of the surface semiconductor layers 4 is reduced to, for example, 20 to 100 nm, junction breakdown at the ends of the p$^+$-type emitter layers 9 can be avoided. Furthermore, since the hole currents do not flow along the y-direction, the parasitic latch-up operation caused by voltage drop and breakdown of IGBT elements caused by temperature increase due to resistance components can be also avoided. Thus, the above-described reduction in breakdown tolerance upon collection of the hole currents can be prevented.

<<Method of Manufacturing Semiconductor Device>>

A method of manufacturing the semiconductor device including the IGBTs according to the first embodiment of the present invention will be explained in the order of steps with reference to FIGS. 3 to 25. FIGS. 3 to 25 are cross-sectional views of main parts showing the active portion and the peripheral portion of the semiconductor chip.

Figure 3:
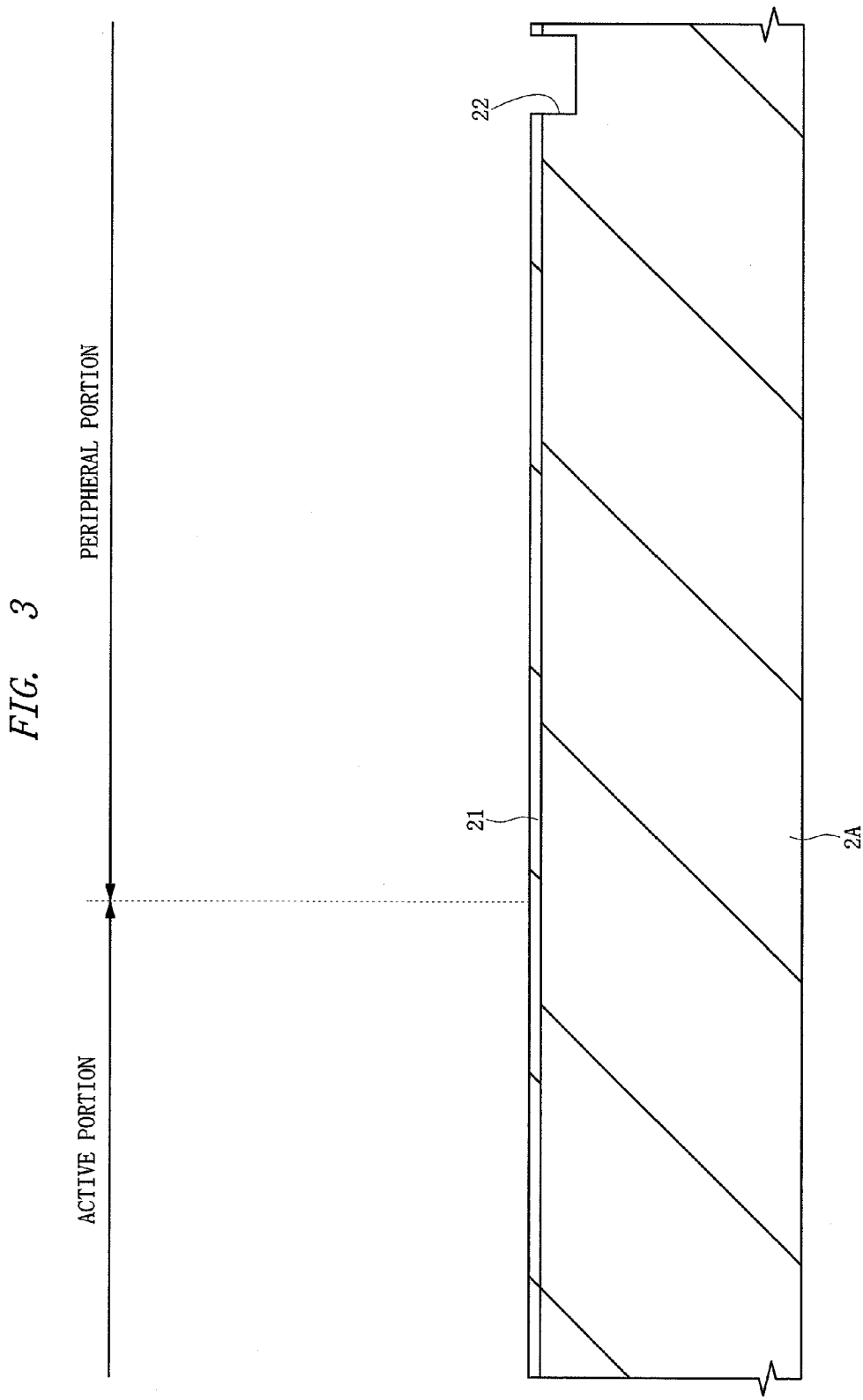
FIG. 3 is a cross-sectional view of main part showing a manufacturing step of the semiconductor device including the IGBTs according to the first embodiment of the present invention.

First, as shown in FIG. 3, a high-resistance semiconductor substrate (hereinafter, simply described as a substrate) 2A composed of n$^-$-type single-crystal silicon is prepared. As the type of the crystal that forms the substrate 2A, a FZ (Float Zoning) crystal manufactured by the floating zone method, a CZ (Czochralski) crystal manufactured by the Czochralski method (pulling method), or a MCZ (Magnetic Field Applied (Czochralski) crystal is desired.

Then, a surface oxide film 21 is formed on the main surface (surface) of the substrate 2A by subjecting the substrate 2A to thermal oxidation treatment. Subsequently, the surface oxide film 21 and the substrate 2A in a predetermined region of the peripheral portion are sequentially etched while using a photo resist film, which has been patterned by photolithography techniques, as a mask, to form a groove 22, which is to be used as an alignment mark for position adjustment, in the peripheral portion of the substrate 2A.

Figure 4:
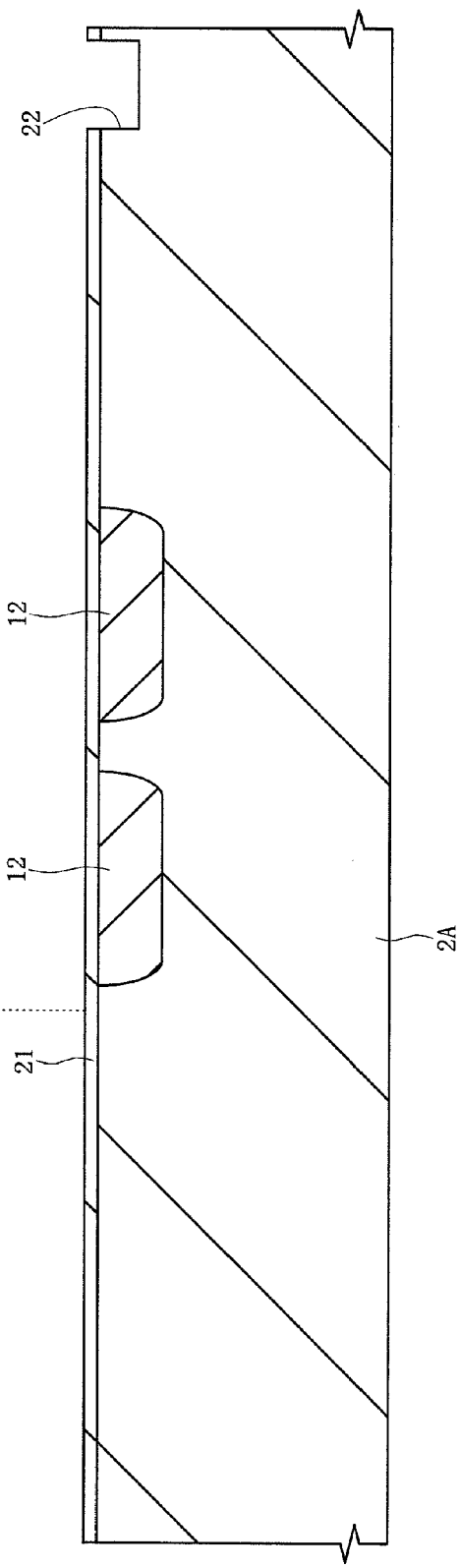
FIG. 4 is a cross-sectional view of main part during the manufacturing step of the semiconductor device continued from FIG. 3.

Then, as shown in FIG. 4, a plurality of p-type field limiting rings 12 (first wells) are formed by introducing a impurity exhibiting p-type conductivity type (for example, B (boron)) into the peripheral portion of the main surface of the substrate 2A by ion implantation while using a photo resist film, which has been patterned by photolithography techniques, as a mask.

Figure 5:
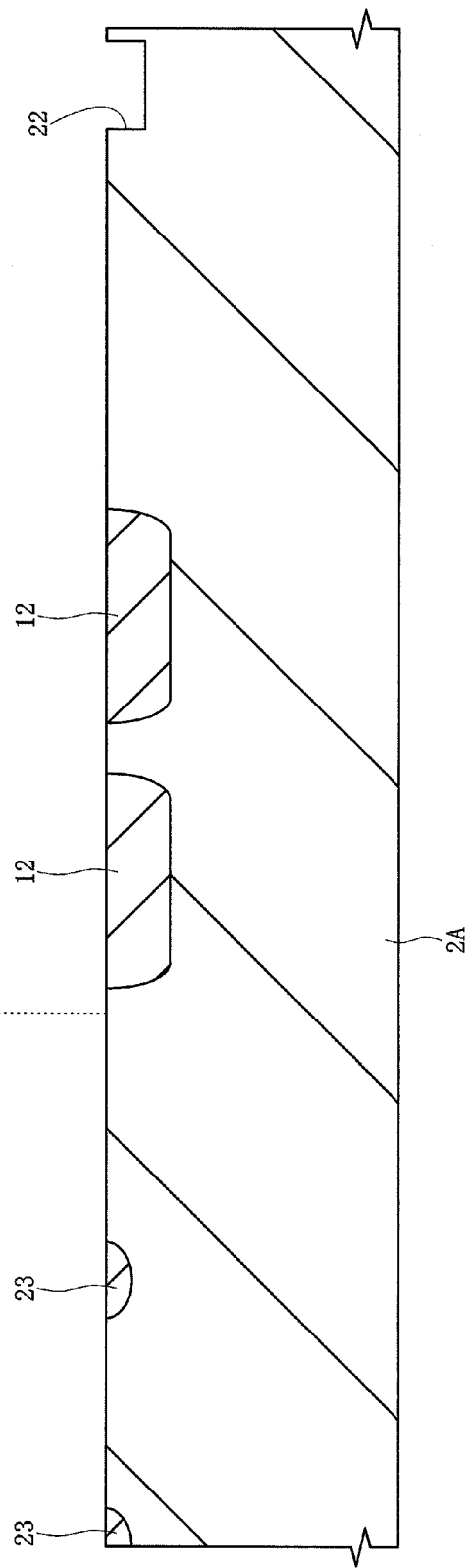
FIG. 5 is a cross-sectional view of main part during the manufacturing step of the semiconductor device continued from FIG. 4.

Then, as shown in FIG. 5, a plurality of p-type wells (second wells) 23 are formed by introducing a impurity exhibiting p-type conductivity type (for example, B (boron)) into the active portion of the main surface of the substrate 2A by ion implantation while using a photo resist film, which has been patterned by photolithography techniques, as a mask.

Figure 6:
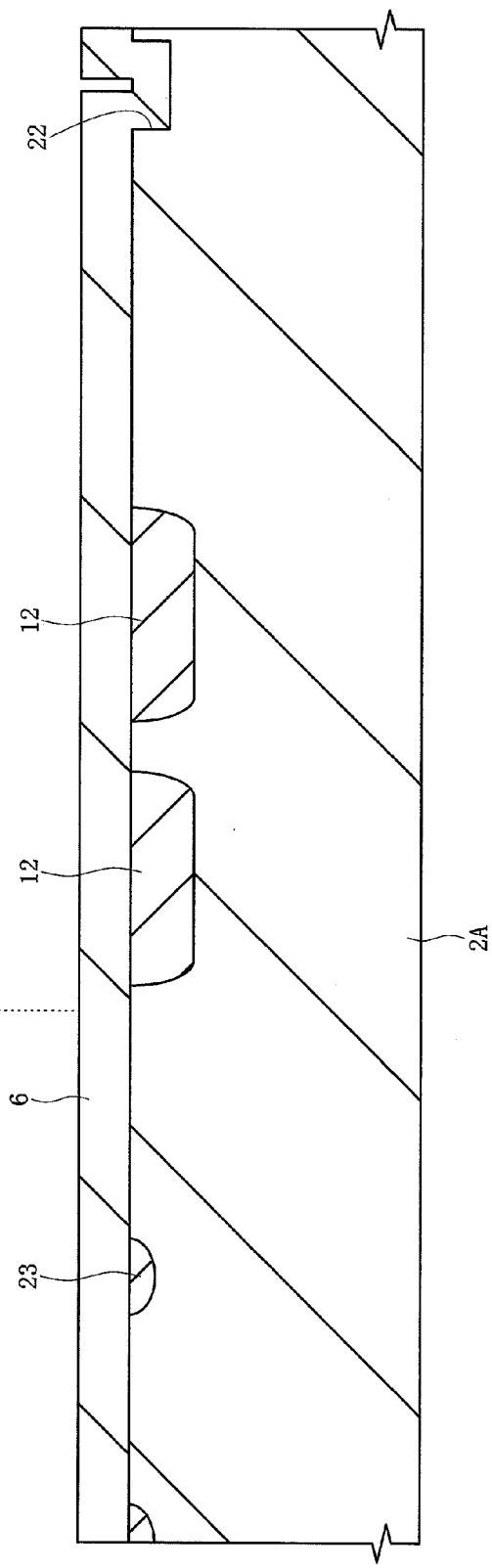
FIG. 6 is a cross-sectional view of main part during the manufacturing step of the semiconductor device continued from FIG. 5.

Then, as shown in FIG. 6, a surface oxide film (illustration omitted) is formed on the main surface of the substrate 2A by subjecting the substrate 2A to thermal oxidation treatment; and, subsequently, an oxide film (illustration omitted) is deposited on the surface oxide film by CVD (Chemical Vapor Deposition) to form the insulating film (first insulating film) 6 composed of the above-described surface oxide film and the above-described oxide film. The thickness of the insulating film 6 is, for example, 600 nm. In this process, not all of the interior of the groove 22 provided in the peripheral portion is buried by the insulating film 6.

Figure 7:
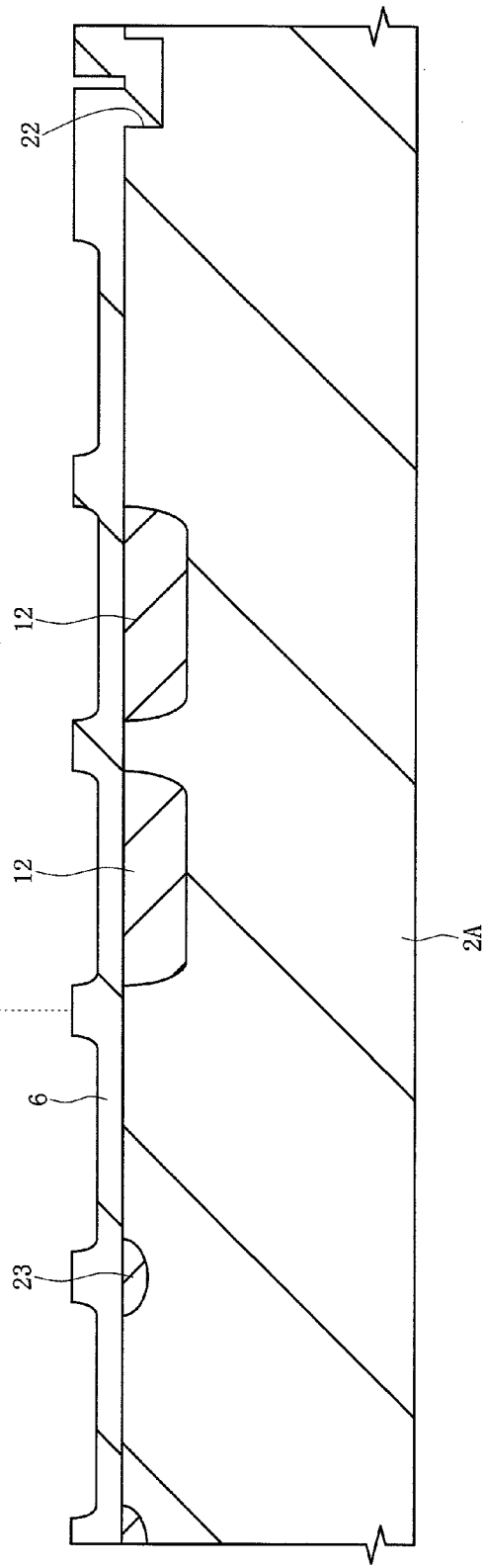
FIG. 7 is a cross-sectional view of main part during the manufacturing step of the semiconductor device continued from FIG. 6.

Then, as shown in FIG. 7, the insulating film 6 in the regions, which are to serve as active regions (for example, the regions in which source regions, channel regions, and emitter regions (back gate regions) are to be formed), are etched by, for example, 30 to 110 nm by isotropic wet etching using a photoresist film, which has been patterned by photolithography technique, as a mask. As a result, the active regions are defined on the main surface of the substrate 2A by the insulating film 6 which has not been etched. In the present first embodiment, the region in which a thick-film portion of the insulating film 6 is formed and the region in which a thin-film portion of the insulating film 6 is formed (in which the gate electrode 11 is disposed in FIG. 1) are alternately arranged like stripes. Furthermore, thin-film portions of the insulating film 6 are formed also above the p-type field limiting rings 12 of the peripheral portion and in the region in which the n-type guard ring 13 is to be formed.

In the present first embodiment, isotropic wet etching is used in the above-described etching of the insulating film 6. The reason therefor is that, since isotropic wet etching can etch the insulating film 6 with better controllability than dry etching, variations in the thickness of the thin-film portions of the insulating film 6 can be suppressed. As is described later, the thin-film portions of the insulating film 6 constitute the buried insulating films 3, and variations in the characteristics of the IGBTs caused by variations in hole-current element performance can be suppressed when the buried insulating films 3 having a uniform thickness are formed (see above-described Patent Document 11).

Figure 8:
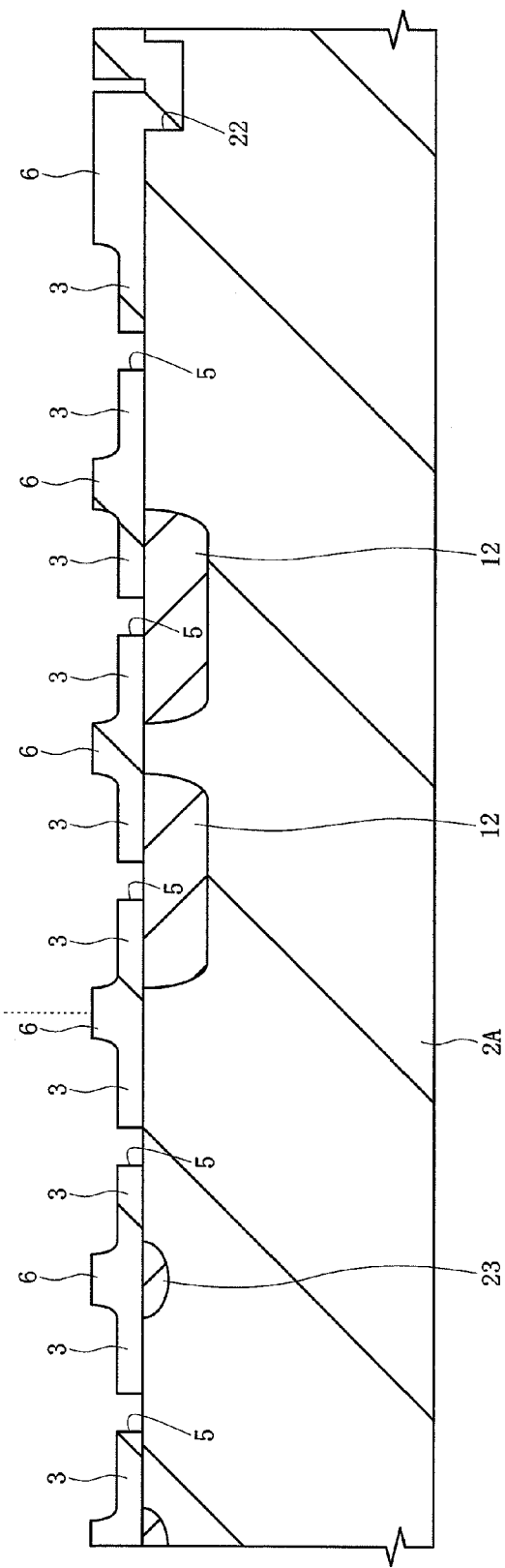
FIG. 8 is a cross-sectional view of main part during the manufacturing step of the semiconductor device continued from FIG. 7.

Then, as shown in FIG. 8, openings (spacing portions) 5 are formed by etching part of the thin-film portions of the insulating film 6 while using a photo resist film, which has been patterned by photolithography techniques, as a mask. As a result, buried insulating films 3 composed of the thin-film portions of the insulating film 6 having the openings 5 can be formed. At this point, the surface of the substrate 2A is exposed from the bottom surfaces of the openings 5.

Figure 9:
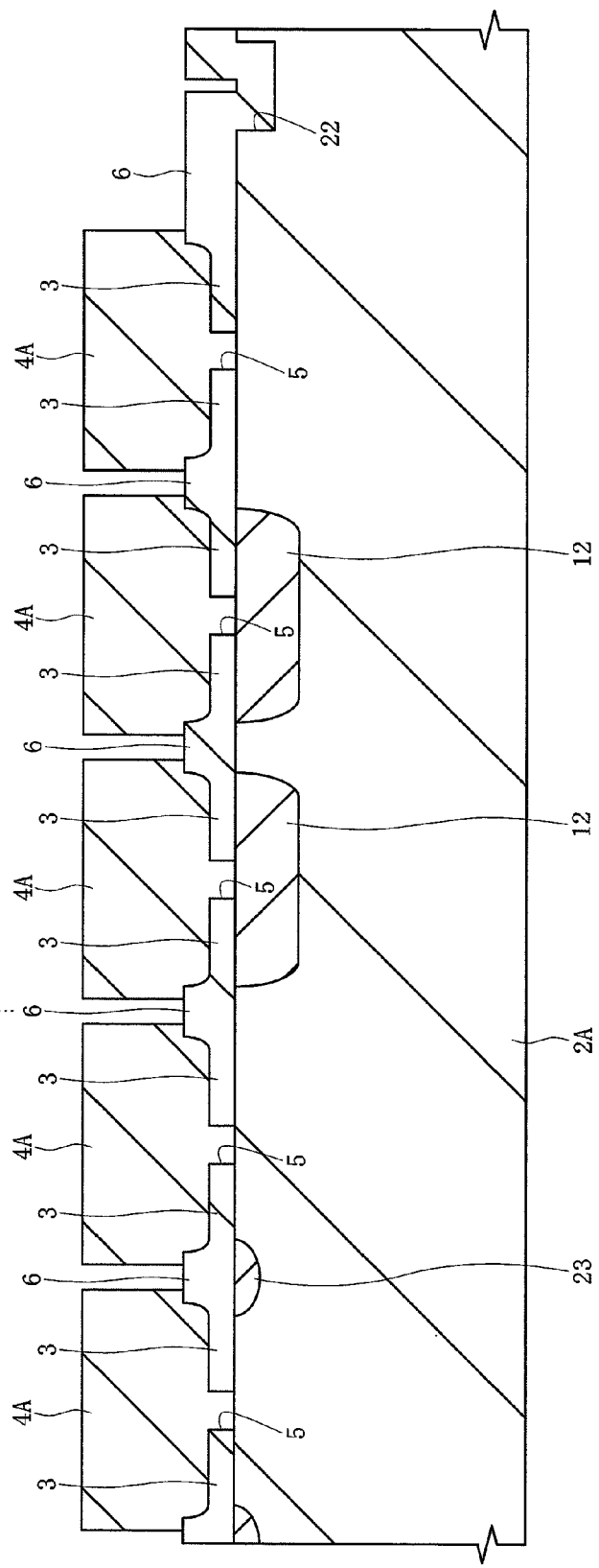
FIG. 9 is a cross-sectional view of main part during the manufacturing step of the semiconductor device continued from FIG. 8.

Then, as shown in FIG. 9, an n$^-$-type single-crystal silicon film 4A having a specific resistance approximately the same as that of the substrate 2A is epitaxially formed so that silicon crystals are continued in a lattice level from the openings 5 of the buried insulating films 3. In this process, epitaxial film-formation conditions that have selectivity are employed in order to prevent polycrystalline silicon from being deposited on the surfaces of the buried insulating films 3. More specifically, examples thereof include means that supplies a mixed gas of $SiHCl_3$ (trichlorosilane) and $HCl$ (hydrochloric acid) into a furnace by using a carrier gas containing $H_2$ (hydrogen) as a main component after the substrate 2A is introduced into the epitaxial furnace and means that supplies a mixed gas of $SiH_2Cl_2$ (dichlorosilane) and $HCl$ (hydrochloric acid) into the furnace by using a carrier gas containing $H_2$ (hydrogen) as a main component. Among the gases introduced into the epitaxial furnace, the HCl gas has light etchability with respect to silicon crystals and is capable of preventing polycrystalline silicon from being deposited on the buried insulating films 3. However, the etching power of the HCl gas is not as strong as the etching power that prevents the epitaxial film formation of crystalline silicon continuously formed from the crystal (substrate 2A) below the openings 5; therefore, selective epitaxial film formation from the openings 5 can be carried out.

Figure 10:
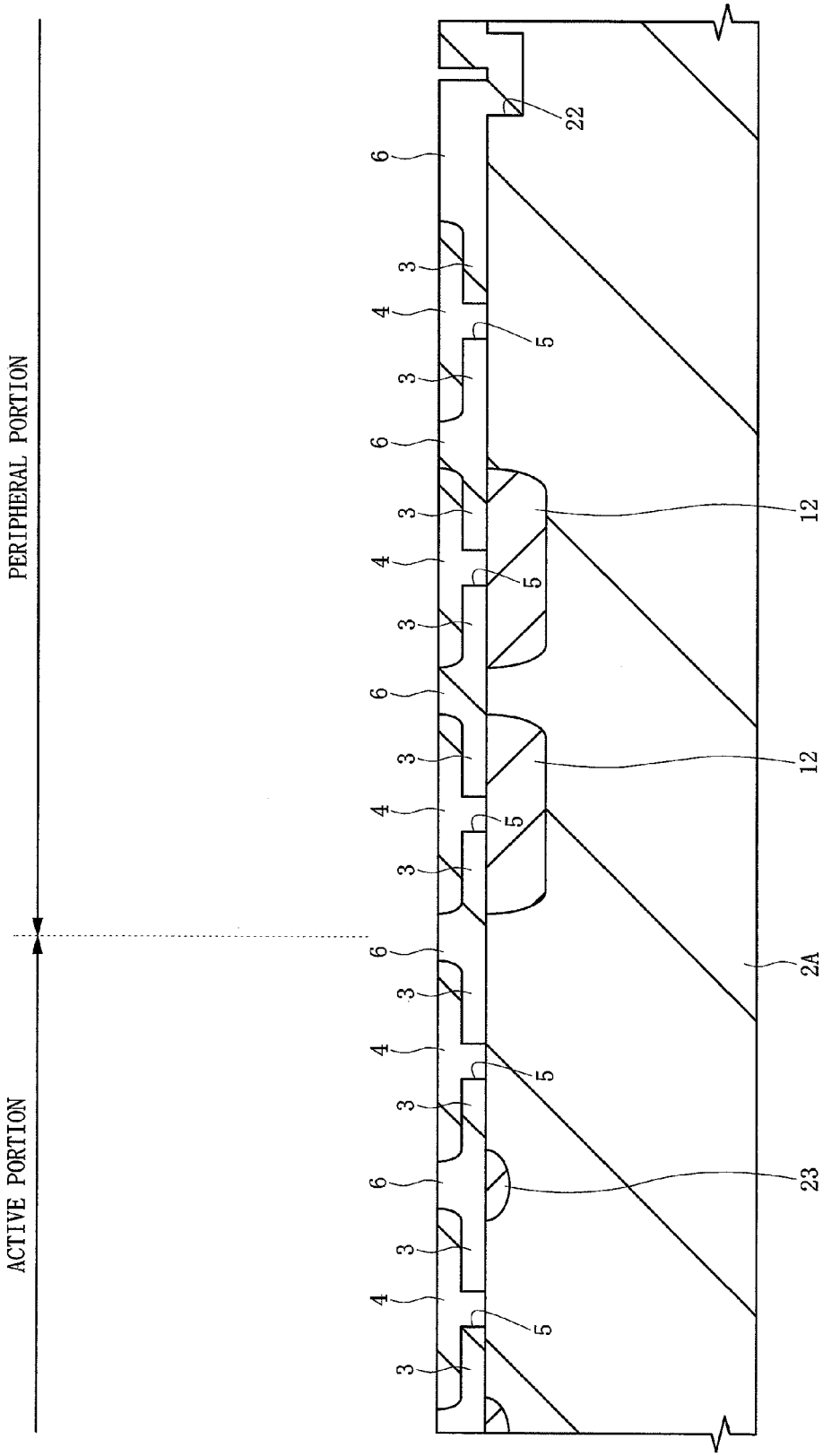
FIG. 10 is a cross-sectional view of main part during the manufacturing step of the semiconductor device continued from FIG. 9.

Then, as shown in FIG. 10, surface semiconductor layers 4 of which thicknesses are defined by the level difference between the thick-film portions and the thin-film portions (buried insulating films 3) of the insulating film 6 are formed by polishing the n$^-$-type single-crystal silicon film 4A by CMP (Chemical Mechanical Polishing) using the thick-film portions of the insulating film 6 as stoppers (polishing end point).

In the present first embodiment, it has been described above that the thickness of the surface semiconductor, layers 4 is, for example, 20 to 100 nm. However, the surfaces of the surface semiconductor layers 4 will be sacrificed in a step of forming the gate insulating films 10 by a predetermined thickness in a later step. Therefore, in the present step, the thickness of the surface semiconductor layers 4 has to be defined in consideration of the thickness to be sacrificed in the step of forming the gate insulating films 10 (including the thickness per se of the gate insulating films 10). More specifically, in the step of forming the gate insulating films 10, since an impurity is ion-implanted into the surface semiconductor layers 4 before forming the gate insulating films 10 per se, a sacrifice oxide film is formed on the surfaces of the surface semiconductor layers 4 by thermal oxidation of the substrate 2A, and the gate insulating films 10 are formed on the surfaces of the surface semiconductor layers 4 by thermal oxidation treatment of the substrate 2A again after the sacrifice oxide film is removed. In other words, the thickness of the surface semiconductor layers 4 which are to remain after the above-described CMP step has to be defined in consideration of the fact that the thickness of the surface semiconductor layers 4 is to be lost by the thickness of the sacrifice oxide film and the gate insulating films 10. For example, in the case in which the gate insulating film of the IGBT is composed of a laminated film of an oxide film formed by thermal oxidation and having a thickness of 10 nm and an oxide film formed by CVD and having a thickness of 90 nm, if the thickness of each of the sacrifice oxide film and the gate insulating film 10 is 5 nm, the thickness of the surface semiconductor layer 4 which is to remain after the CMP step is 30 to 110 nm in an example. The thickness of the surface semiconductor layers 4 which are to remain after the CMP step is determined by the level difference of the insulating films 6; therefore, it goes without saying that the thin film parts of the insulating films 6 have to be formed so that the thickness of the surface semiconductor layers 4 which are to remain after the CMP step has such a value.

Figure 11:
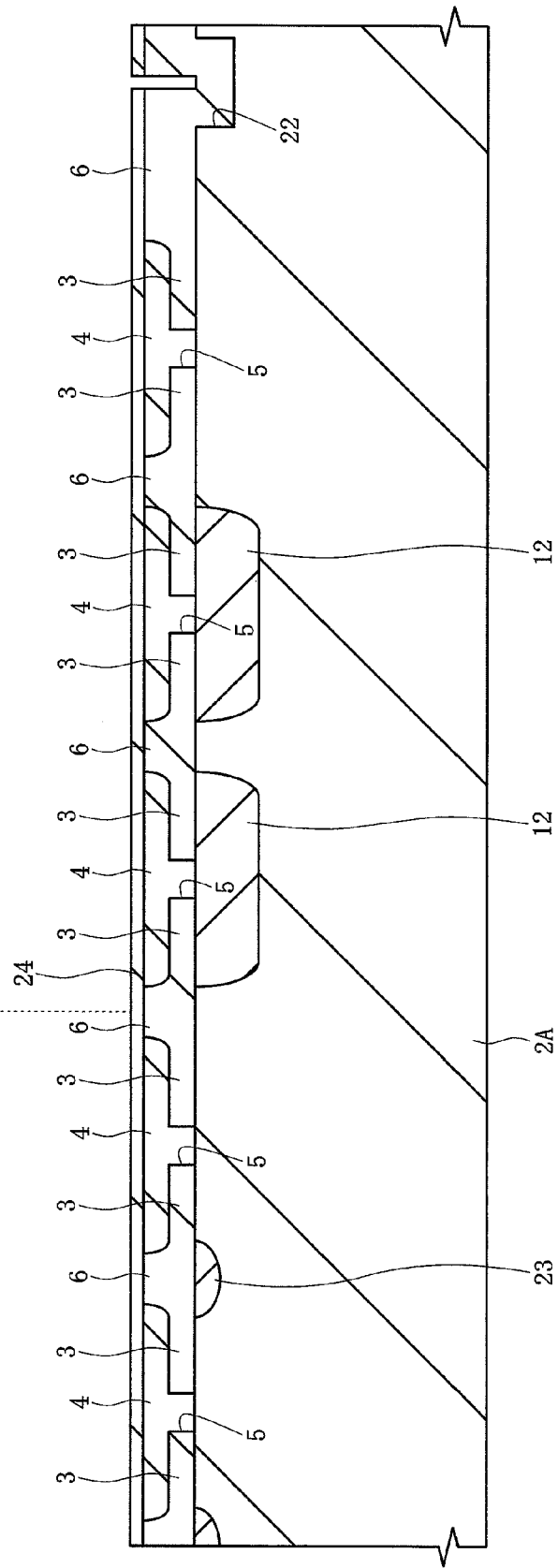
FIG. 11 is a cross-sectional view of main part during the manufacturing step of the semiconductor device continued from FIG. 10.

Then, as shown in FIG. 11, the sacrifice oxide film 24 is formed on the surfaces of the surface semiconductor layers 4 by subjecting the substrate 2A to thermal oxidation.

Figure 12:
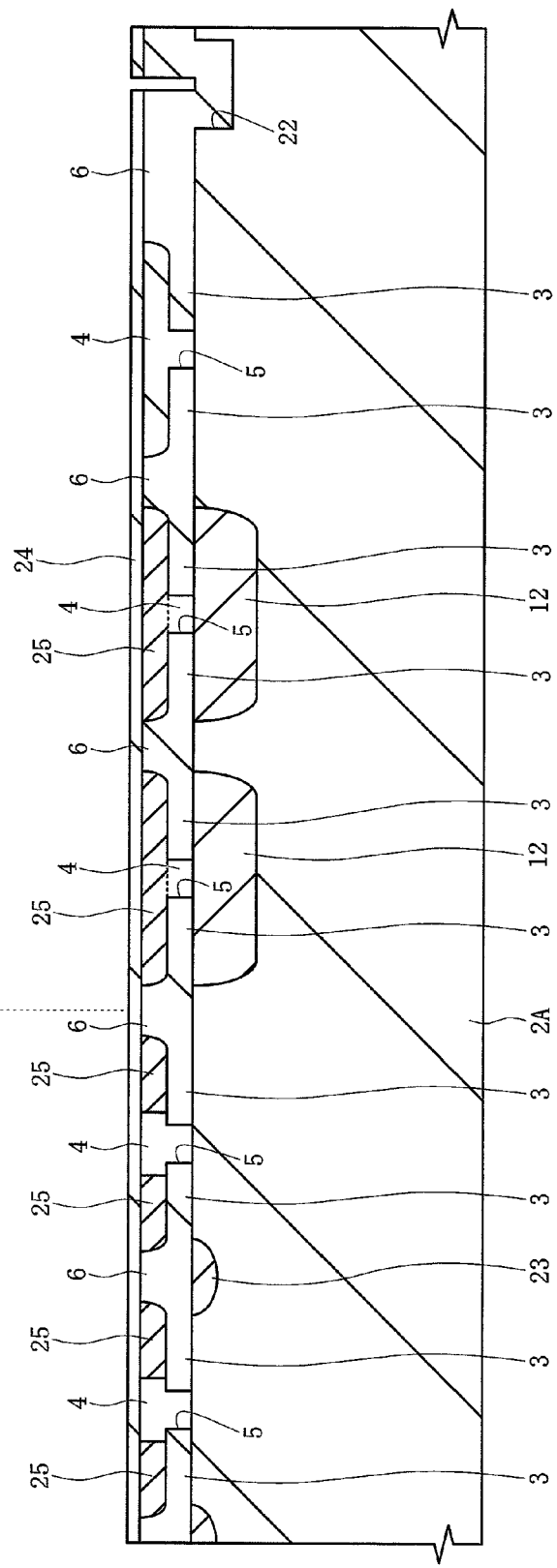
FIG. 12 is a cross-sectional view of main part during the manufacturing step of the semiconductor device continued from FIG. 11.

Then, as shown in FIG. 12, p-type semiconductor layers 25 are formed by introducing a impurity exhibiting p-type conductivity type (for example, B (boron)) into part of the regions of the surface semiconductor layers 4 of the active portion (the regions which are to serve as channels below the gate electrodes 11 formed in a later step and both sides thereof) by ion implantation while using a photo resist film, which has been patterned by photolithography techniques, as a mask. At the same time, p-type semiconductor layers 25 are formed by introducing a impurity exhibiting p-type conductivity type (for example, B (boron)) also into the surface semiconductor layers 4 above the p-type field limiting rings 12 of the peripheral portion by ion implantation.

The reason for forming the p-type semiconductor layers 25 in the surface semiconductor layers 4 of the active portion before forming the gate electrodes 11 will be described below. If an impurity exhibiting the p-type is introduced into the surface semiconductor layers 4 while using the gate electrodes 11 as masks after the gate electrodes 11 are formed, high-temperature long-time thermal treatment is required in order to diffuse the impurity to the regions which are to serve as the channels below the gate electrodes 11. However, the thermal treatment applies stress to the thin-film portions of the insulating films 6, and distortion is generated therein; therefore, focus misalignment in the photolithography techniques or crystal defects are generated. In order to avoid such problems, the p-type semiconductor layers 25 are formed in the surface semiconductor layers 4 before forming the gate electrodes 11 in the active portion.

Figure 13:
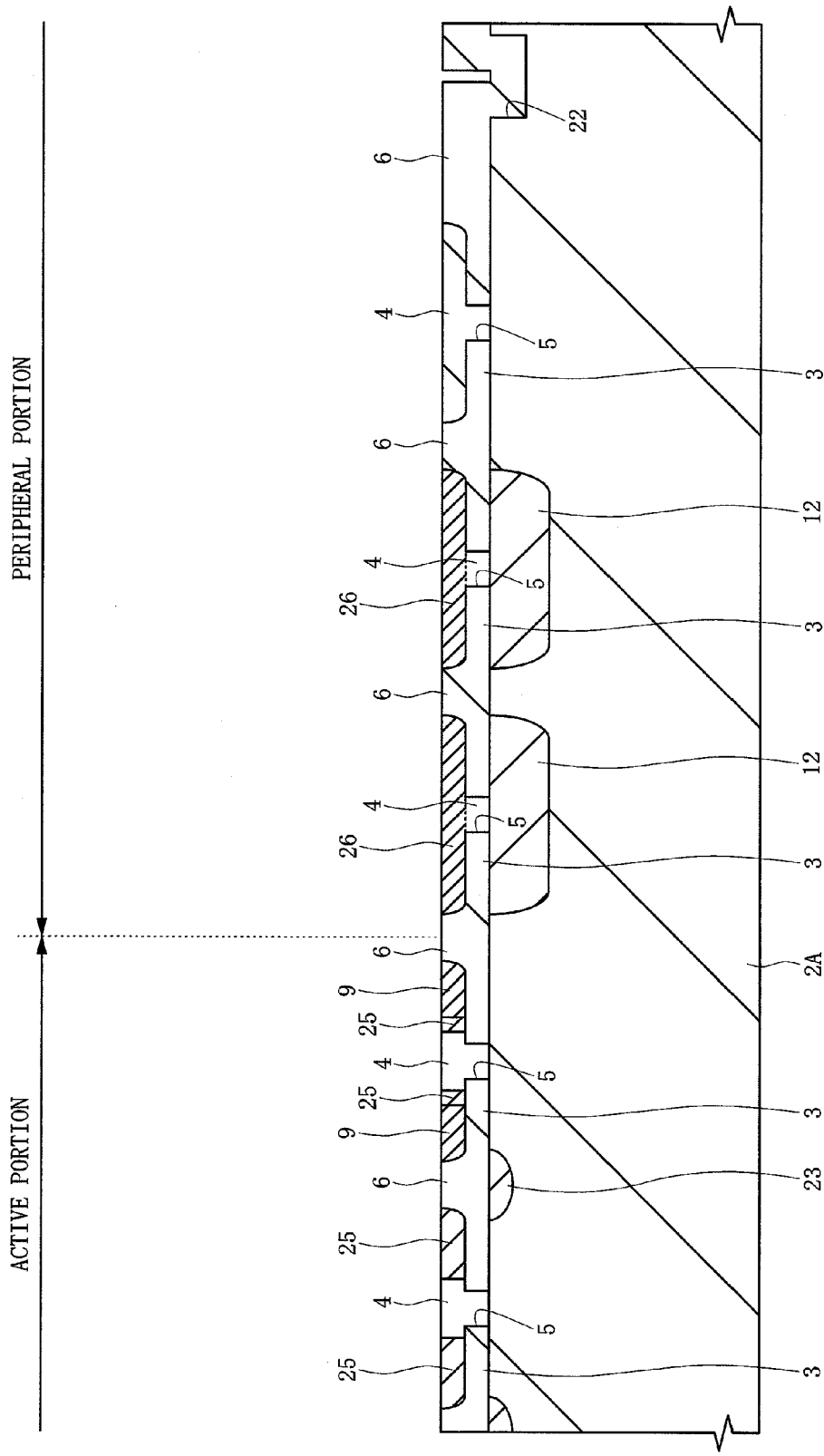
FIG. 13 is a cross-sectional view of main part during the manufacturing step of the semiconductor device continued from FIG. 12.

Then, as shown in FIG. 13, p$^+$-type emitter layers (p-type back gate layers) 9 are formed by introducing a impurity exhibiting p-type conductivity type (for example, B (boron)) into part of the regions of the p-type semiconductor layers 25 of the active portion (the regions which are to serve as emitters (back gates)) by ion implantation while using a photo resist film, which has been patterned by photolithography techniques, as a mask. At the same time, p$^+$-type semiconductor layers 26 are formed by introducing a impurity exhibiting p-type conductivity type (for example, B (boron)) into the p-type semiconductor layers 25 which are above the p-type field limiting rings 12 of the peripheral portion by ion implantation.

In this case, the p-type semiconductor layers 25 remain in the inside of the p$^+$-type emitter layers 9. However, the p$^+$-type emitter layers 9 may be formed in all of the p-type semiconductor layers 25.

Figure 14:
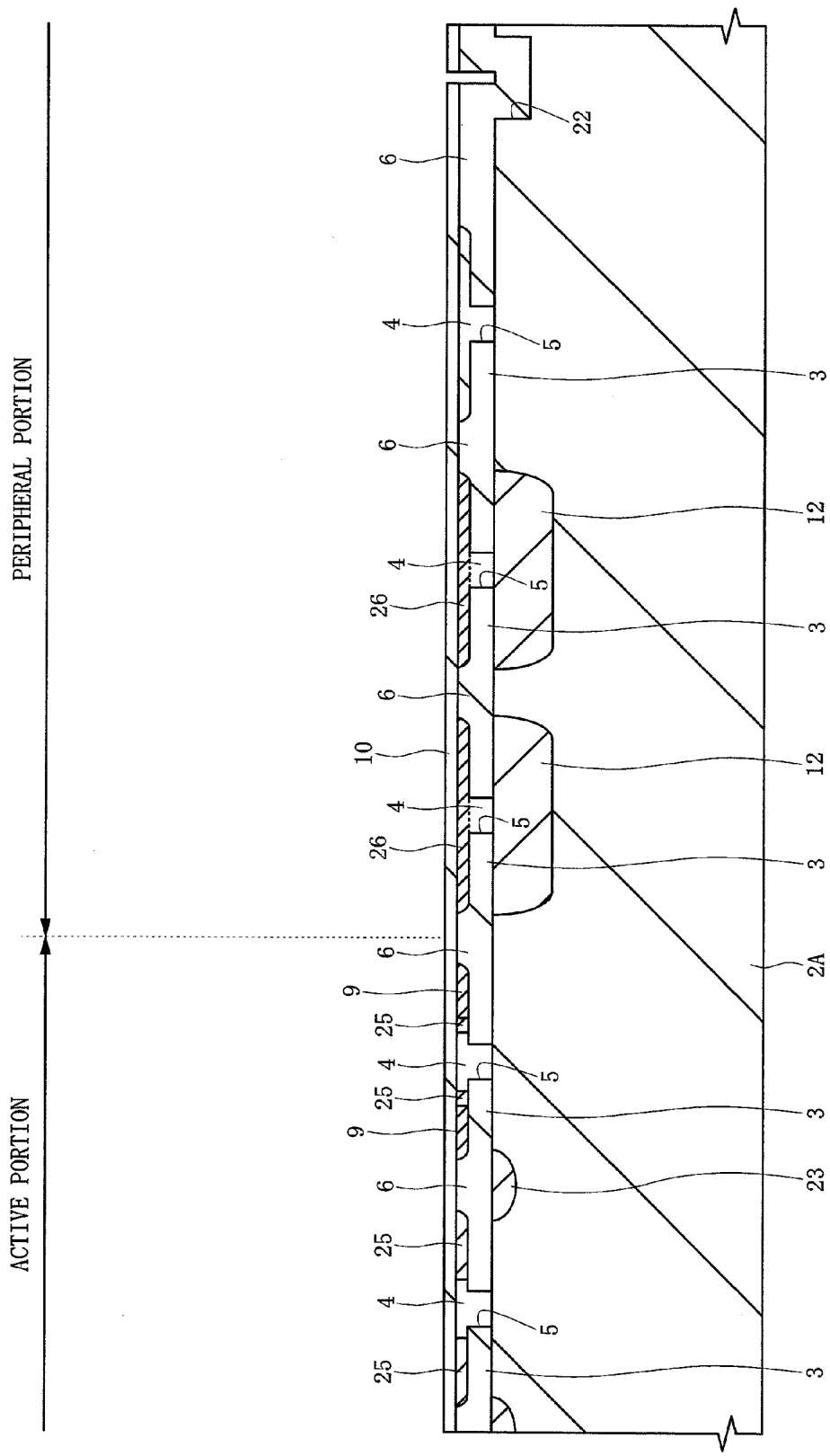
FIG. 14 is a cross-sectional view of main part during the manufacturing step of the semiconductor device continued from FIG. 13.

Then, as shown in FIG. 14, a gate insulating film 10 composed of a lower-layer oxide film and an upper-layer oxide film is formed by forming the lower-layer oxide film (illustration omitted) on the surfaces of the surface semiconductor layers 4 (including the p-type semiconductor layers 25 and the p$^+$-type emitter layers 9 of the active portion and the p$^+$-type semiconductor layers 26 of the peripheral portion) by subjecting the substrate 2A to thermal oxidation and subsequently depositing the upper-layer oxide film (illustration omitted) on the lower-layer oxide film by CVD. The thickness of the lower-layer oxide film is, for example, 10 nm, and the thickness of the upper-layer oxide film is, for example, 90 nm.

Figure 15:
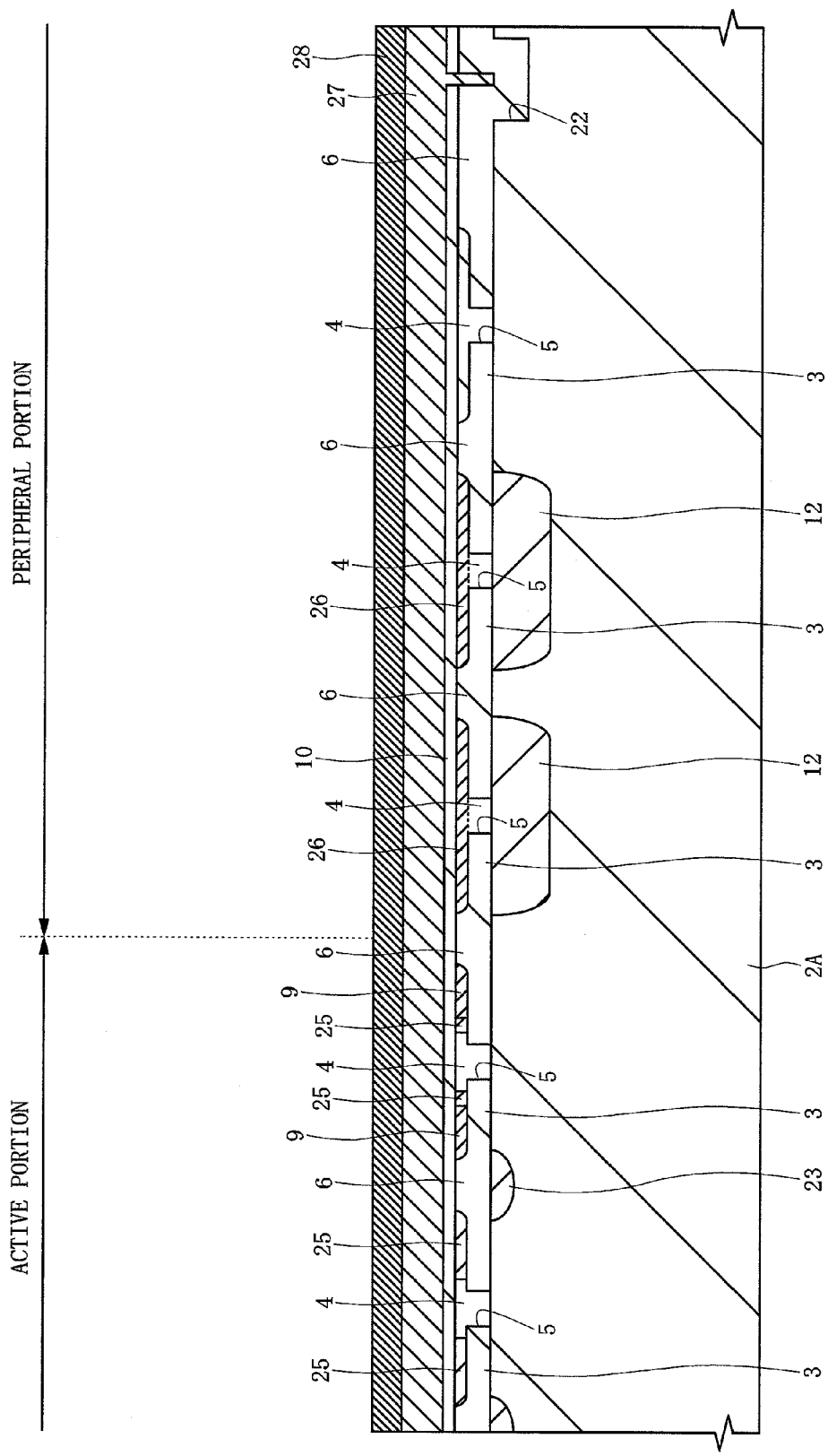
FIG. 15 is a cross-sectional view of main part during the manufacturing step of the semiconductor device continued from FIG. 14.

Then, as shown in FIG. 15, a polycrystalline silicon film 27 is deposited on the main surface of the substrate 2A, and a tungsten silicide layer 28 is subsequently formed on the polycrystalline silicon film 27. The reason for forming the tungsten silicide layer 28 is for reducing the height of the gate electrodes 11 and preventing the resistance of the gate electrodes 11 from increasing.

Figure 16:
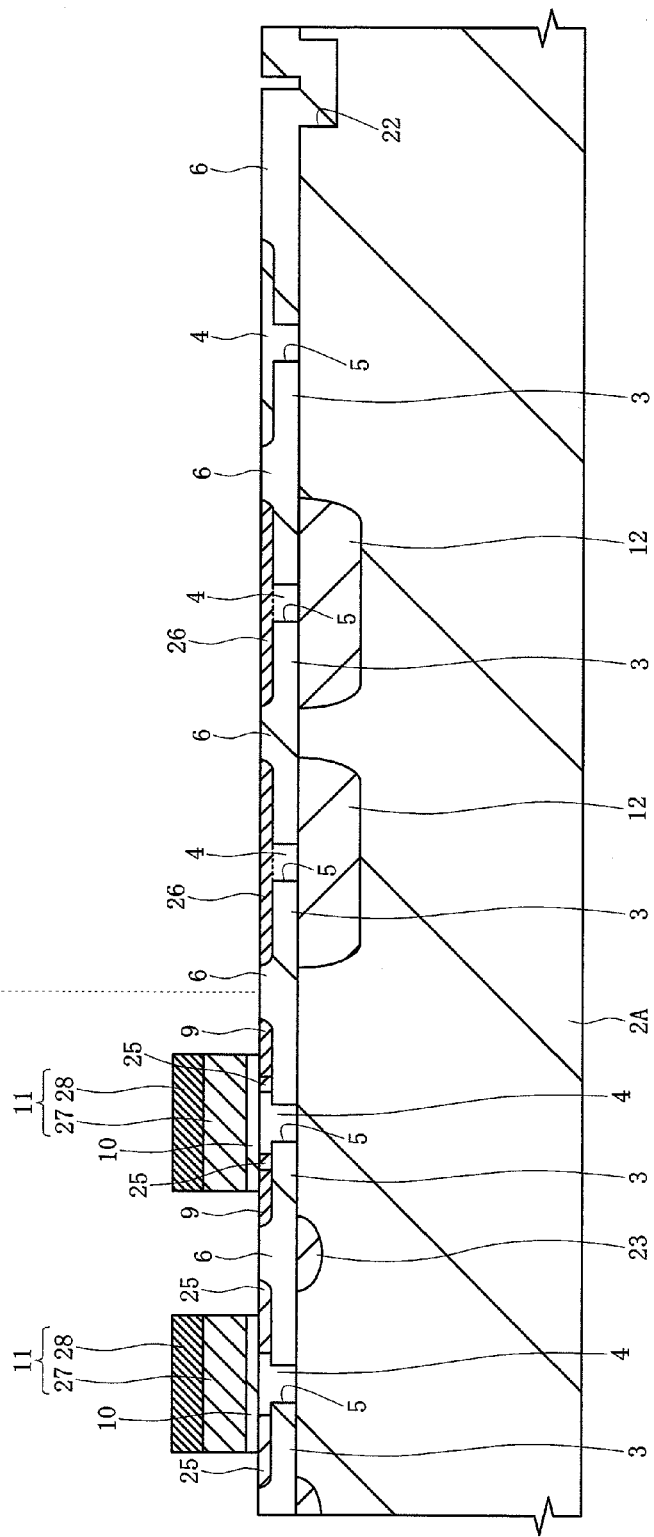
FIG. 16 is a cross-sectional view of main part during the manufacturing step of the semiconductor device continued from FIG. 15.

Then, as shown in FIG. 16, the tungsten silicide layer 28 and the polycrystalline silicon film 27 are sequentially patterned by etching using a photo resist film, which has been patterned by photolithography techniques, as a mask. As a result, gate electrodes 11 composed of a laminated film of the polycrystalline silicon film 27 and the tungsten silicide layer 28 can be formed.

Figure 17:
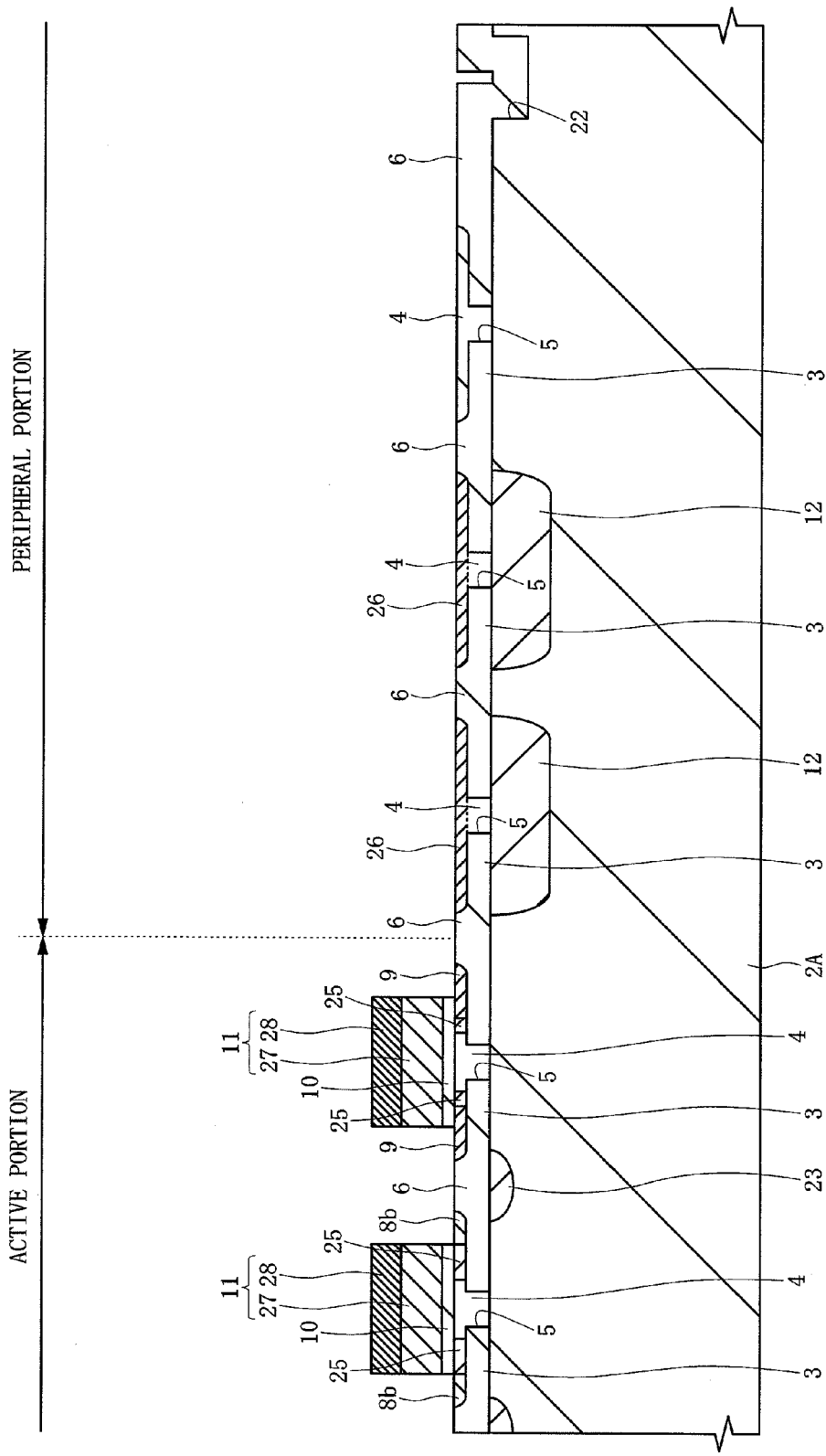
FIG. 17 is a cross-sectional view of main part during the manufacturing step of the semiconductor device continued from FIG. 16.

Then, as shown in FIG. 17, n$^-$-type source layers 8b are formed by introducing an impurity exhibiting n-type conductivity type (for example, As (arsenic)) into the p-type semiconductor layers 25 in both sides of the gate electrode 11 of the active portion by ion implantation while using a photo resist film, which has been patterned by photolithography techniques, as a mask. In order to prevent the introduction of the impurity exhibiting n-type conductivity type from generating crystal defects in the surface semiconductor layers 4, which are below the side surfaces of the gate electrode 11, and the gate insulating film 10, the implantation energy and implantation amount of the ion implantation are set to be relatively low.

Figure 18:
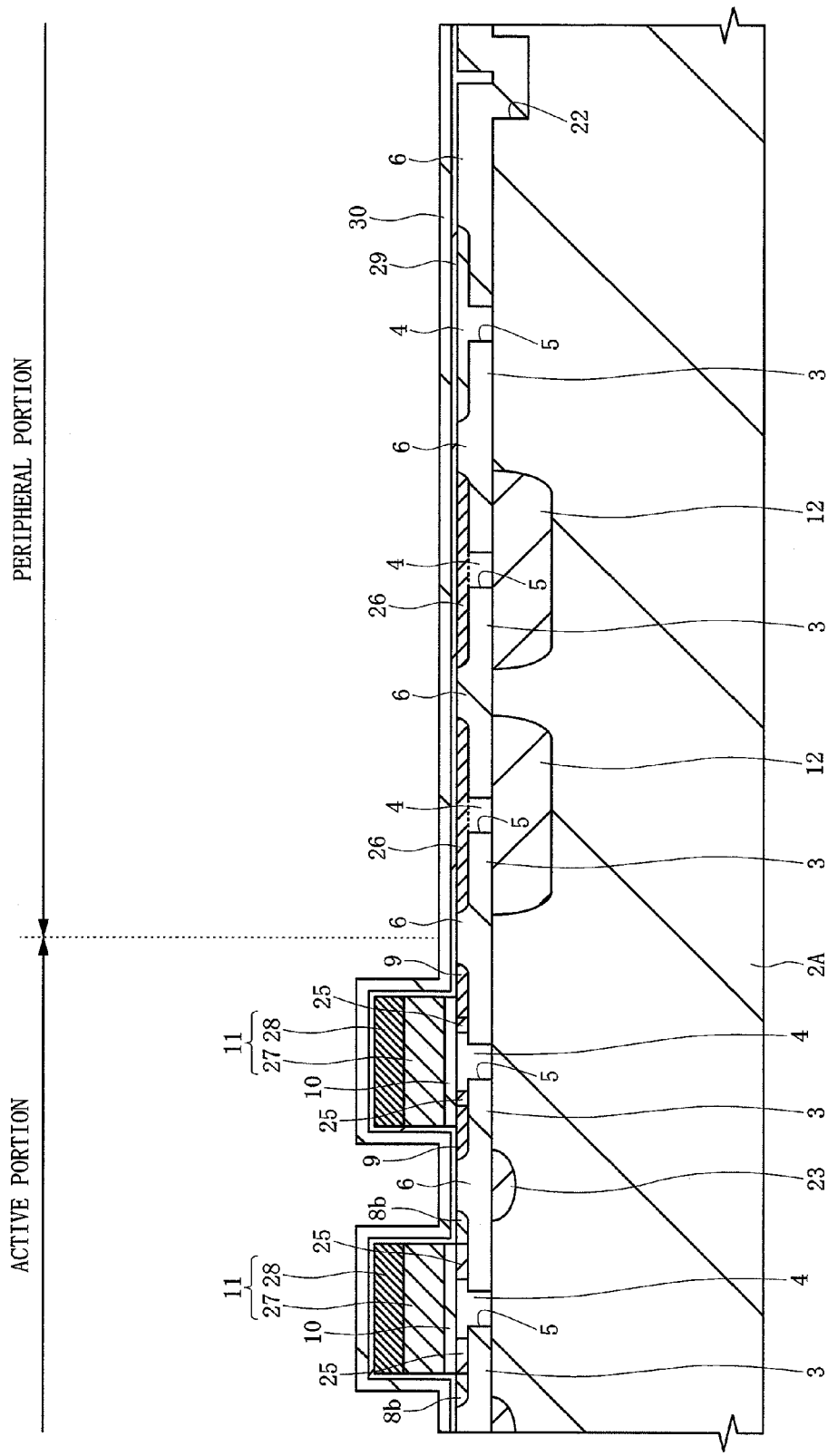
FIG. 18 is a cross-sectional view of main part during the manufacturing step of the semiconductor device continued from FIG. 17.

Then, as shown in FIG. 18, a silicon nitride film 29 is deposited on the main surface of the substrate 2A, and an insulating film 30 composed of a silicon oxide is subsequently deposited on the silicon nitride film 29.

Figure 19:
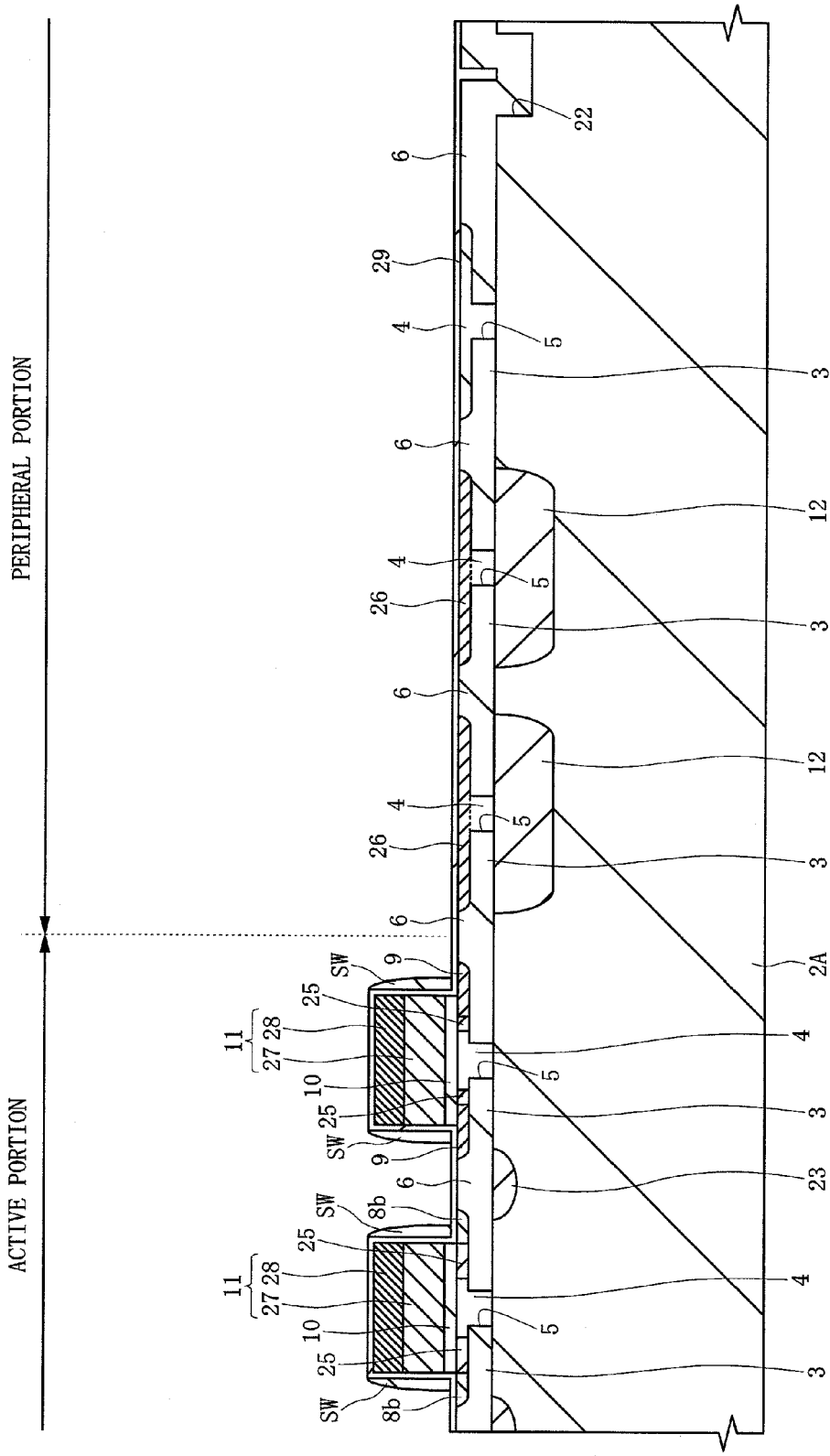
FIG. 19 is a cross-sectional view of main part during the manufacturing step of the semiconductor device continued from FIG. 18.

Then, as shown in FIG. 19, sidewalls SW composed of the insulating film 30 are formed on the side surfaces of the gate electrodes 11 by subjecting the insulating film 30 to anisotropic dry etching while using the silicon nitride film 29 as an etching stopper film.

Figure 20:
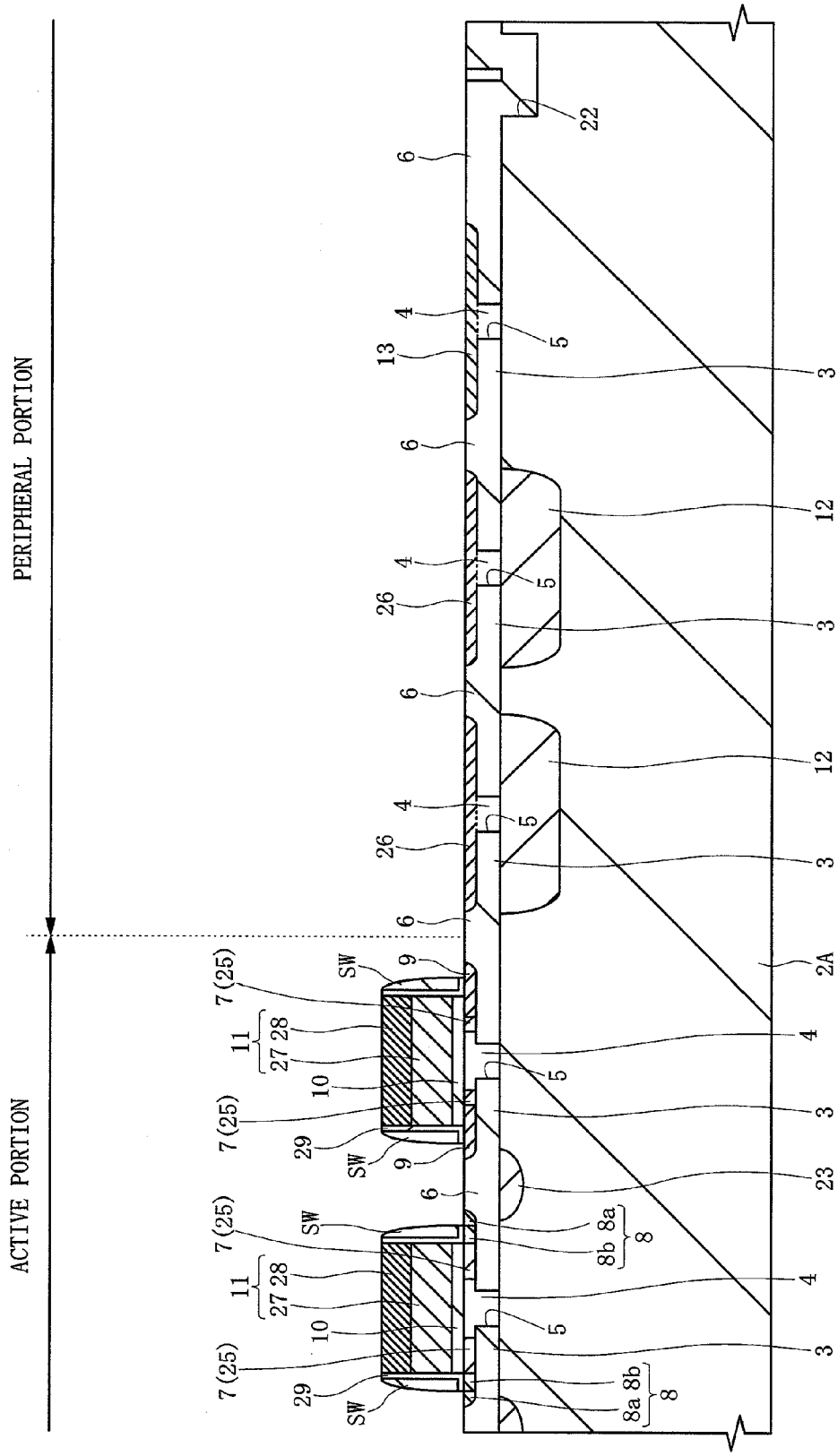
FIG. 20 is a cross-sectional view of main part during the manufacturing step of the semiconductor device continued from FIG. 19.

Then, as shown in FIG. 20, n$^+$-type source layers 8a having a higher impurity concentration than the above-described n$^-$-type source layers 8b are formed by introducing an impurity exhibiting n-type conductivity type (for example, As (arsenic)) into the n$^-$-type source layers 8b in both sides of the gate electrodes 11 of the active portion by ion implantation while using a photo resist film, which has been patterned by photolithography technique, as a mask. As a result, n-type source layers 8 each of which is composed of the n$^-$-type source layer 8b and the n$^+$-type source layer 8a are formed. At the same time, an n-type guard ring (channel stopper) is formed by introducing an impurity exhibiting n-type conductivity type (for example, As (arsenic)) into the surface semiconductor layer 4 of the peripheral portion.

In the ion implantation of the impurity for forming the n$^+$-type source layers 8a, etc., the amount of implantation is larger than that in the ion implantation of the impurity for forming the above-described n$^-$-type source layers 8b. In this manner, even when the impurity of a high concentration is introduced, the impurity is ion-implanted away from the side surface of the gate electrode 11 by a distance corresponding to the sidewall length of the sidewall SW; therefore, the introduction of the impurity exhibiting n-type conductivity type can be prevented from generating crystal defects in the surface semiconductor layers 4, which are below the side surfaces of the gate electrodes 11, and the gate insulating film 10. Even if crystal defects are generated in the surface semiconductor layers 4 below ends of the sidewalls SW, the operation characteristics of the IGBTs are not affected almost at all since they are away from the side surfaces of the gate electrodes 11.

Incidentally, the n-type source layers 8 and the p$^+$-type emitter layers 9 cannot be formed in the same cross section. Therefore, as shown in above-described FIG. 1, in the top view, the n-type source layers 8 and the p$^+$-type emitter layers 9 are alternately disposed along the y-direction in the single belt-like region between the gate electrode 11 and the insulating film 6 extending in the y-direction (first direction). Furthermore, in the top view, the n-type source layer 8 and the p$^+$-type emitter layer 9 are opposed to each other in the x-direction (second direction) orthogonal to the y-direction with the gate electrode 11 interposed therebetween; and, in the top view, the n-type source layers 8 and the p$^+$-type emitter layers 9 are alternately disposed in the x-direction (second direction).

The p-type semiconductor layers 25 below the gate electrodes 11 where the n-type source layer 8 or the p$^+$-type emitter layer 9 is not formed constitute p-type channel layers 7.

The elements of the IGBTs according to the present first embodiment can be formed through the steps described above.

Figure 21:
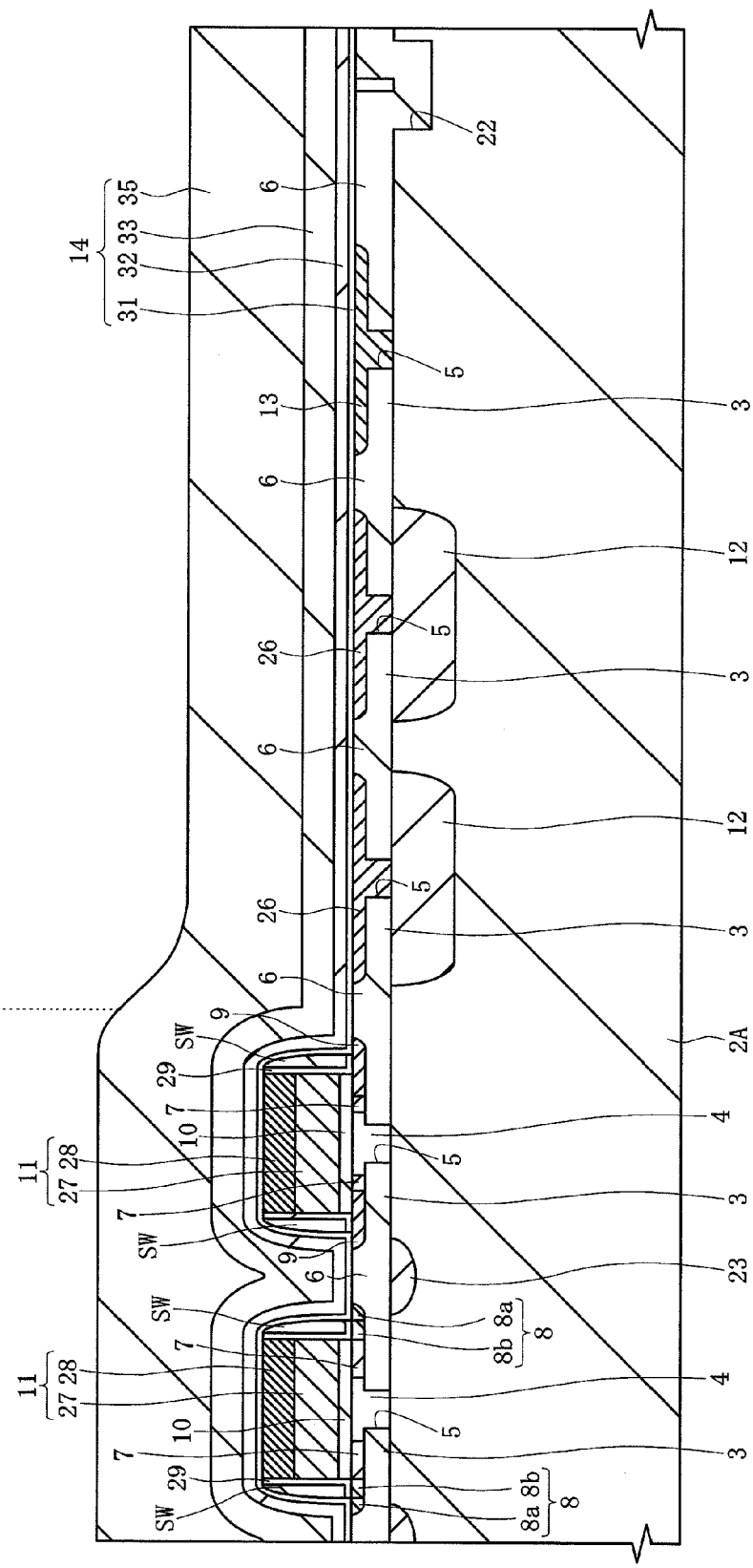
FIG. 21 is a cross-sectional view of main part during the manufacturing step of the semiconductor device continued from FIG. 20.

Then, as shown in FIG. 21, a silicon oxide film 31 is formed on the main surface of the substrate 2A by subjecting the substrate 2A to thermal oxidation treatment, and a silicon nitride film 32, a silicon oxide film 33, and a laminated insulating film 35 of a PSG film and a SOG film are then sequentially deposited, thereby forming an interlayer insulating film 14 composed of these insulating films. The thickness of the silicon oxide film 31 is, for example, 10 to 30 nm; the thickness of the silicon nitride film 32 is, for example, 10 to 50 nm; the thickness of the silicon oxide film 33 is, for example, 100 to 300 nm; and the thickness of the laminated insulating film 35 of the PSG film and the SOG film is, for example, 200 to 500 nm. Instead of the laminated insulating film 35 of the PSG film and the SOG film, a laminated insulating film of a BPSG (Boron-PSG) film, a PSG film, and a BPSG film or a laminated insulating film of a BPSG film and a SOG film may be formed.

Then, the substrate 2A is subjected to thermal treatment to bake the above-described SOG film. In this thermal treatment, the impurity in the p$^+$-type semiconductor layer 26 formed in the surface semiconductor layer 4 above the p-type field limiting ring 12 of the peripheral portion is diffused, the impurity is introduced also into the surface semiconductor layer 4 (opening 5) between the p-type field limiting ring 12 and the p$^+$-type semiconductor layer 26, and both of them are connected with each other with low resistance. Similarly, the impurity in the n-type guard ring 13 of the peripheral portion is diffused, the impurity is also introduced into the surface semiconductor layer 4 (opening 5) between the n-type guard ring 13 and the substrate 2A, and both of them are connected with each other with low resistance.

Figure 22:
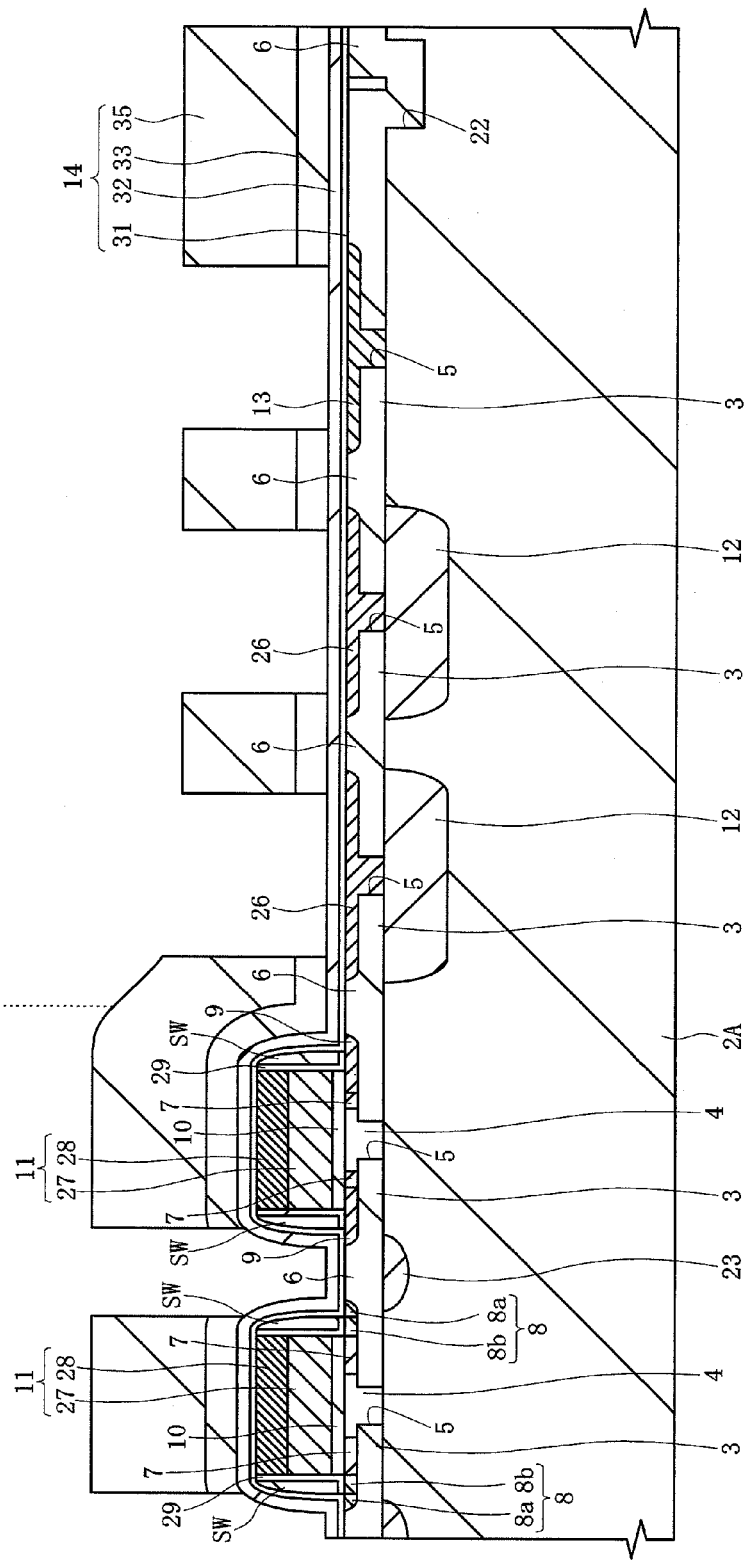
FIG. 22 is a cross-sectional view of main part during the manufacturing step of the semiconductor device continued from FIG. 21.
Figure 23:
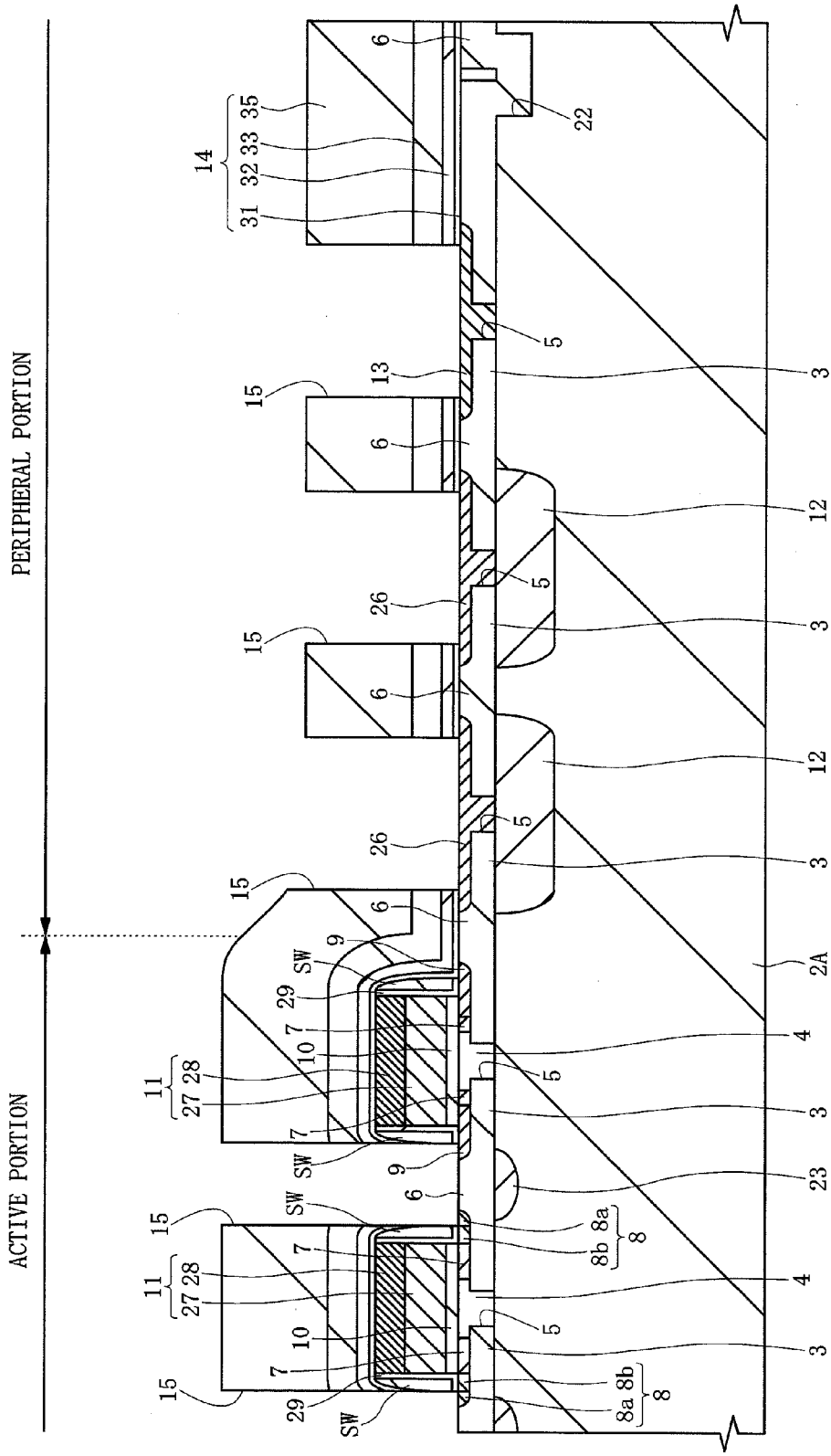
FIG. 23 is a cross-sectional view of main part during the manufacturing step of the semiconductor device continued from FIG. 22.

Then, as shown in FIG. 22 and FIG. 23, openings 15 which reach the $n^+$-type source layers 8a, the $p^+$-type emitter layers 9, the gate electrodes 11, the $p^+$-type semiconductor layers 26, and the n-type guard ring 13 are formed by etching the interlayer insulating film 14 while using a photo resist film, which has been patterned by photolithography techniques, as a mask.

Upon formation of the openings 15, first, the laminated insulating film 35 of the PSG film and the SOG film and the silicon oxide film 33 are sequentially etched (FIG. 22) while using the silicon nitride film 32 as an etching stopper. Subsequently, the silicon nitride film 32 is etched while using the silicon oxide film 31 as an etching stopper. Then, the silicon oxide film 31 is etched while using, as etching stoppers, the $n^+$-type source layers 8a composed of single-crystal silicon, the $p^+$-type emitter layers 9, the $p^+$-type semiconductor layers 26, the n-type guard ring 13, and the tungsten silicide layers 28 constituting the upper part of the gate electrodes 11 (FIG. 23).

In this manner, the etching of the laminated insulating film 35 of the PSG film and the SOG film and the silicon oxide film 33 is once stopped at the silicon nitride film 32, and the silicon nitride film 32 and the silicon oxide film 31, which are relatively thin, are then sequentially etched to form the openings 15. Therefore, the amount of over-etching of the $n^+$-type source layers 8a, the $p^+$-type emitter layers 9, the $p^+$-type semiconductor layers 26, and the n-type guard ring 13 can be minute. Therefore, the buried insulating films 3 below the $n^+$-type source layers 8a, the $p^+$-type emitter layers 9, the $p^+$-type semiconductor layers 26, and the n-type guard ring 13 are prevented from being etched through them, and the openings 15 are prevented from reaching the substrate 2A.

Figure 24:
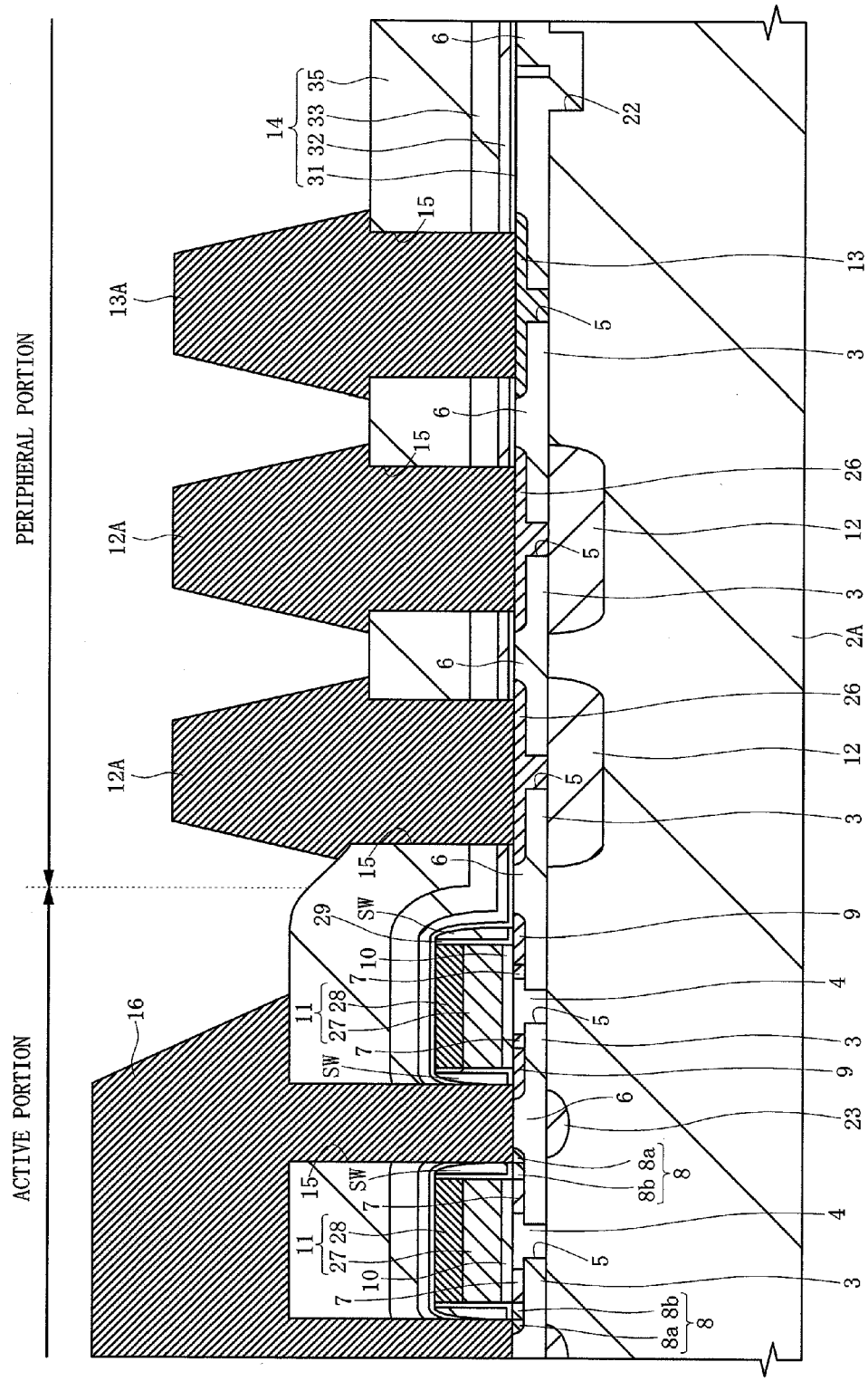
FIG. 24 is a cross-sectional view of main part during the manufacturing step of the semiconductor device continued from FIG. 23.

In the present first embodiment, the gate electrode 11 is composed of the laminated film of the polycrystalline silicon film 27 and the tungsten silicide layer 28, and the height of the gate electrode 11 is relatively low as described above. If the gate electrode 11 is formed only of the polycrystalline silicon film 27 without using the tungsten silicide layer 28, the polycrystalline silicon film 27 has to be formed to be relatively thick in order to reduce the resistance of the gate electrode 11. However, if the polycrystalline silicon film 27 is thick, the level differences in the surface (surface waviness) of the interlayer insulating film 14 are increased, and there are risks of causing defocus in the photolithography step upon formation of the openings 15 or defective etching in the etching step. In the present first embodiment, the height of the gate electrode 11 is formed to be relatively low; therefore, the above-described defective etching can be avoided. Then, as shown in FIG. 24, an Al (aluminum) film is deposited on the main surface of the substrate 2A, for example, by sputtering.

Then, the Al (aluminum) film is etched while using a photo resist film, which has been patterned by photolithography techniques, as a mask. As a result, the emitter pads (emitter electrodes) 16, which are electrically connected to the $n^+$-type source layers 8a and the $p^+$-type emitter layers 9; a gate finger 17A, which is electrically connected to the gate electrodes 11 (see FIG. 1); and the gate pads 17, which are continued to the gate finger 17A (see FIG. 1), are formed. Furthermore, field limiting ring electrodes 12A, which are electrically connected to the p-type field limiting rings 12 via the $p^+$-type semiconductor layers 26, and a guard ring electrode 13A, which is electrically connected to the n-type guard ring 13, are formed.

Although illustration is omitted, a polyimide film is deposited as a surface protective film on the main surface of the substrate 2A after the emitter pads 16, the gate pads 17, the gate finger 17A, the field limiting ring electrodes 12A, and the guard ring electrode 13A are formed. Subsequently, openings which reach the emitter pads 16 and the gate pads 17 are formed in the polyimide film. Moreover, in accordance with needs, an opening which reaches the guard ring electrode 13A is formed. These openings are formed in order to electrically connect the emitter pads 16 and the gate pads 17 to corresponding leads by using bonding wires after the substrate 2A is divided into individual semiconductor chips 1 (see FIG. 1) and the semiconductor chip 1 is mounted on a die pad of a lead frame.

Figure 25:
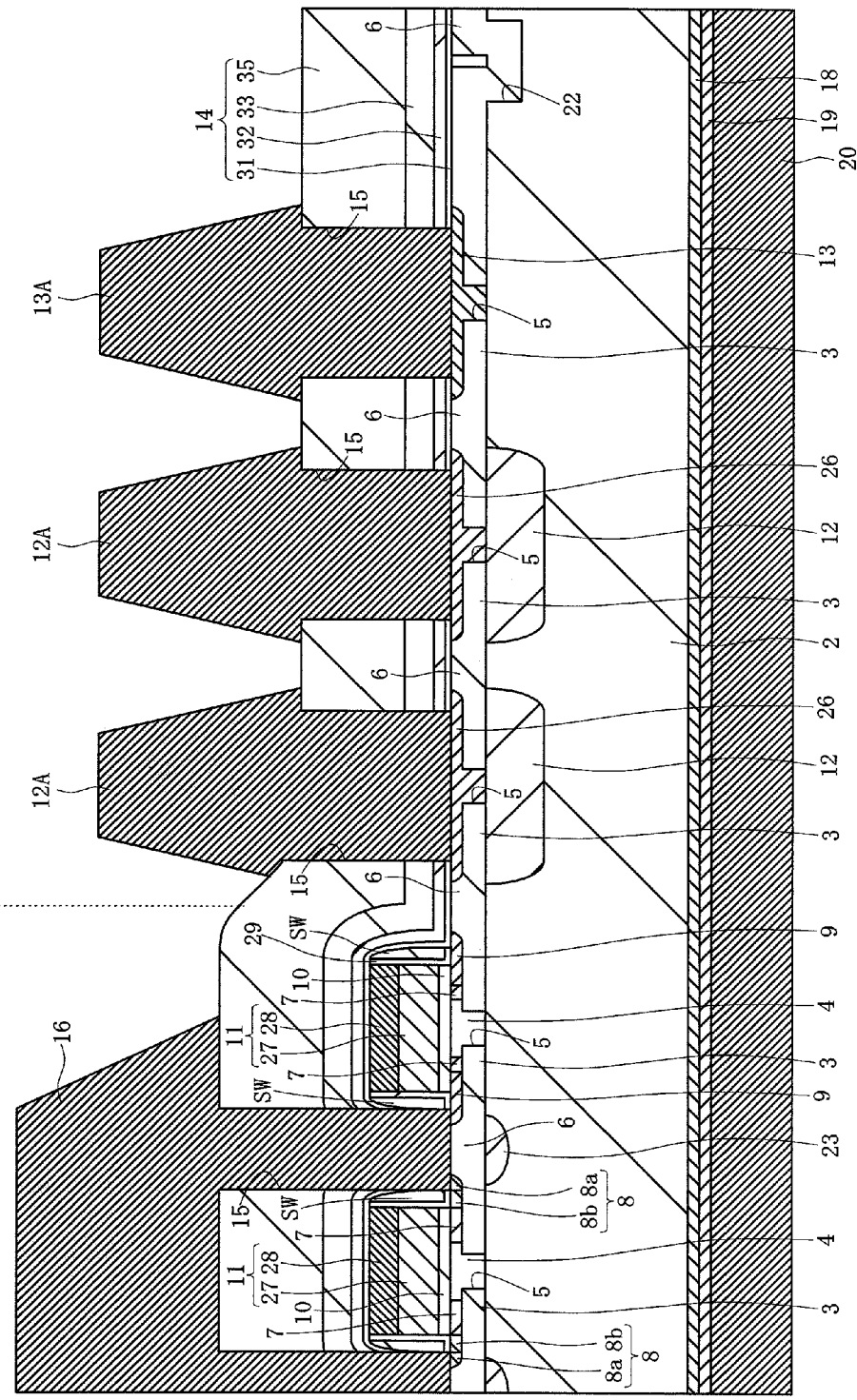
FIG. 25 is a cross-sectional view of main part during the manufacturing step of the semiconductor device continued from FIG. 24.

Then, as shown in FIG. 25, after a reinforcing material (illustration omitted) such as a foaming double-sided tape or a glass reinforcing plate is pasted on the main surface of the substrate 2A, the back surface of the substrate 2A is ground to form the base layer 2. As described above, the thickness of the base layer 2 is determined in accordance with the withstand voltage of the IGBTs. The back surface of the substrate 2A is ground until 60 µm to 100 µm if the withstand voltage is 600 V, or ground until 120 µm to 150 µm if the withstand voltage is 1200 V. Since the reinforcing material is pasted on the main surface side of the substrate 2A, warping or sagging of the substrate 2A can be prevented.

Then, an n-type buffer layer 18 and a p-type collector layer 19 are formed by sequentially introducing an impurity exhibiting n-type conductivity type (for example, P (phosphorous)) and a impurity exhibiting p-type conductivity type (for example, B (boron)) into the back surface of the base layer 2 by ion implantation and activating the impurities by using, for example, laser annealing.

Then, a collector electrode 20 is formed on the back surface of the base layer 2. The collector electrode 20 can be formed by, for example, stacking an Al (aluminum) film, a Ti (titanium) film, a Ni (nickel) film, and an Au (gold) film in this order from the side close to the p-type collector layer 19 by sputtering or vapor deposition. Alternatively, the collector electrode 20 may be a stack of a Ni (nickel) film, a Ti (titanium) film, a Ni (nickel) film, and an Au (gold) film in this order from the side close to the p-type collector layer 19; or the collector electrode 20 may be a stack of a Ti (titanium) film, a Ni (nickel) film, and an Au (gold) film in this order from the side close to the p-type collector layer 19. Then, the reinforcing material is removed.

Then, the substrate 2A is diced into the individual semiconductor chips 1 (see FIG. 1) by cutting the substrate 2A along dividing regions (dicing lines). Subsequently, a lead frame is prepared, and the diced semiconductor chip 1 is mounted on a die pad of the lead frame. Then, the emitter pads 16, the gate pads 17, the field limiting ring electrodes 12A, and the guard ring electrode 13A are electrically connected to the corresponding leads by using bonding wires. Then, the semiconductor chip 1, the lead frame, and the bonding wires are sealed with a sealing resin to manufacture the semiconductor device according to the present first embodiment.

In this manner, according to the present first embodiment, upon formation of the openings 15 in the interlayer insulating film 14, the etching of the laminated insulating film 35 of the PSG film and the SOG film and the silicon oxide film 33 is once stopped at the silicon nitride film 32. Then, the silicon nitride film 32 and the silicon oxide film 31 are sequentially etched to form the openings 15, which reach the $n^+$-type source layers 8a and the p⁺-type emitter layers 9. Therefore, the amount of over-etching of the n⁺-type source layers 8a and the p⁺-type emitter layers 9 can be caused to be minute. Therefore, even when the thicknesses of the p-type channel layers 7, the n-type source layers 8, and the p⁺-type emitter layers 9 (surface semiconductor layers 4) are, for example, 20 to 100 nm in order to reduce the steady loss, turn-off time, and turn-off loss, the buried insulating film 3 below the n⁺-type source layers 8a and the p⁺-type emitter layers 9 can be prevented from being etched through them, and the openings 15 are prevented from reaching the substrate 2A.

Furthermore, according to the present first embodiment, even when the thickness of the surface semiconductor layers 4 is, for example, 20 to 100 nm in order to reduce the steady loss, turn-off time, and turn-off loss, the reduction in breakdown tolerance upon collection of hole currents can be prevented.

(Second Embodiment)
<<Semiconductor Device>>

Figure 26:
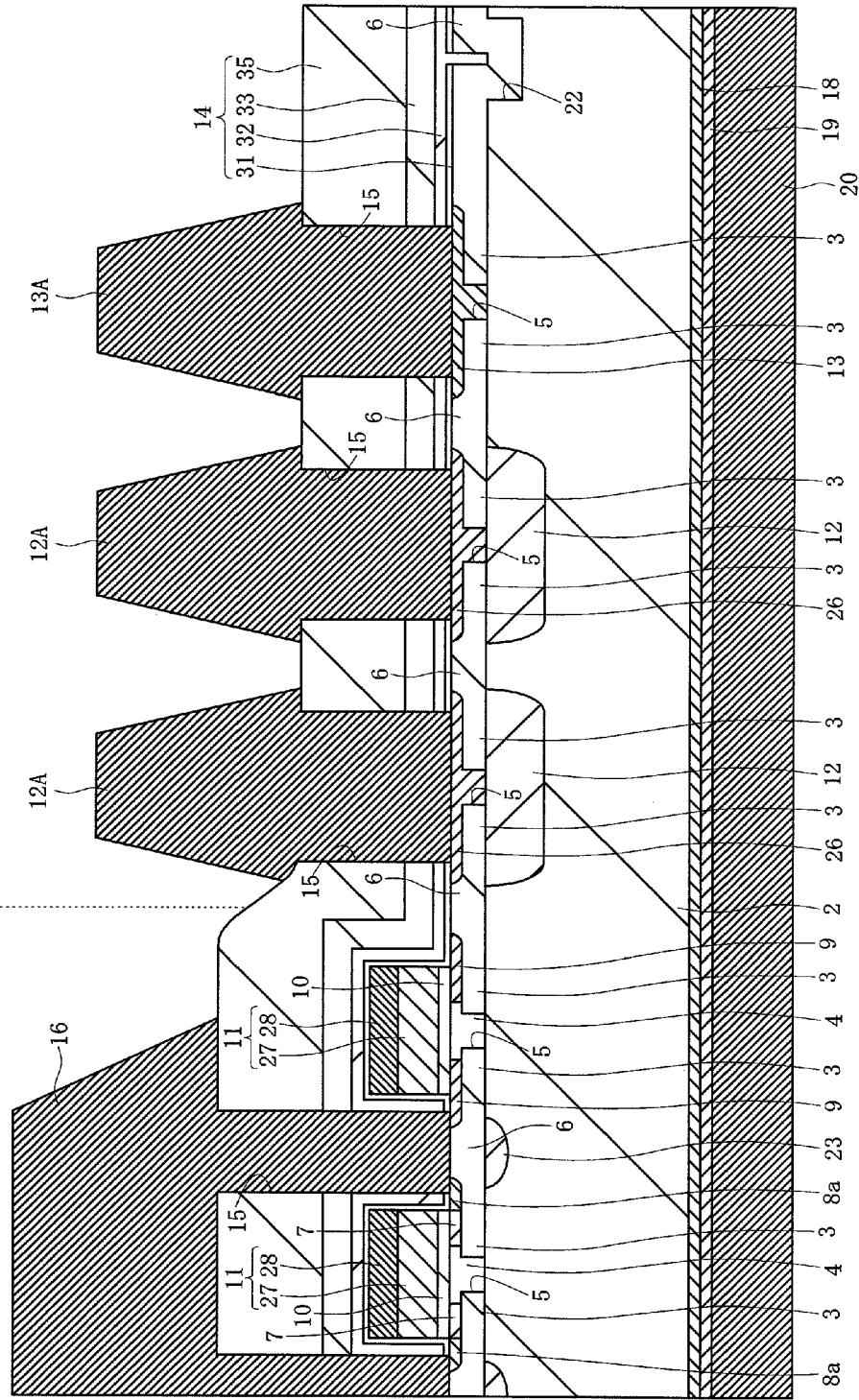
FIG. 26 is a cross-sectional view of main part showing an active portion and a peripheral portion of the semiconductor chip forming IGBTs according to a second embodiment of the present invention.

A semiconductor device including an IGBT according to a second embodiment of the present invention will be explained by using FIG. 26. FIG. 26 is a cross-sectional view of main part showing an active portion and a peripheral portion of a semiconductor chip.

A different point from the above-described first embodiment is that the n-type source layer 8 is composed only of the n⁺-type source layer 8a without forming the sidewall SW on the side surface of the gate electrode 11. More specifically, in the above-described first embodiment, after the sidewall SW is formed on the side surface of the gate electrode 11, the ion implantation of the impurity for forming the n⁺-type source layer 8a having a relatively high concentration is carried out, thereby preventing crystal defects from being generated in the surface semiconductor layer 4 below the side surface of the gate electrode 11 and in the gate insulating film 10. However, if the sidewall SW is formed, the bottom part of the opening 15 (the exposed surfaces of the n⁺-type source layer 8a and the p⁺-type emitter layer (p-type back gate layer) 9) formed thereafter in the interlayer insulating film 14 becomes small, and there is a risk of generation of connection fault between the emitter pad (emitter electrode) 16 and the n⁺-type source layer 8a and the p⁺-type emitter layer 9.

On the other hand, in the present second embodiment, no sidewall SW is formed. As a result, the poor connection between the emitter pad 16 and the n⁺-type source layer 8a and the p⁺-type emitter layer 9 can be avoided. In this case, crystal defects generated in the surface semiconductor layer 4 below the side surface of the gate electrode 11 and in the gate insulating film 10 have to be prevented by adjusting the ion implantation conditions (such as implantation energy and implantation amount) of the impurity for forming the n⁺-type source layer 8a.

<<Method of Manufacturing the Semiconductor Device>>

A method of manufacturing the semiconductor device including the IGBT according to the second embodiment of the present invention will be explained in the order of steps by using FIGS. 27 to 32. FIGS. 27 to 32 are cross-sectional views of main parts showing the active portion and the peripheral portion of the semiconductor chip.

Manufacturing steps of the IGBT according to the present second embodiment are similar up to the steps explained by using FIGS. 3 to 16 among the manufacturing steps of the IGBT explained in the above-described first embodiment. Therefore, the explanation thereof will be omitted.

Figure 27:
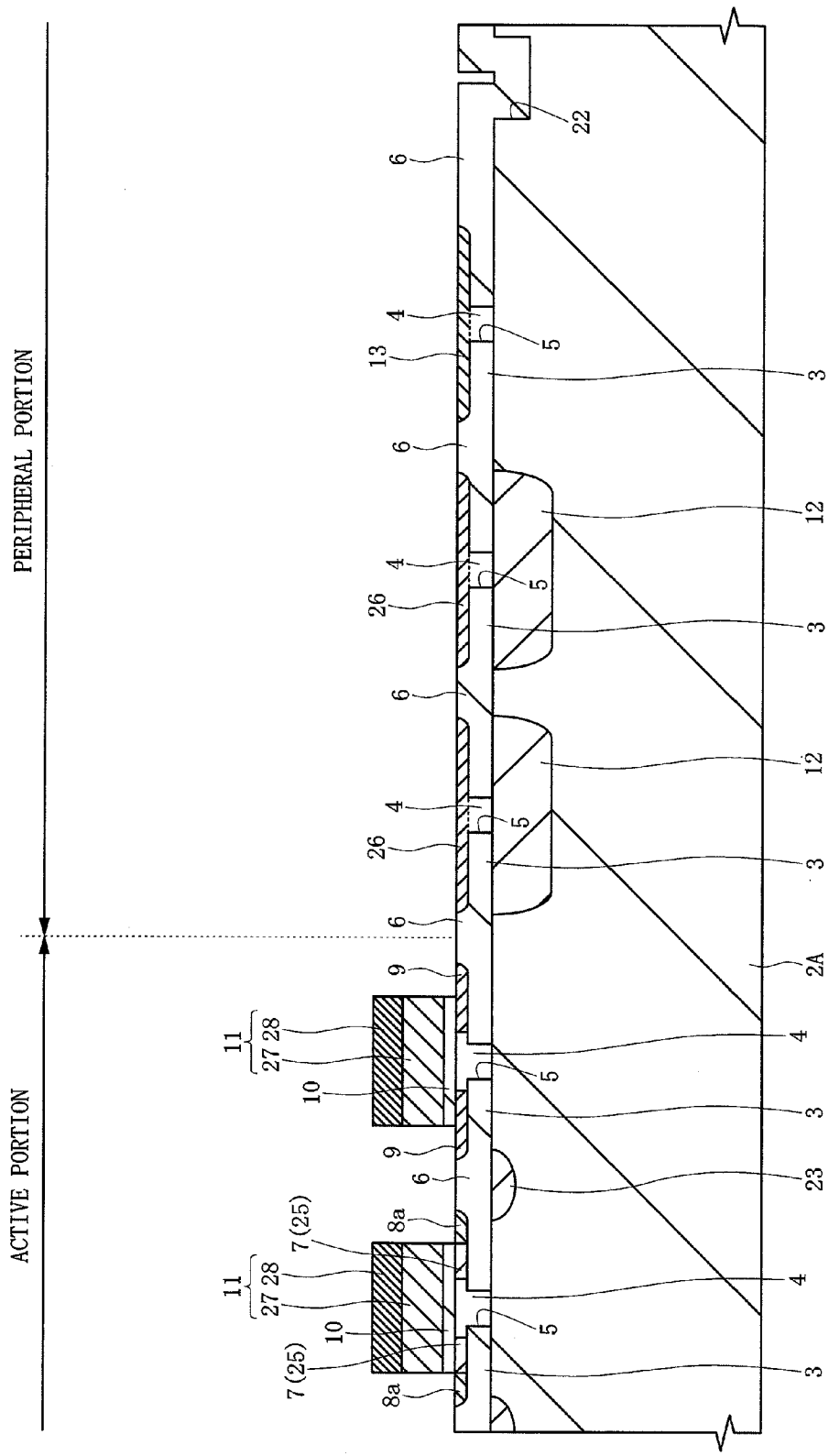
FIG. 27 is a cross-sectional view of main part showing a manufacturing step of the semiconductor device including the IGBTs according to the second embodiment of the present invention.

Subsequent to the step explained by using above-described FIG. 16, as shown in FIG. 27, the n⁺-type source layers 8a are formed by introducing an impurity exhibiting n-type conductivity type (for example, As (arsenic)) into the p-type semiconductor layers 25 in both sides of the gate electrodes 11 of the active portion by ion implantation while using a photo resist film, which has been patterned by photolithography technique, as a mask. The p-type channel layers 7 are formed in the p-type semiconductor layers 25 below the gate electrodes 11 where the n⁺-type source layers 8a have not been formed. At the same time, the n-type guard ring (channel stopper) 13 is formed by introducing an impurity exhibiting n-type conductivity type (for example, As (arsenic)) into the surface semiconductor layer 4 of the peripheral portion.

Figure 28:
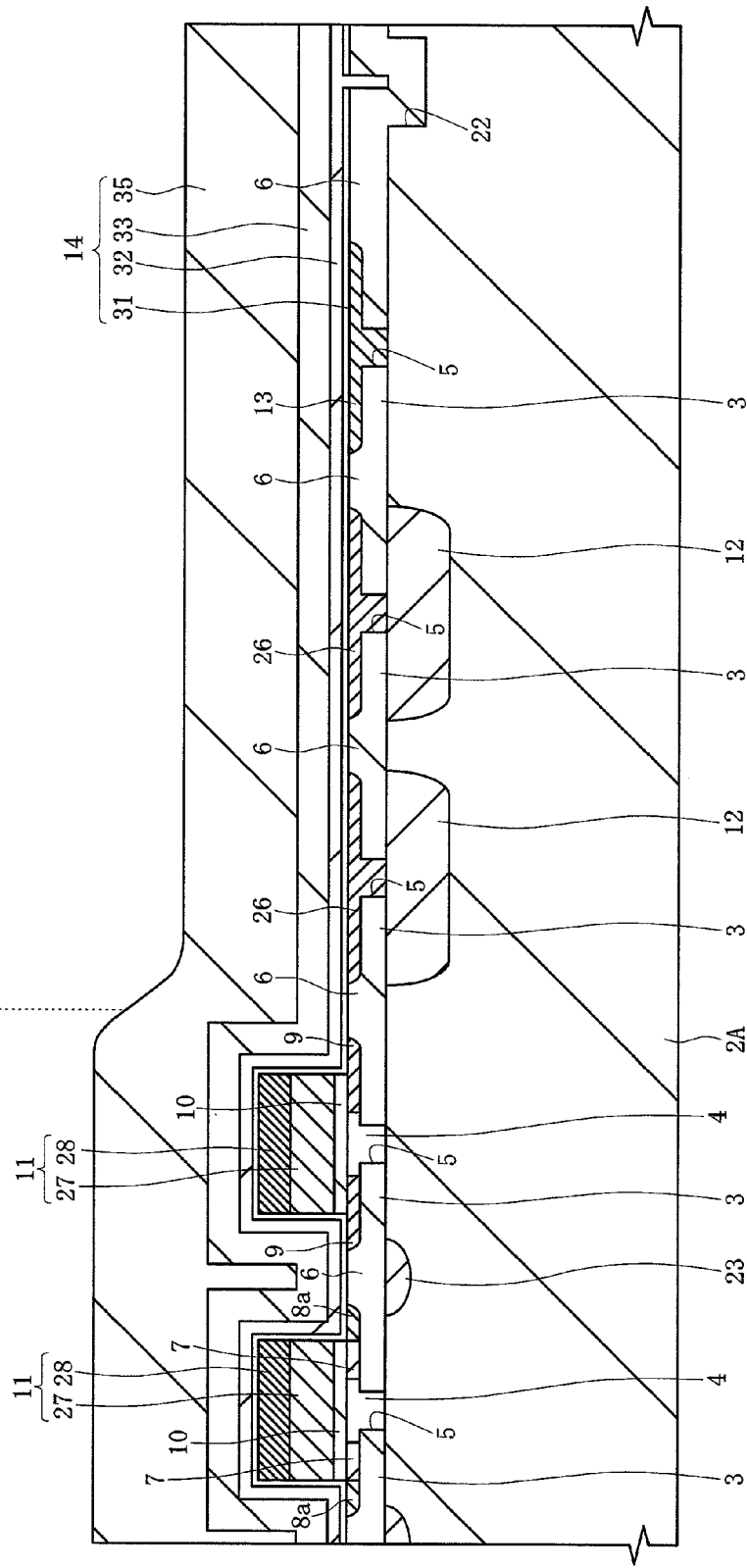
FIG. 28 is a cross-sectional view of main part during the manufacturing step of the semiconductor device continued from FIG. 27.

Then, as shown in FIG. 28, the silicon oxide film 31 is formed on the main surface of the substrate 2A by subjecting the substrate 2A to thermal oxidation treatment; and, subsequently, the silicon nitride film 32, the silicon oxide film 33, and the laminated insulating film 35 of the PSG film and the SOG film are sequentially deposited, thereby forming the interlayer insulating film 14 composed of these insulating films. The thickness of the silicon oxide film 31 is, for example, 10 to 30 nm; the thickness of the silicon nitride film 32 is, for example, 10 to 50 nm; the thickness of the silicon oxide film 33 is, for example, 100 to 300 nm; and the thickness of the laminated insulating film 35 of the PSG film and the SOG film is, for example, 200 to 500 nm. Instead of the laminated insulating film 35 of the PSG film and the SOG film, a laminated insulating film of a BPSG (Boron-PSG) film, a PSG film, and a BPSG film or a laminated insulating film of a BPSG film and a SOG film may be formed.

Then, the substrate 2A is subjected to thermal treatment to bake the above-described SOG film. In this thermal treatment, the impurity in the p⁺-type semiconductor layer 26 formed in the surface semiconductor layer 4 above the p-type field limiting ring 12 of the peripheral portion is diffused, the impurity is introduced also into the surface semiconductor layer 4 (opening 5) between the p-type field limiting ring 12 and the p⁺-type semiconductor layer 26, and both of them are connected with each other with low resistance. Similarly, the impurity in the n-type guard ring 13 of the peripheral portion is diffused, the impurity is also introduced into the surface semiconductor layer 4 (opening 5) between the n-type guard ring 13 and the substrate 2A, and both of them are connected with each other with low resistance.

Figure 29:
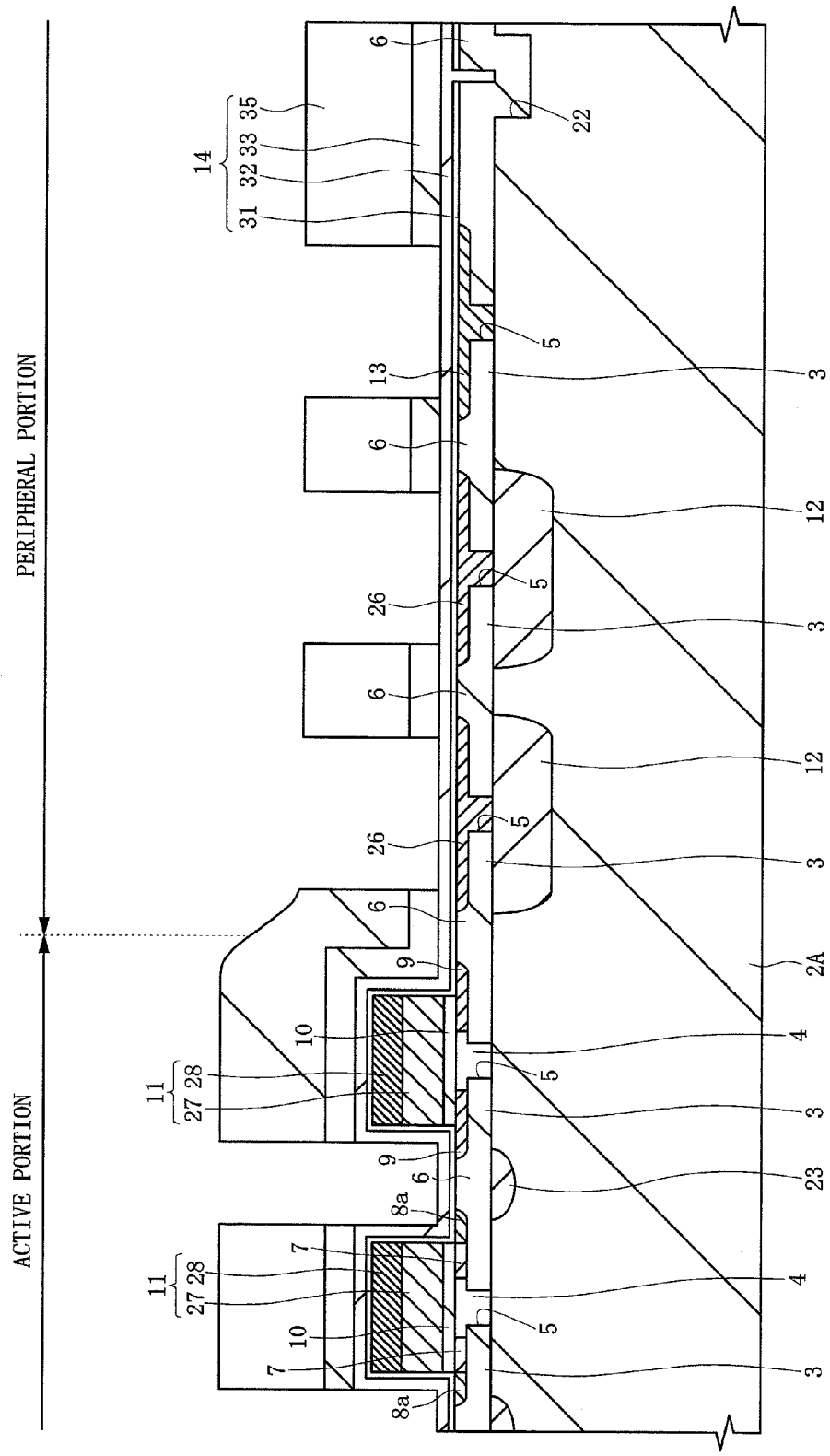
FIG. 29 is a cross-sectional view of main part during the manufacturing step of the semiconductor device continued from FIG. 28.
Figure 30:
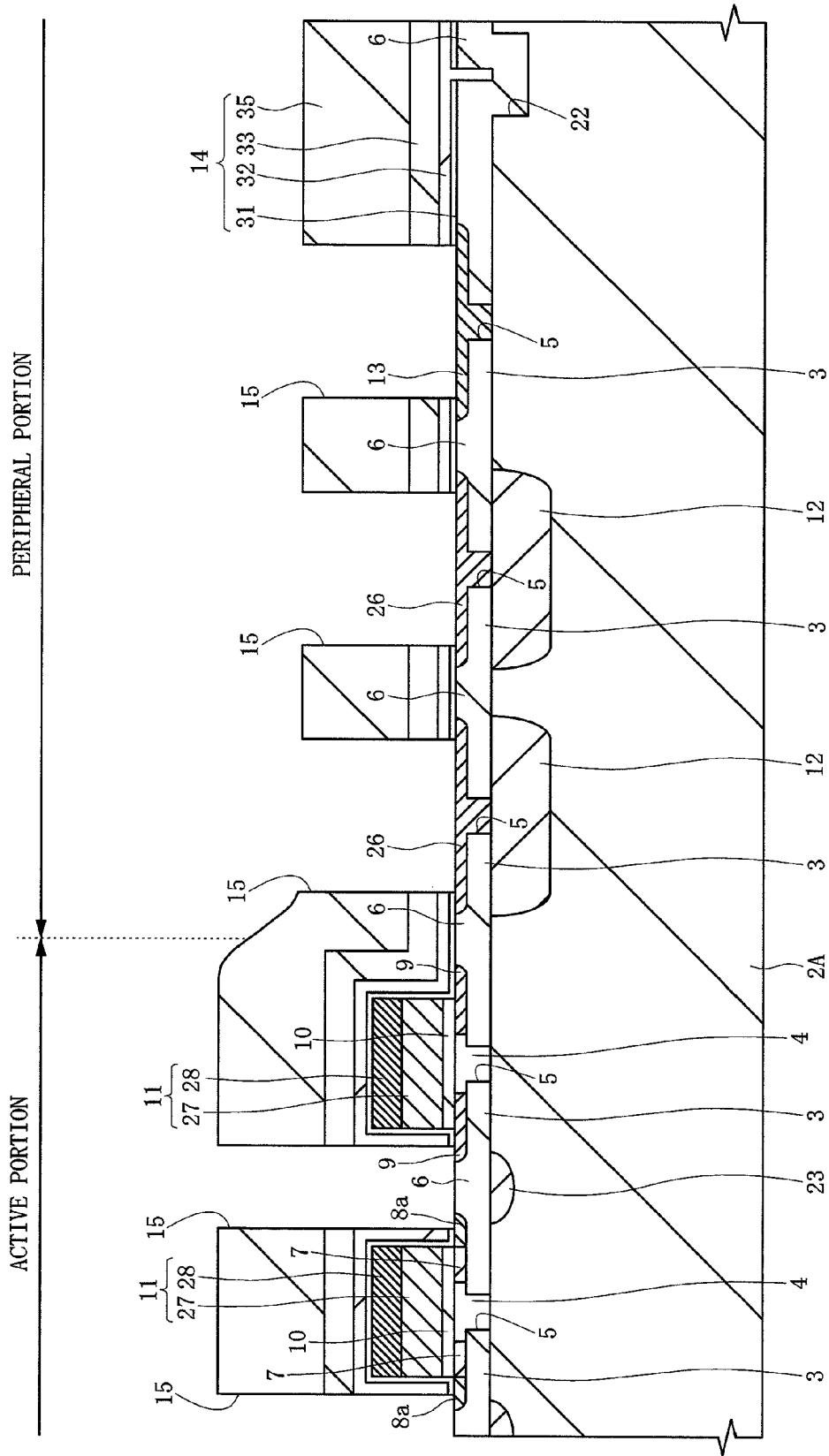
FIG. 30 is a cross-sectional view of main part during the manufacturing step of the semiconductor device continued from FIG. 29.

Then, as shown in FIGS. 29 and 30, openings 15 which reach the n⁺-type source layers 8a, the p⁺-type emitter layers 9, the gate electrodes 11, the p⁺-type semiconductor layers 26, and the n-type guard ring 13 are formed by etching the interlayer insulating film 14 while using a photo resist film, which has been patterned by photolithography technique, as a mask.

Upon formation of the openings 15, first, the laminated insulating film 35 of the PSG film and the SOG film and the silicon oxide film 33 are sequentially etched (FIG. 29) while using the silicon nitride film 32 as an etching stopper. Subsequently, the silicon nitride film 32 is etched while using the silicon oxide film 31 as an etching stopper. Then, the silicon oxide film 31 is etched while using, as etching stoppers, the n⁺-type source layers 8a composed of single-crystal silicon, the p⁺-type emitter layers 9, the p⁺-type semiconductor layers 26, the n-type guard ring 13, and the tungsten silicide layers 28 constituting the upper part of the gate electrodes 11 (FIG. 30).

In this manner, the etching of the laminated insulating film 35 of the PSG film and the SOG film and the silicon oxide film 33 is once stopped at the silicon nitride film 32, and the silicon nitride film 32 and the silicon oxide film 31, which are relatively thin, are then sequentially etched to form the openings 15. Therefore, the amount of over-etching of the n⁺-type source layers 8a, the p⁺-type emitter layers 9, the p⁺-type semiconductor layers 26, and the n-type guard ring 13 can be caused to be minute. Therefore, the buried insulating films 3 below the n⁺-type source layers 8a, the p⁺-type emitter layers 9, the p⁺-type semiconductor layers 26, and the n-type guard ring 13 can be prevented from being etched through them, and the openings 15 can be prevented from reaching the substrate 2A.

Figure 31:
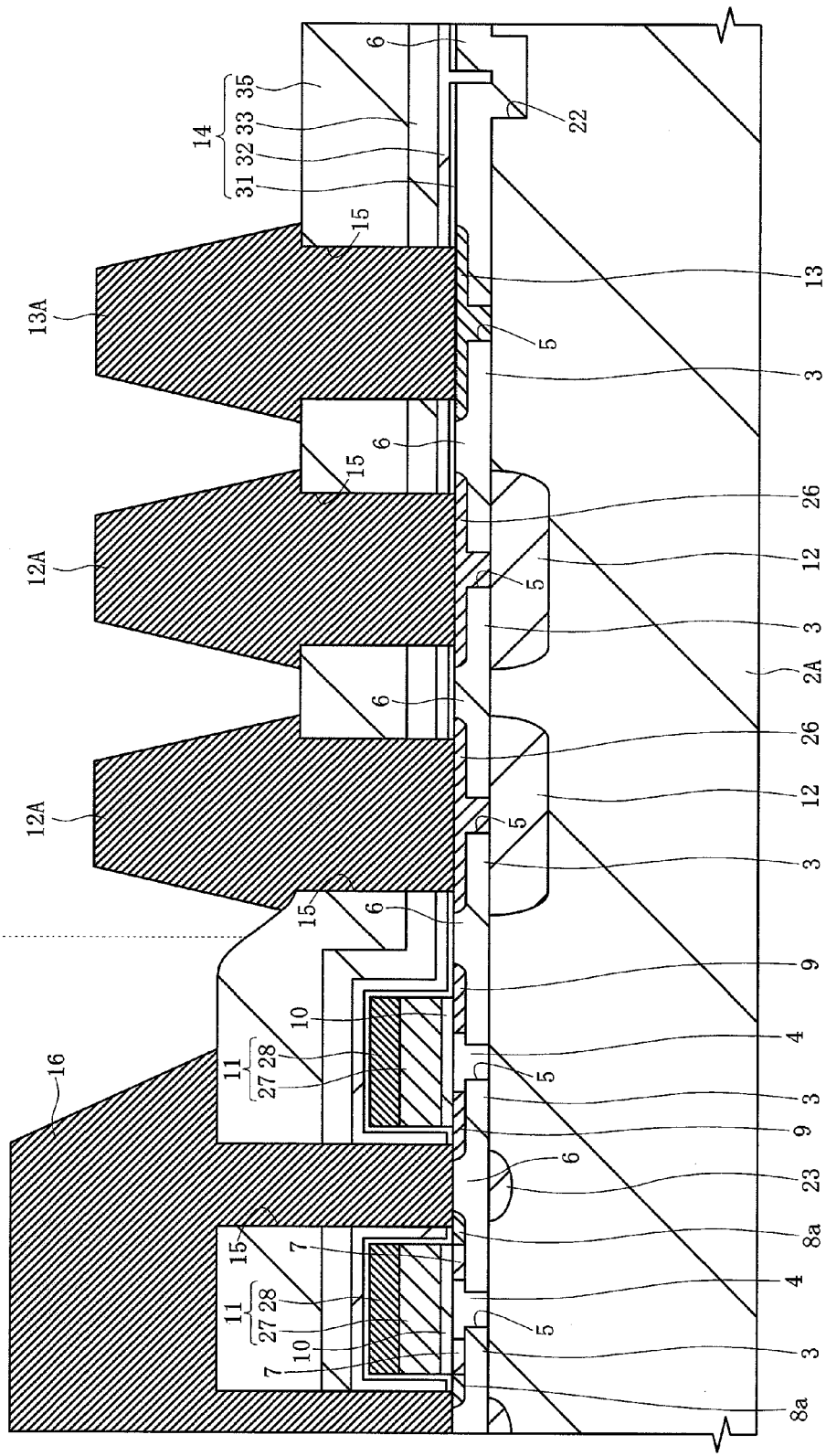
FIG. 31 is a cross-sectional view of main part during the manufacturing step of the semiconductor device continued from FIG. 30.
Figure 32:
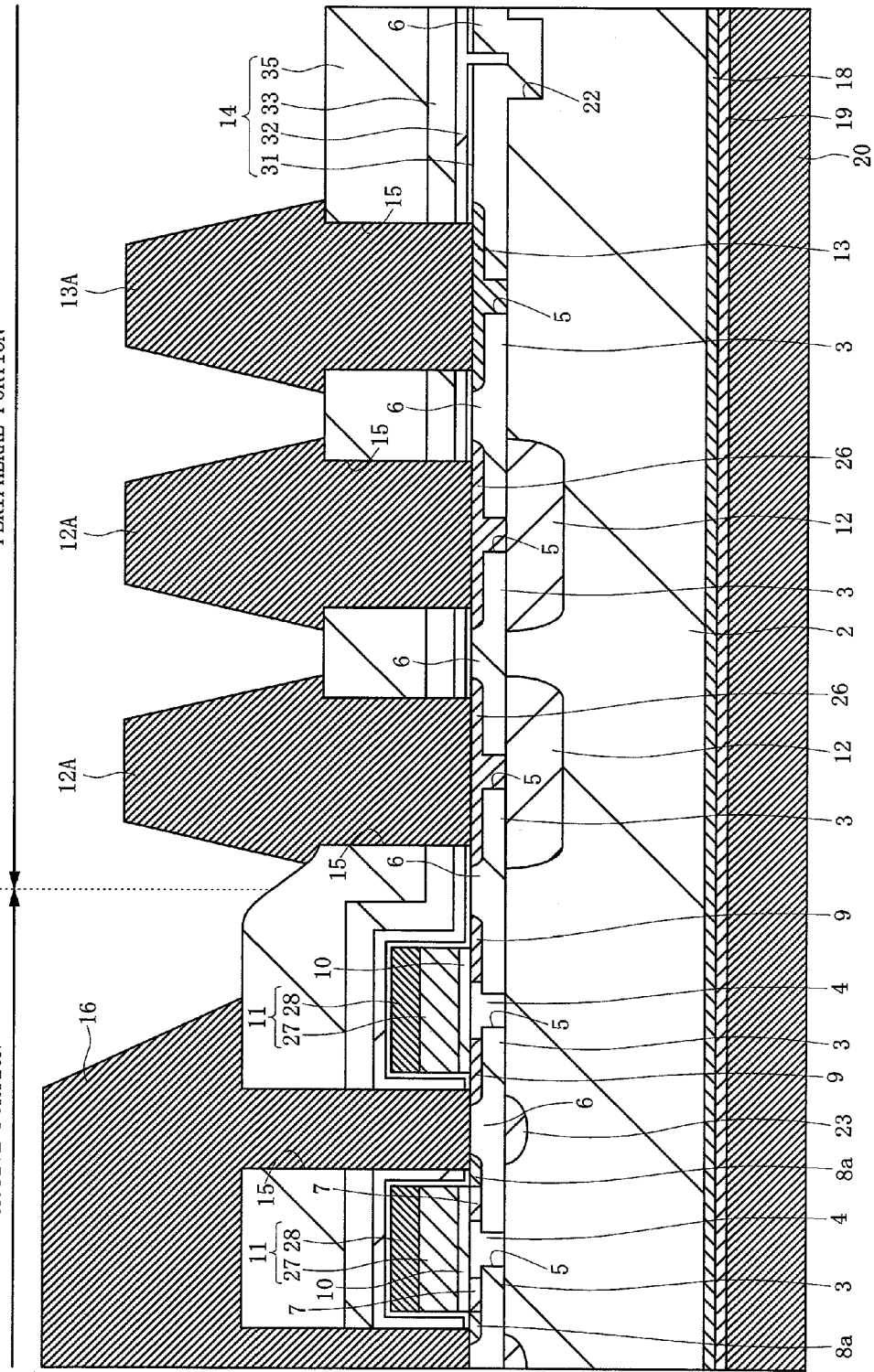
FIG. 32 is a cross-sectional view of main part during the manufacturing step of the semiconductor device continued from FIG. 31.

Thereafter, as well as the above-described first embodiment, as shown in FIG. 31, the emitter pad (emitter electrode) 16, the field limiting ring electrodes 12A, the guard ring electrode 13A, etc. are formed. Furthermore, as shown in FIG. 32, the base layer 2 is formed by grinding the back surface of the substrate 2A. Subsequently, the n-type buffer layer 18, the p-type collector layer 19, and the collector electrode 20 are formed.

In this manner, according to the present second embodiment, the effects similar to those of the above-described first embodiment can be obtained, and, furthermore, the poor connection between the emitter pad 16 and the n⁺-type source layer 8a and the p⁺-type emitter layer 9 can be prevented.

(Third Embodiment)
<<Semiconductor Device>>

Figure 33:
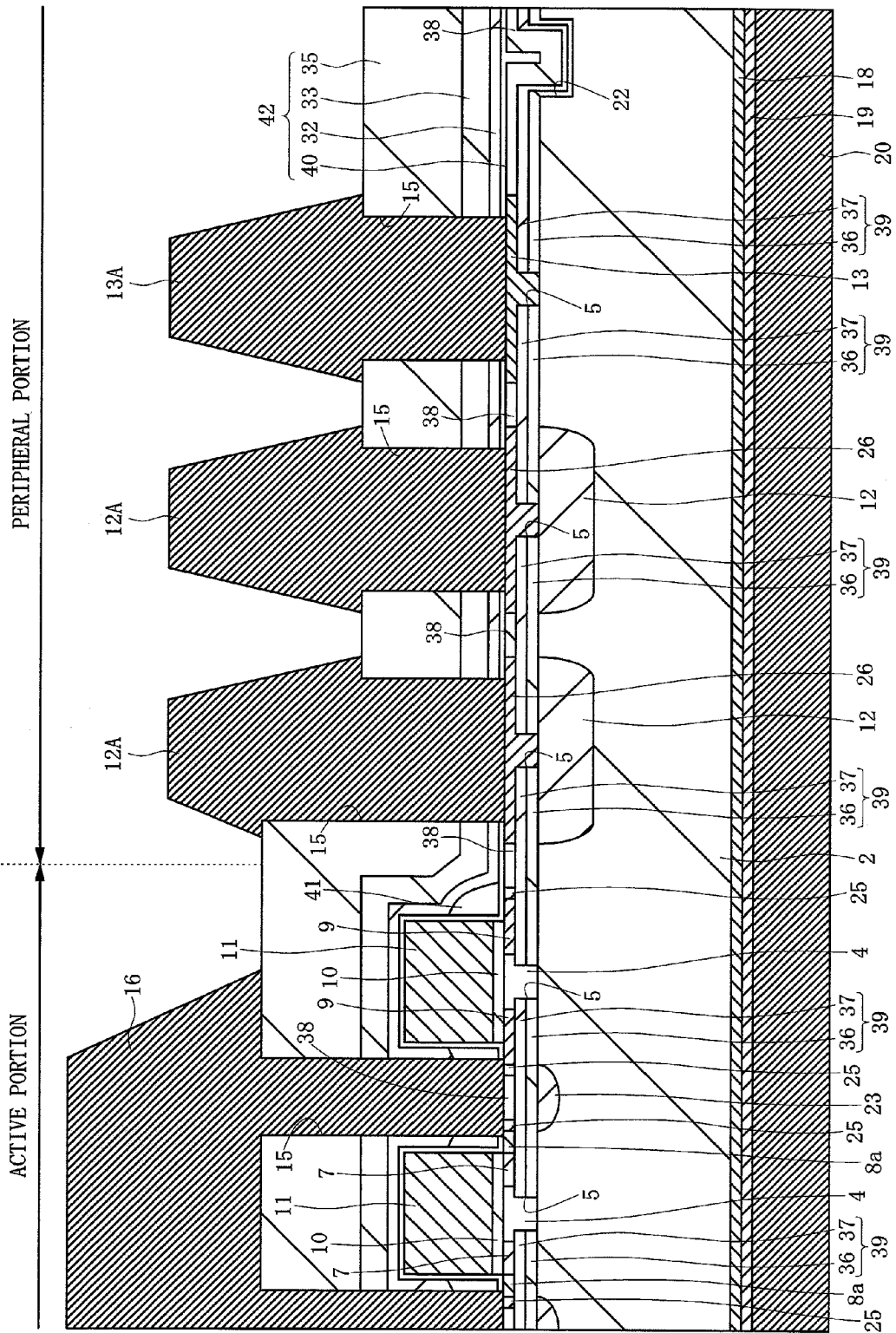
FIG. 33 is a cross-sectional view of main part showing an active portion and a peripheral portion of the semiconductor chip forming IGBTs according to a third embodiment of the present invention.

A semiconductor device including an IGBT according to a third embodiment of the present invention will be described with reference to FIG. 33. FIG. 33 is a cross-sectional view of main part showing an active portion and a peripheral portion of the semiconductor chip.

Different points from the above-described first embodiment are that the buried insulating films 3 and the insulating films 6 defining the active regions are formed of a multilayer film including a nitride film and that the n-type source layer 8 is composed only of the n⁺-type source layer 8a without forming the sidewalls SW on the lateral walls of the gate electrodes 11. More specifically, in the above-described first embodiment, the buried insulating films 3 and the insulating films 6 are composed of the oxide film of the same layer. On the other hand, in the present third embodiment, the thin-film portion corresponding to the above-described buried insulating film 3 is composed of a laminated film of an oxide film and a nitride film deposited thereon, and the thick-film portion corresponding to the above-described insulating film 6 is composed of the laminated film with the oxide film deposited further on the laminated film.

Specifically, a buried insulating film 39 is composed of the laminated film of a silicon oxide film 36 and a silicon nitride film 37, and the insulating film that defines the active regions is formed of the laminated film of the silicon oxide film 36, the silicon nitride film 37, and a silicon oxide film 38. When the buried insulating film 39 and the insulating film defining the active regions are composed of the multilayer film including the nitride film, penetration of the openings 15 can be reliably prevented by the nitride film. The mode that the n-type source layer 8 is composed only of the n⁺-type source layer 8a without forming the sidewalls SW on the side surfaces of gate electrodes 11 is similar to the above-described second embodiment; therefore, the explanation thereof is omitted herein.

<<Method of Manufacturing the Semiconductor Device>>

The method of manufacturing the semiconductor device including the IGBT according to the third embodiment of the present invention will be explained in the order of steps with reference to FIGS. 34 to 54. FIGS. 34 to 54 are cross-sectional views of main parts showing the active portion and the peripheral portion of the semiconductor chip.

The manufacturing steps of the IGBT according to the present third embodiment are similar up to the steps explained with reference to FIGS. 3 to 5 among the manufacturing steps of the IGBT explained in the above-described first embodiment; therefore, the explanation thereof is omitted.

Figure 34:
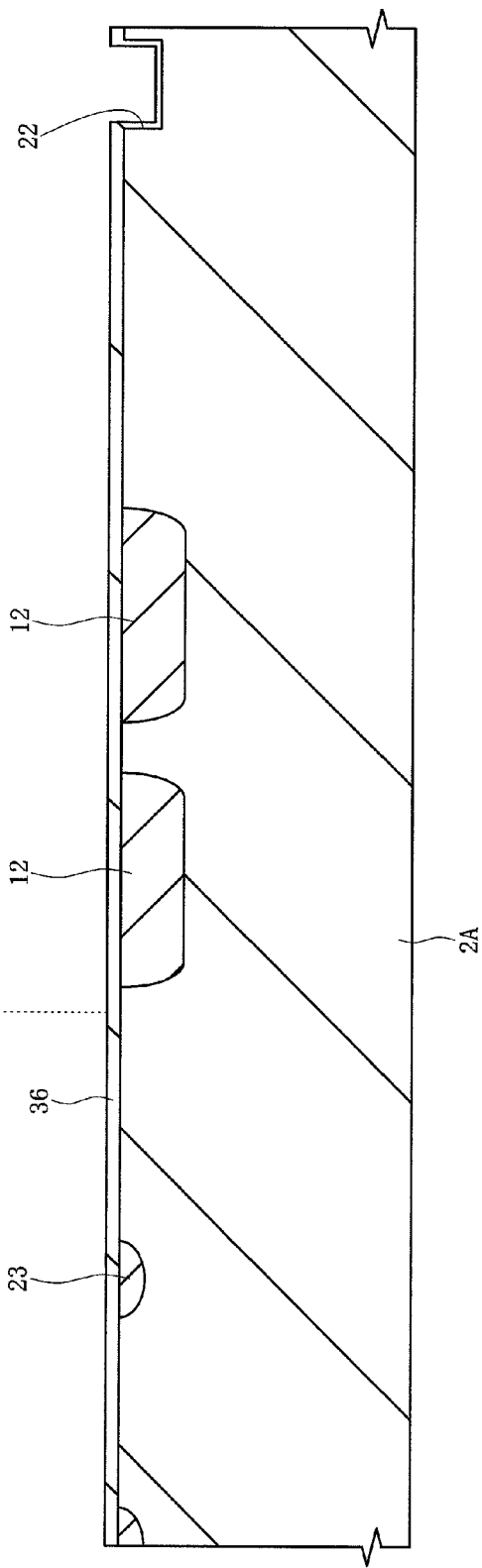
FIG. 34 is a cross-sectional view of main part showing a manufacturing step of the semiconductor device including the IGBTs according to the third embodiment of the present invention.

Subsequent to the step explained with reference to above-described FIG. 5, as shown in FIG. 34, the silicon oxide film 36 is formed on the main surface (surface) of the substrate 2A by subjecting the substrate 2A to thermal oxidation treatment. The thickness of the silicon oxide film 36 is, for example, 100 to 300 nm.

Figure 35:
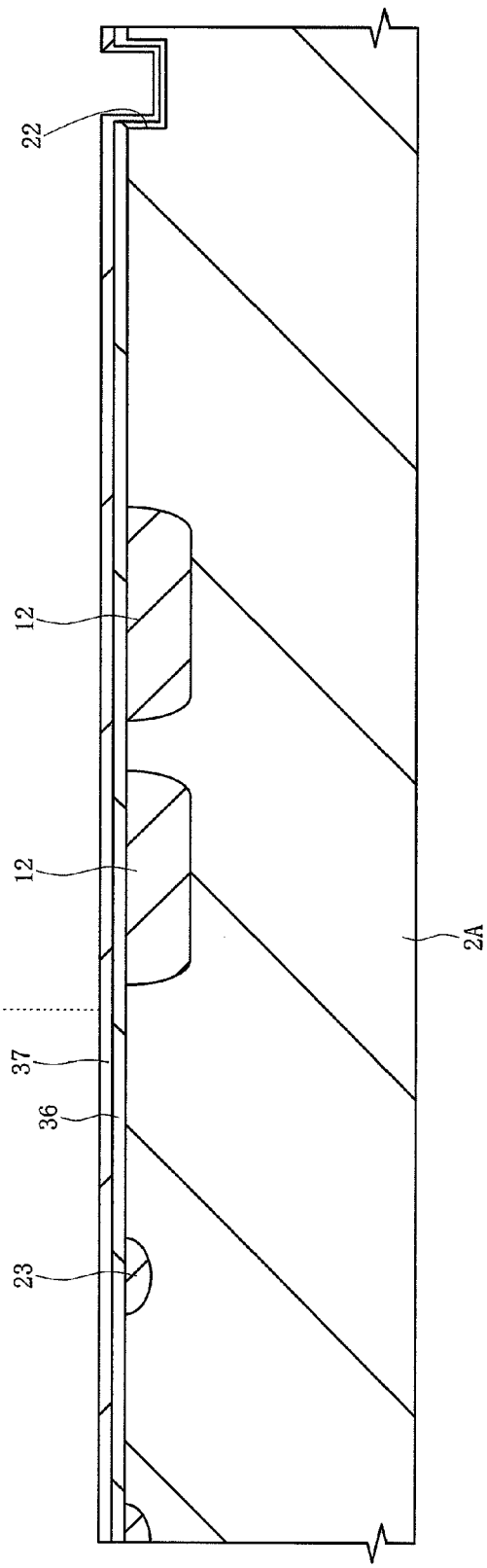
FIG. 35 is a cross-sectional view of main part during the manufacturing step of the semiconductor device continued from FIG. 34.

Then, as shown in FIG. 35, the silicon nitride film 37 is deposited on the surface oxide film 36 by CVD. The thickness of the silicon nitride film 37 is, for example, 10 to 50 nm.

Figure 36:
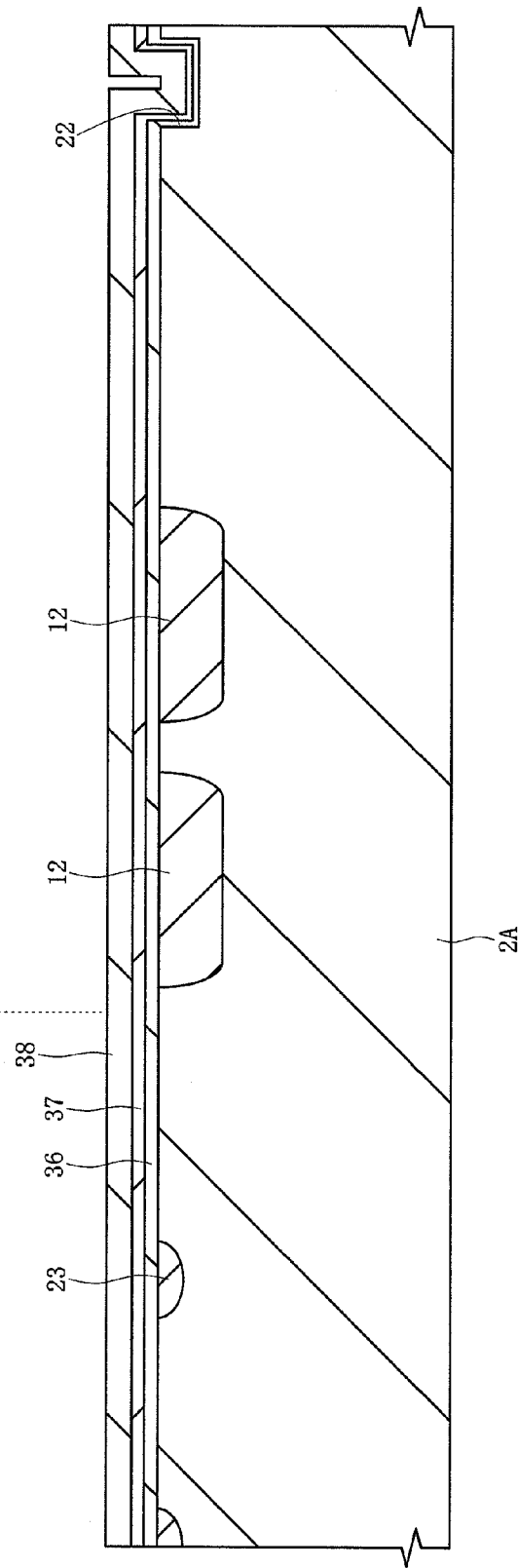
FIG. 36 is a cross-sectional view of main part during the manufacturing step of the semiconductor device continued from FIG. 35.

Then, as shown in FIG. 36, the silicon oxide film 38 is formed on the silicon nitride film 37 by CVD. The thickness of the silicon oxide film 38 is, for example, 200 to 500 nm. At this point, not all of the interior of the groove 22 provided in the peripheral portion is buried with the silicon oxide film 36, the silicon nitride film 37, and the silicon oxide film 38.

Figure 37:
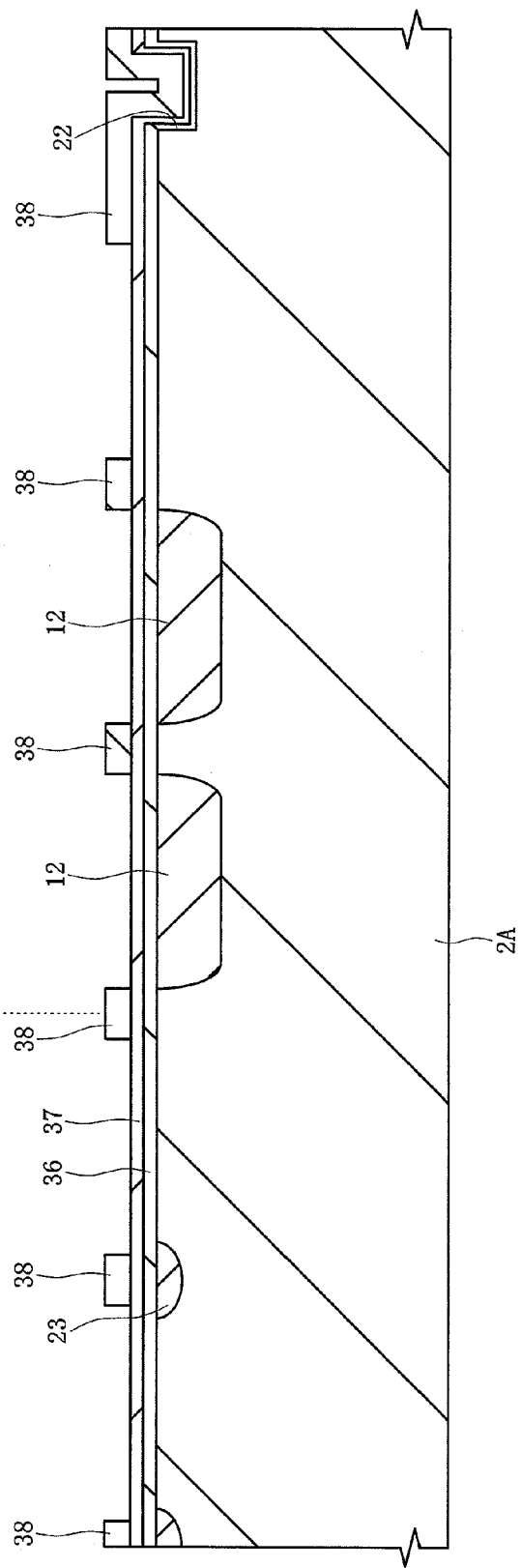
FIG. 37 is a cross-sectional view of main part during the manufacturing step of the semiconductor device continued from FIG. 36.

Then, as shown in FIG. 37, the silicon oxide film 38 in the regions which are to serve as the active regions (for example, the regions in which source regions, channel regions, and emitter regions (back gate regions) are to be formed) are etched by dry etching using a photo resist film, which has been patterned by photolithography technique, as a mask. As a result, the active regions are defined on the main surface of the substrate 2A by the silicon oxide film 38 which has not been etched. In the present third embodiment, as well as the above-described first embodiment, the region in which the thick-film portion in which the silicon oxide film 38 is formed (the laminated film composed of the silicon oxide film 36, the silicon nitride film 37, and the silicon oxide film 38) is formed and the region in which the thin-film portion from which the silicon oxide film 38 has been removed (the laminated film composed of the silicon oxide film 36 and the silicon nitride film 37) is formed are arranged alternately like stripes. Furthermore, the thin-film portions from which the silicon oxide film 38 has been removed (the laminated film composed of the silicon oxide film 36 and the silicon nitride film 37) are formed also above the p-type field limiting rings 12 and the region in which the n-type guard ring 13 is to be formed in the peripheral portion.

Figure 38:
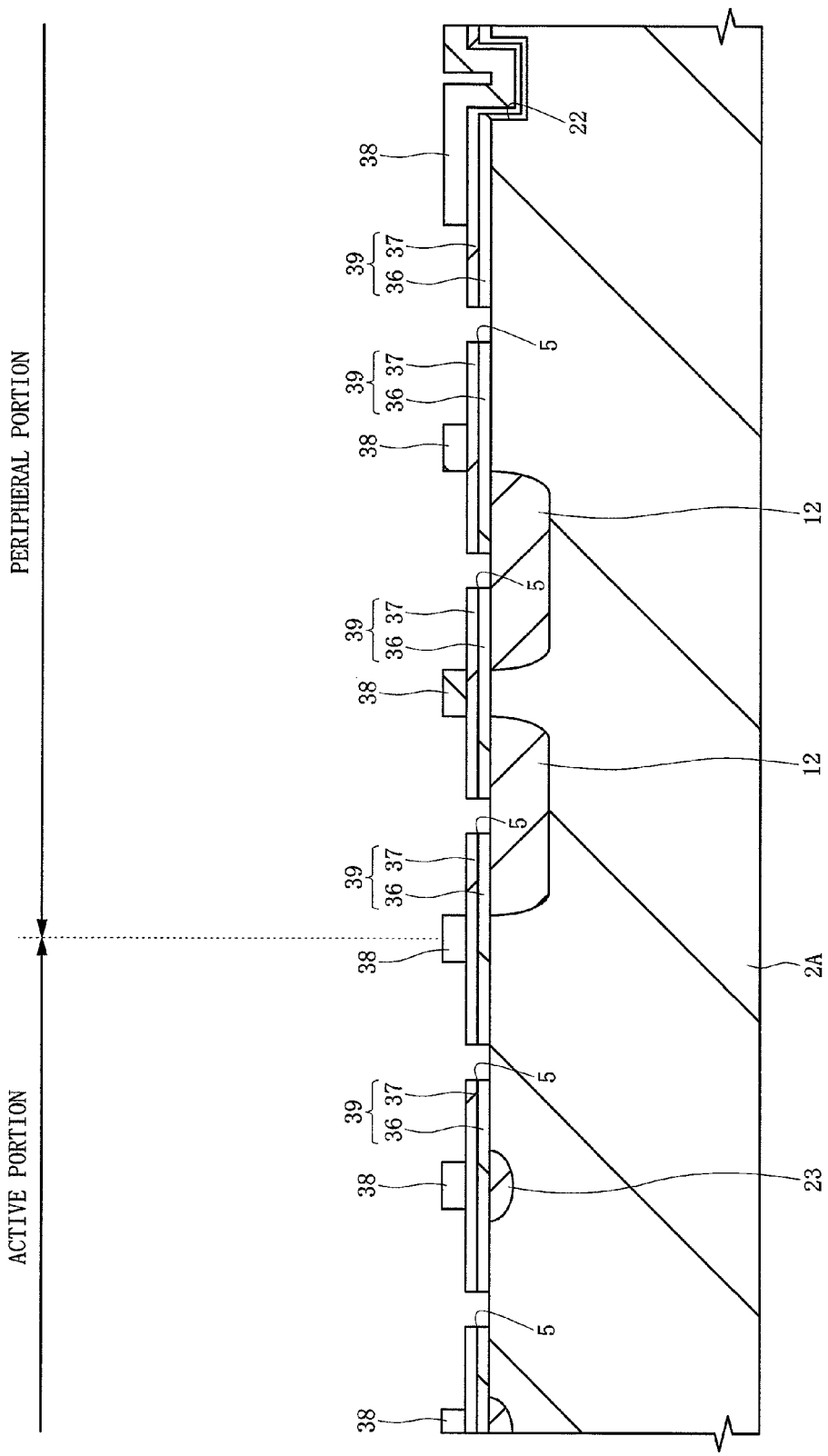
FIG. 38 is a cross-sectional view of main part during the manufacturing step of the semiconductor device continued from FIG. 37.

Then, as shown in FIG. 38, the openings (spacing portions) 5 are formed by etching part of the thin-film portions from which the silicon oxide film 38 has been removed (the laminated film composed of the silicon oxide film 36 and the silicon nitride film 37) while using a photo resist film, which has been patterned by photolithography technique, as a mask. As a result, the buried insulating film 39 which has the opening 5 and is composed of the laminated film of the silicon oxide film 36 and the silicon nitride film 37 can be formed. At this point, the surface of the substrate 2A is exposed from the bottom surfaces of the openings 5.

Figure 39:
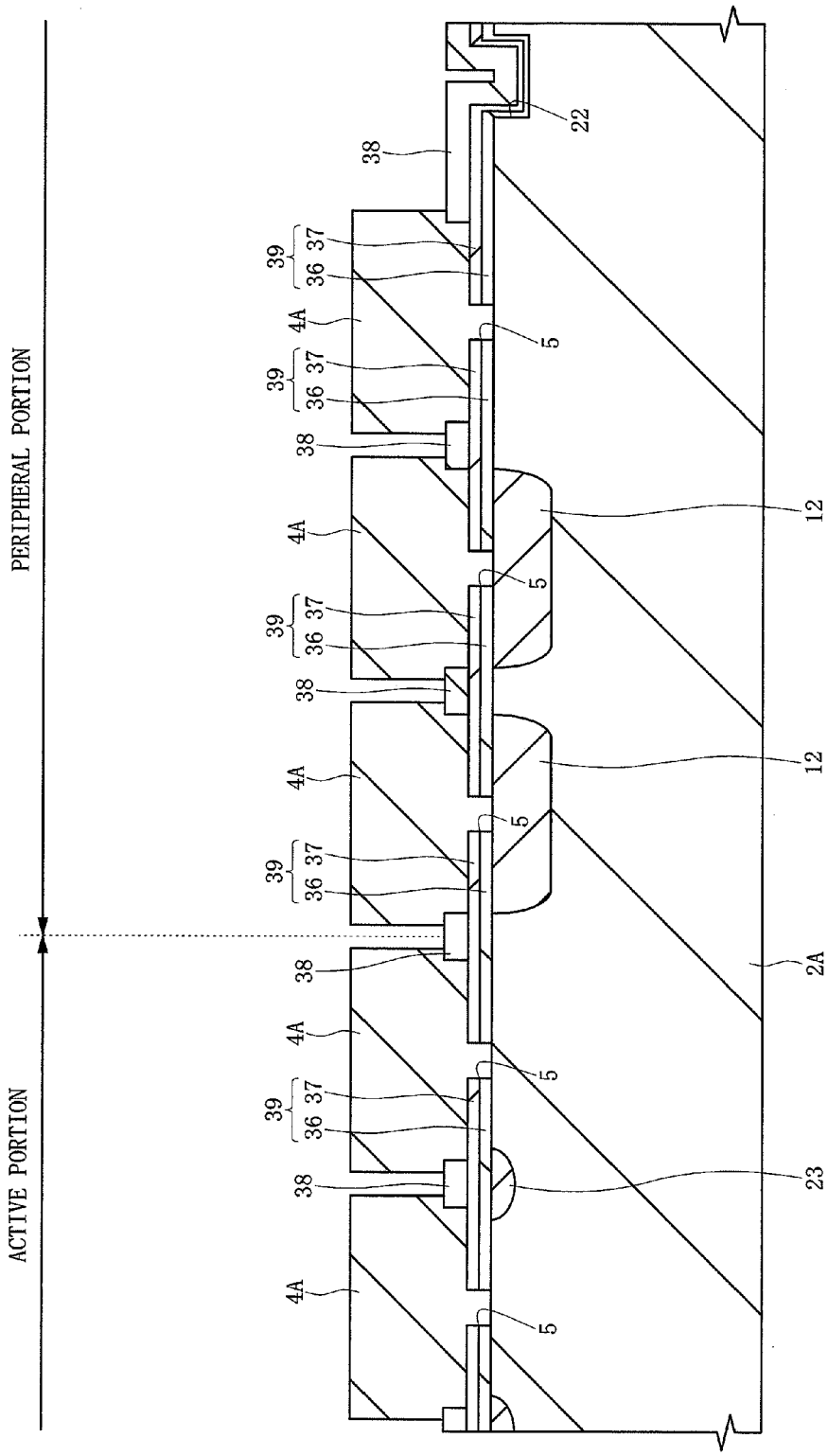
FIG. 39 is a cross-sectional view of main part during the manufacturing step of the semiconductor device continued from FIG. 28.

Then, as shown in FIG. 39, the n⁻-type single-crystal silicon film 4A having a specific resistance substantially same as that of the substrate 2A is epitaxially formed so that silicon crystals are continued in a lattice level from the openings 5 of the buried insulating films 39.

Figure 40:
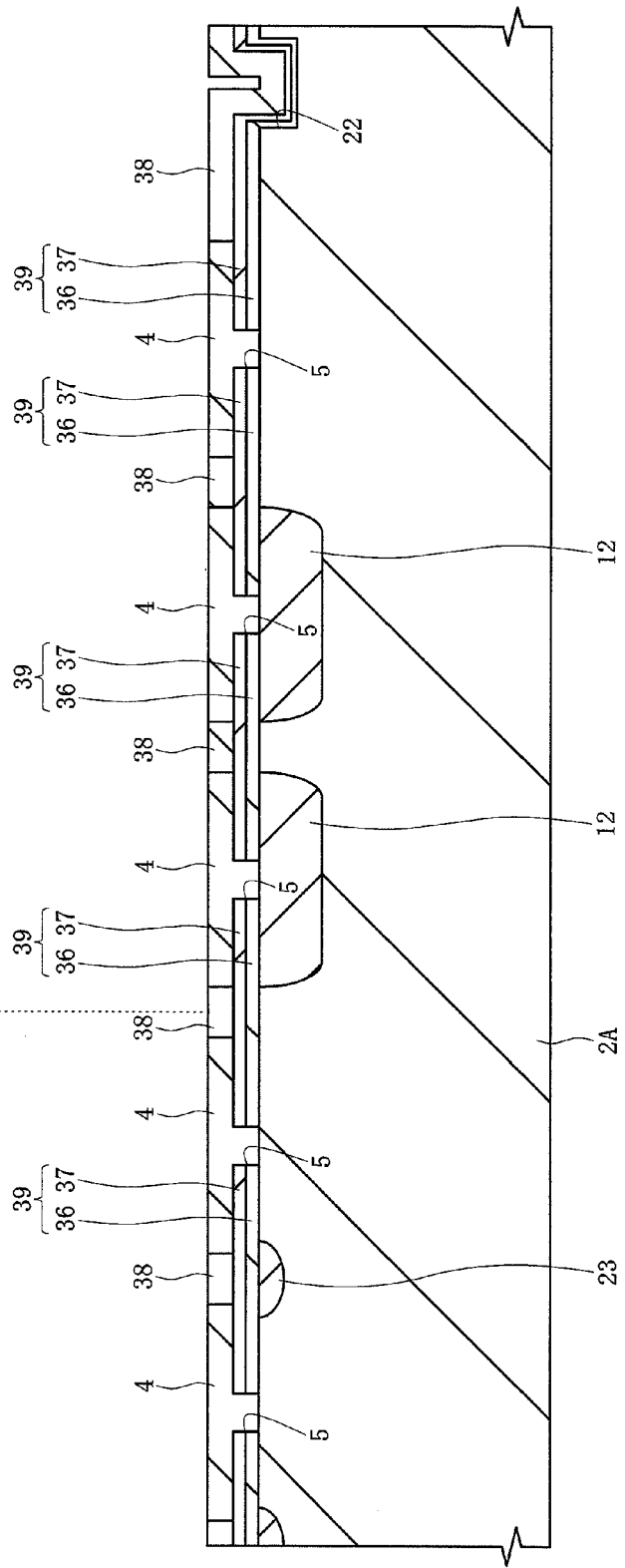
FIG. 40 is a cross-sectional view of main part during the manufacturing step of the semiconductor device continued from FIG. 39.

Then, as shown in FIG. 40, the n⁻-type single-crystal silicon film 4A is polished by CMP using, as a stopper (polishing end point), the thick-film portions in which the silicon oxide film 38 is formed (the laminated film composed of the silicon oxide film 36, the silicon nitride film 37, and the silicon oxide film 38). As a result, the surface semiconductor layers 4 of which the thickness is defined by the level difference between the thick-film portions in which the silicon oxide film 38 is formed (the laminated film composed of the silicon oxide film 36, the silicon nitride film 37, and the silicon oxide film 38) and the thin-film portions (buried insulating films 39) are formed.

Figure 41:
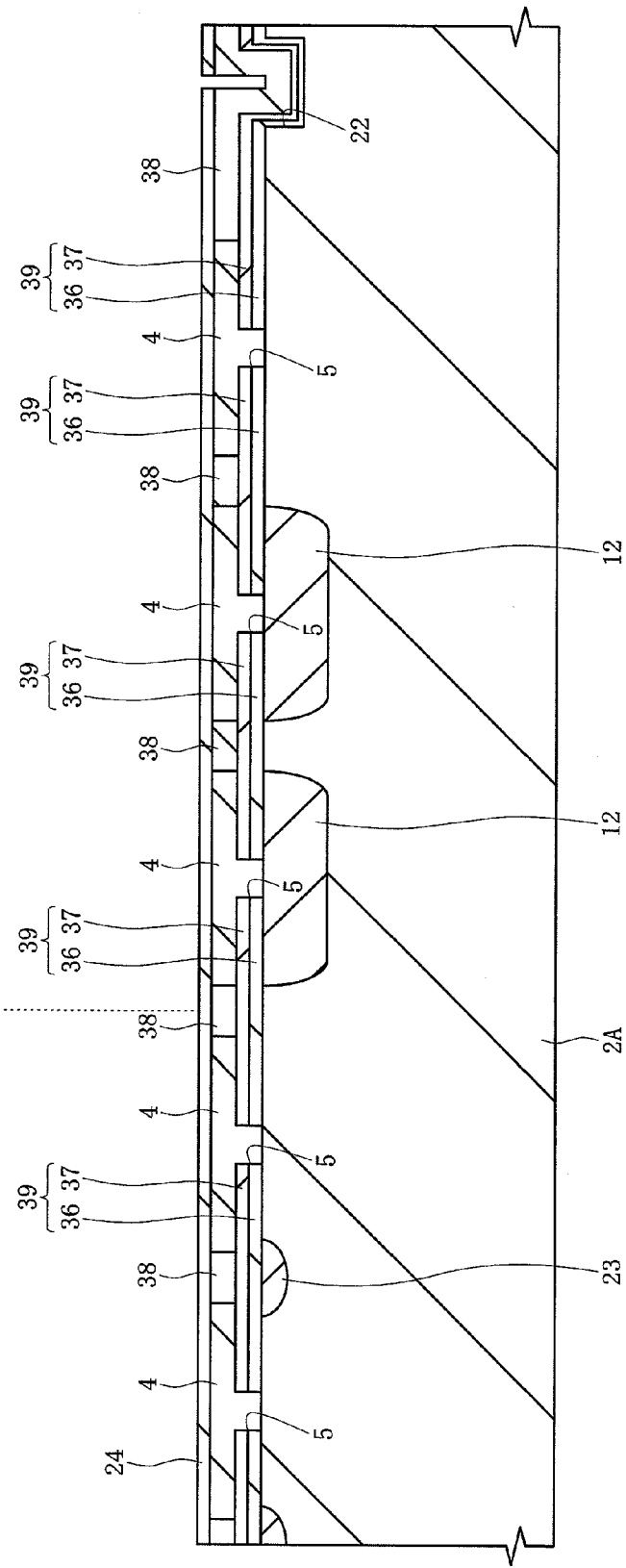
FIG. 41 is a cross-sectional view of main part during the manufacturing step of the semiconductor device continued from FIG. 40.

Then, as shown in FIG. 41, the sacrifice oxide film 24 is formed on the surface of the surface semiconductor layers 4 by subjecting the substrate 2A to thermal oxidation treatment.

Figure 42:
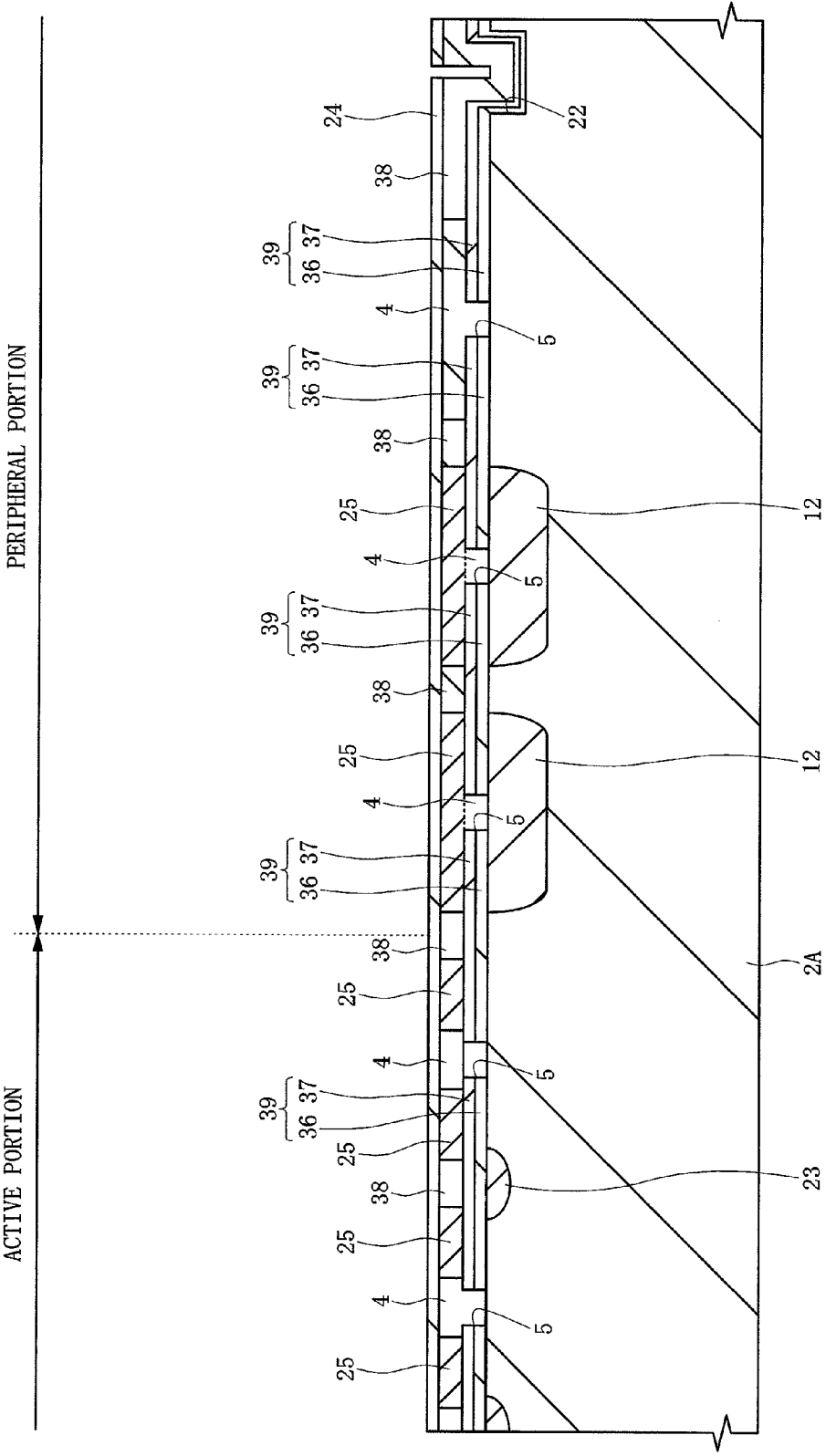
FIG. 42 is a cross-sectional view of main part during the manufacturing step of the semiconductor device continued from FIG. 41.

Then, as shown in FIG. 42, the p-type semiconductor layers are formed by introducing a impurity exhibiting p-type conductivity type (for example, B (boron)) into part of the regions of the surface semiconductor layers 4 of the active portion (the regions which are to serve as the channels below the gate electrodes 11 to be formed in a later step and both sides thereof) by ion implantation while using a photo resist film, which has been patterned by photolithography techniques, as a mask. At the same time, the p-type semiconductor layers 25 are formed by introducing a impurity exhibiting p-type conductivity type (for example, B (boron)) also into the surface semiconductor layers 4 above the p-type field limiting rings 12 of the peripheral portion by ion implantation.

Figure 43:
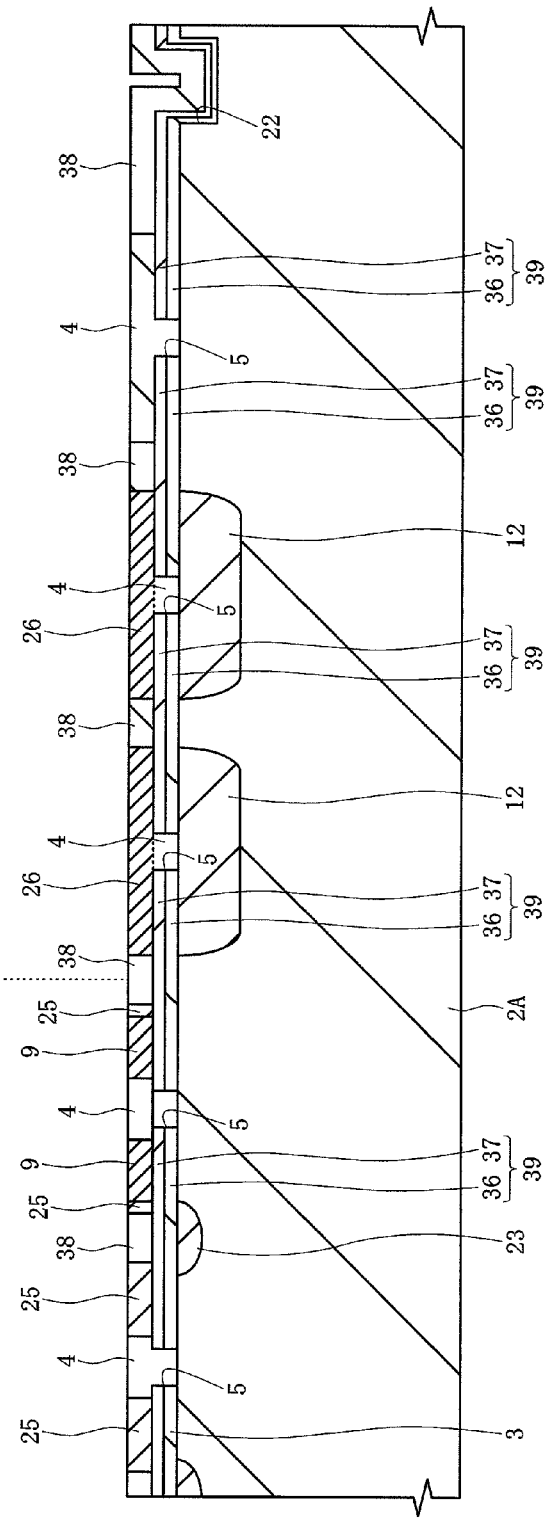
FIG. 43 is a cross-sectional view of main part during the manufacturing step of the semiconductor device continued from FIG. 42.

Then, as shown in FIG. 43, the $p^+$-type emitter layers (p-type back gate layers) 9 are formed by introducing a impurity exhibiting p-type conductivity type (for example, B (boron)) into part of the regions of the p-type semiconductor layers 25 of the active portion (the regions to serve as emitters (back gates)) by ion implantation while using a photo resist film, which has been patterned by photolithography technique, as a mask. At the same time, the $p^+$-type semiconductor layers 26 are formed by introducing a impurity exhibiting p-type conductivity type (for example, B (boron)) into the p-type semiconductor layers 25 above the p-type field limiting rings 12 of the peripheral portion by ion implantation. In this process, in some cases, the impurity exhibiting p-type conductivity type is not introduced into the p-type semiconductor layers 25 in the vicinity of the side surface of the silicon oxide film 38 of the active portion, and the $p^+$-type emitter layers 9 are not formed. The remaining p-type semiconductor layers 25 without the introduction of the impurity have the function of reducing the stress that is caused by heat. The present third embodiment shows, as an example, the case in which the above-described p-type semiconductor layers 25 remain.

Figure 44:
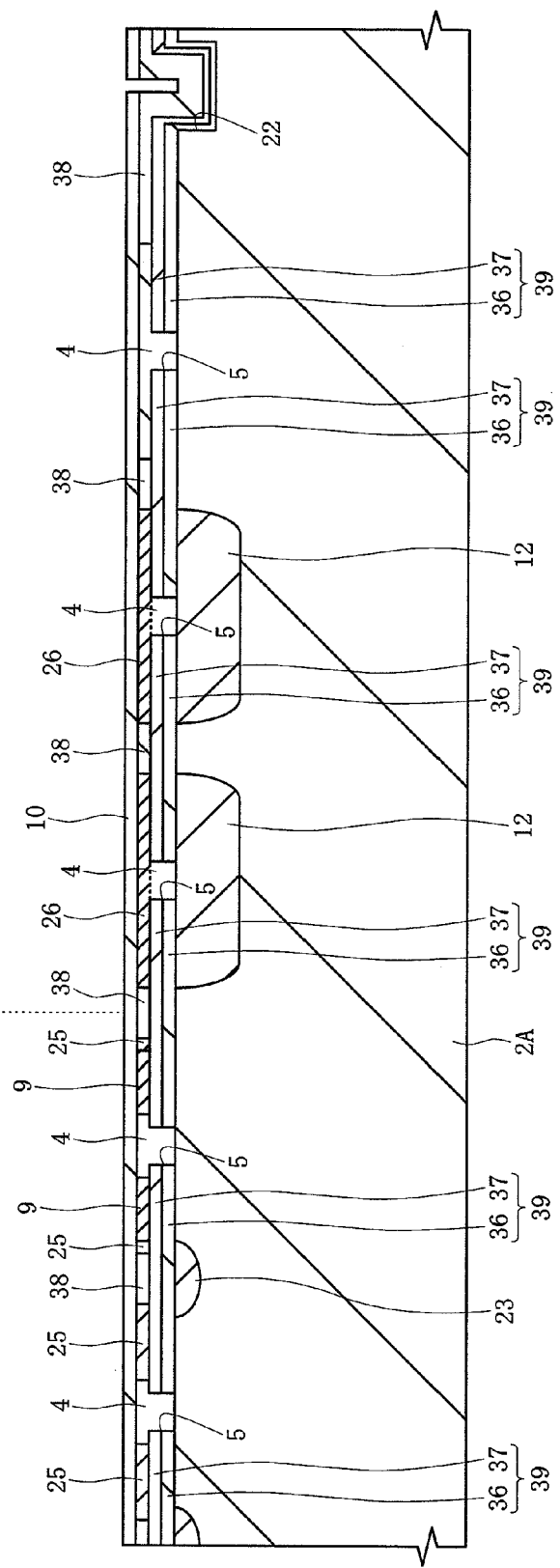
FIG. 44 is a cross-sectional view of main part during the manufacturing step of the semiconductor device continued from FIG. 43.

Then, as shown in FIG. 44, the lower-layer oxide film (illustration omitted) is formed on the surfaces of the surface semiconductor layers 4 (including the p-type semiconductor layers 25 and the $p^+$-type emitter layers 9 of the active portion and the $p^+$-type semiconductor layers 26 of the peripheral portion) by subjecting the substrate 2A to thermal oxidation treatment. Subsequently, the upper-layer oxide film (illustration omitted) is deposited on the lower-layer oxide film by CVD, thereby forming the gate insulating film 10 composed of the lower-layer oxide film and the upper-layer oxide film. The thickness of the lower-layer oxide film is, for example, 10 nm, and the thickness of the upper-layer oxide film is, for example, 90 nm.

Figure 45:
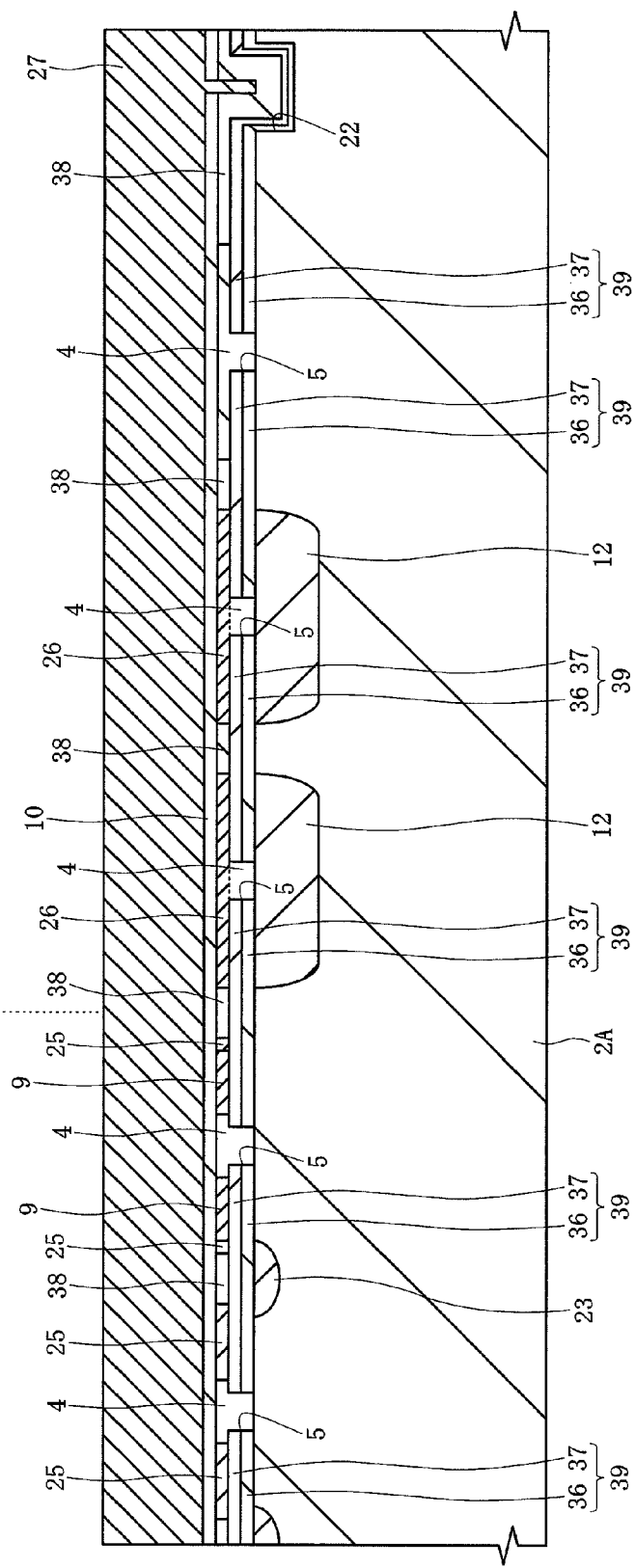
FIG. 45 is a cross-sectional view of main part during the manufacturing step of the semiconductor device continued from FIG. 44.

Then, as shown in FIG. 45, the polycrystalline silicon film 27 is deposited on the main surface of the substrate 2A.

Figure 46:
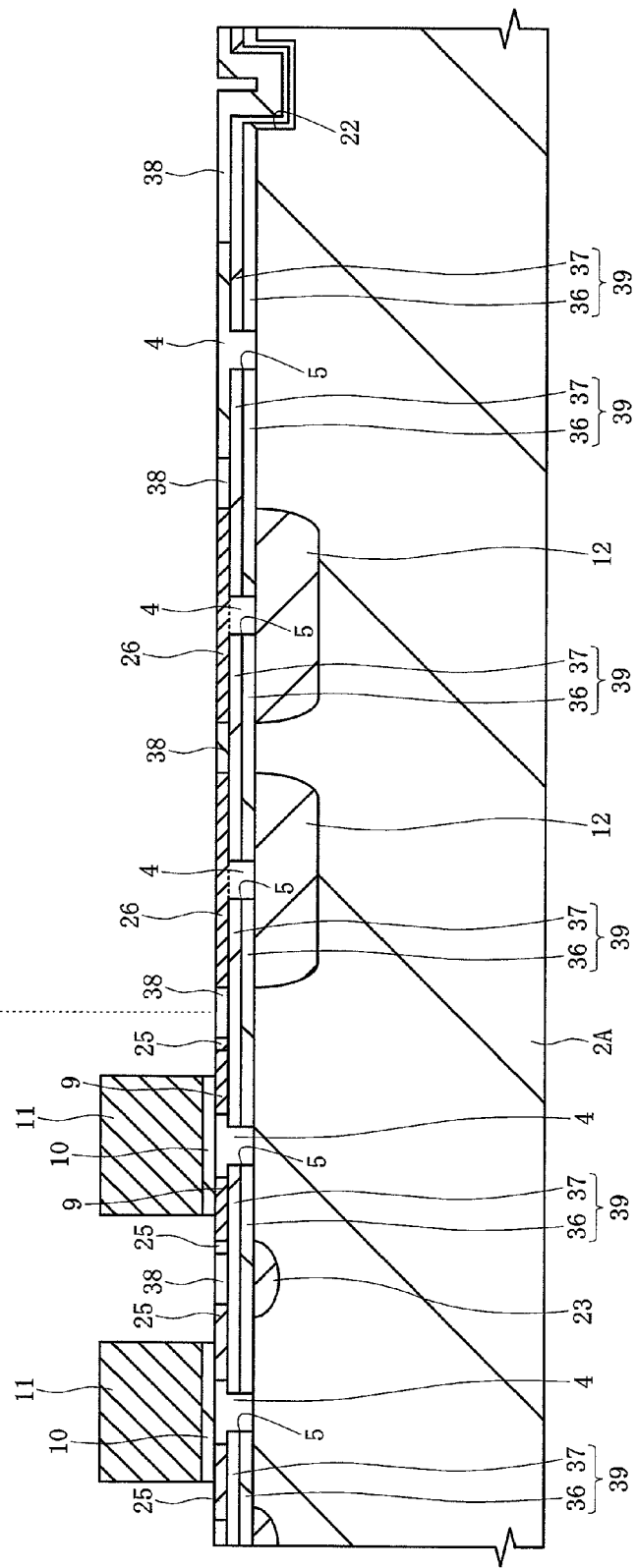
FIG. 46 is a cross-sectional view of main part during the manufacturing step of the semiconductor device continued from FIG. 45.

Then, as shown in FIG. 46, the polycrystalline silicon film 27 is subjected to patterning by etching using a photo resist film, which has been patterned by photolithography technique, as a mask. As a result, the gate electrodes 11 composed of the polycrystalline silicon film 27 can be formed.

Figure 47:
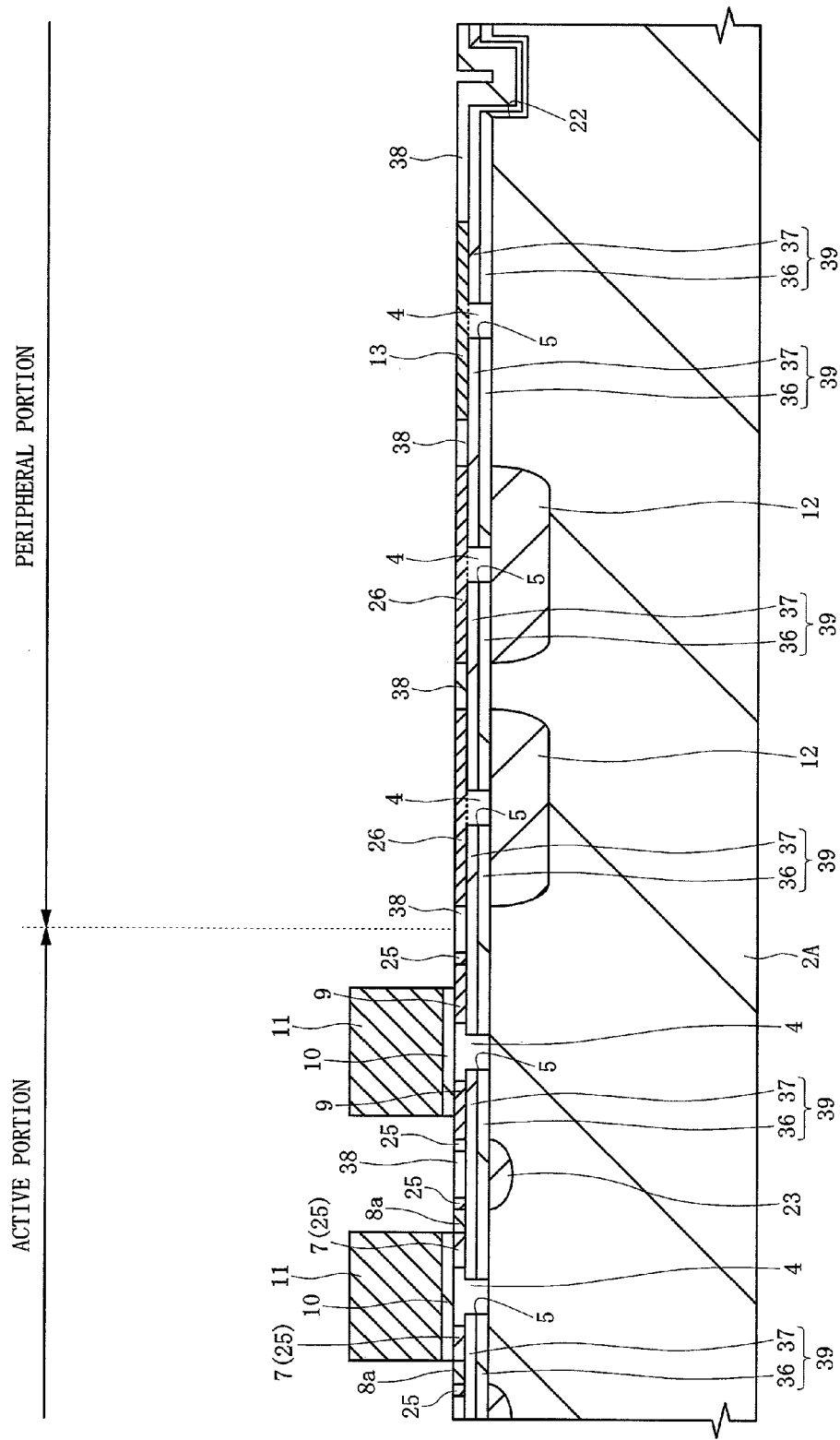
FIG. 47 is a cross-sectional view of main part during the manufacturing step of the semiconductor device continued from FIG. 46.

Then, as shown in FIG. 47, the $n^+$-type source layers 8a are formed by introducing an impurity exhibiting n-type conductivity type (for example, As (arsenic)) into the p-type semiconductor layers 25 in both sides of the gate electrodes 11 of the active portion by ion implantation while using a photo resist film, which has been patterned by photo lithography techniques, as a mask. At the same time, the n-type guard ring (channel stopper) 13 is formed by introducing an impurity exhibiting n-type conductivity type (for example, As (arsenic)) into the surface semiconductor layer 4 of the peripheral portion.

In some cases, the above-described impurity exhibiting n-type conductivity type is not introduced into the p-type semiconductor layers 25 in the vicinity of the side surfaces of the silicon oxide film 38 of the active portion, and the $n^+$-type source layers 8a are not formed. The remaining p-type semiconductor layers 25 without the introduction of the impurity has the function of reducing the stress generated by heat. The present third embodiment shows, an example, the case in which the above-described p-type semiconductor layers 25 remain. The p-type semiconductor layers 25 below the gate electrodes 11 in which the $n^+$-type source layers 8a are not formed constitute the p-type channel layers 7.

The elements of the IGBT according to the present third embodiment can be formed by the steps described above.

Figure 48:
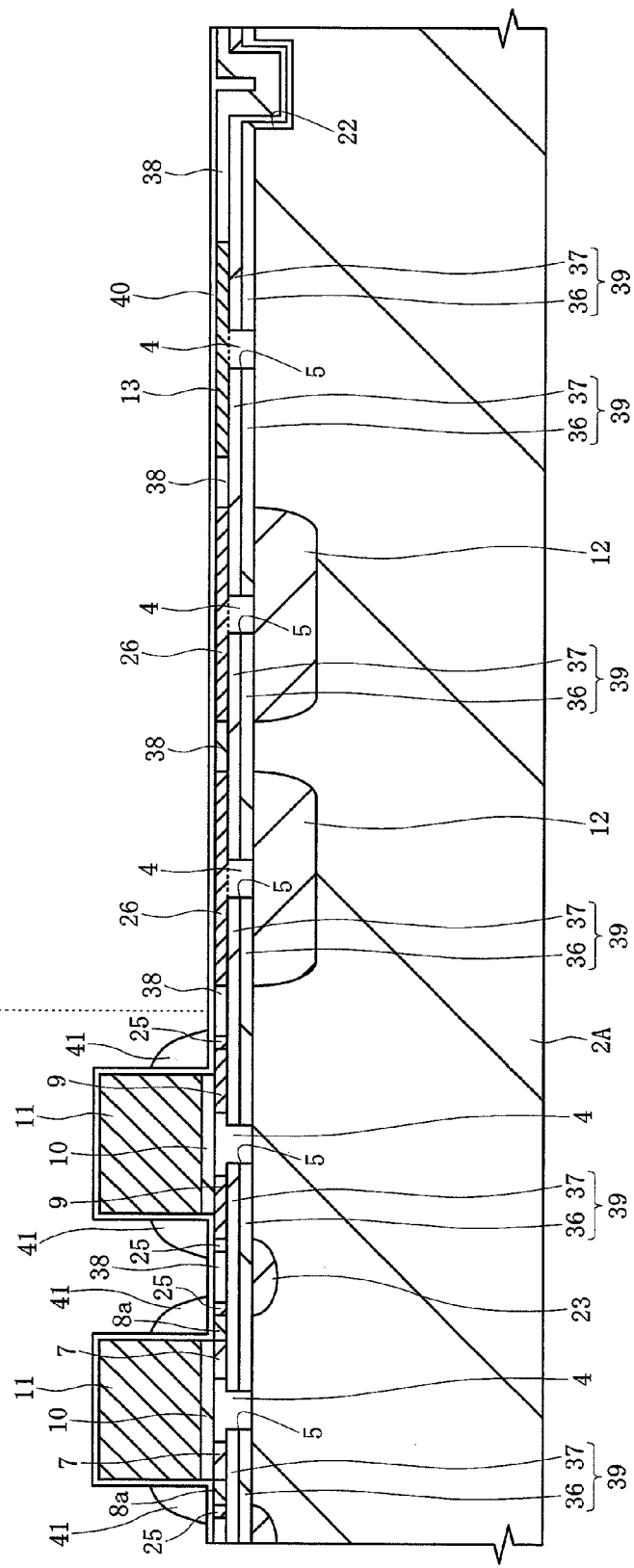
FIG. 48 is a cross-sectional view of main part during the manufacturing step of the semiconductor device continued from FIG. 47.

Then, as shown in FIG. 48, a silicon oxide film 40 is formed on the upper surfaces and side surfaces of the p-type semiconductor layers 25, the $n^+$-type source layers 8a, the $p^+$-type emitter layers 9, and the gate electrodes 11 of the exposed active portion and on the surfaces of the $p^+$-type semiconductor layers 26 and the $n^+$-type guard ring 13 of the peripheral portion by subjecting the substrate 2A to thermal oxidation treatment. The thickness of the silicon oxide film 40 is, for example, 10 to 30 nm. Subsequently, after a silicon oxide film is deposited on the main surface of the substrate 2A by CVD, the silicon oxide film is processed by anisotropic dry etching, thereby forming spacers 41 on the side surfaces of the gate electrodes 11.

Figure 49:
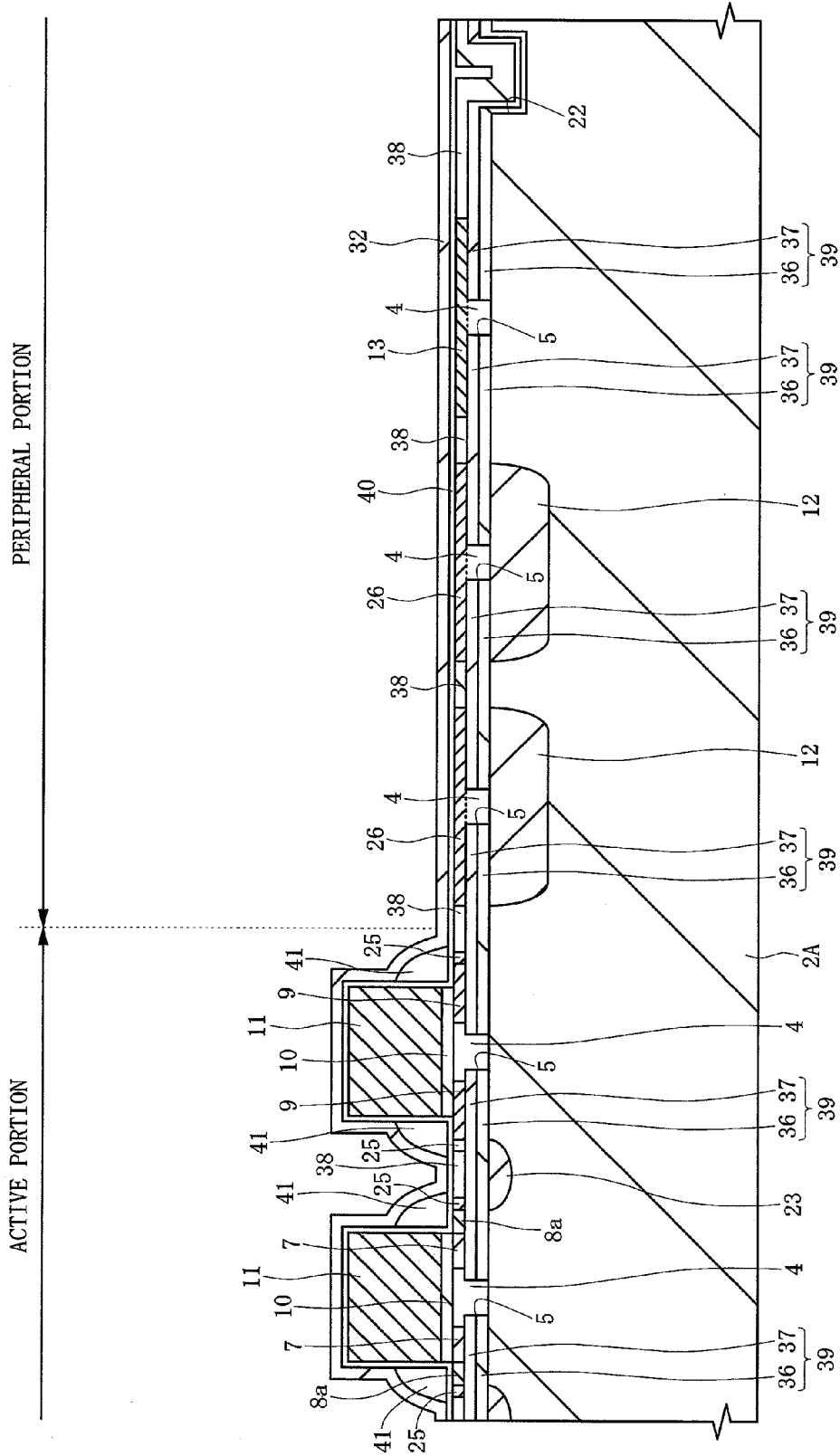
FIG. 49 is a cross-sectional view of main part during the manufacturing step of the semiconductor device continued from FIG. 48.

Then, as shown in FIG. 49, a silicon nitride film 32 is deposited on the main surface of the substrate 2A. The thickness of the silicon nitride film 32 is, for example, 10 to 50 nm.

Figure 50:
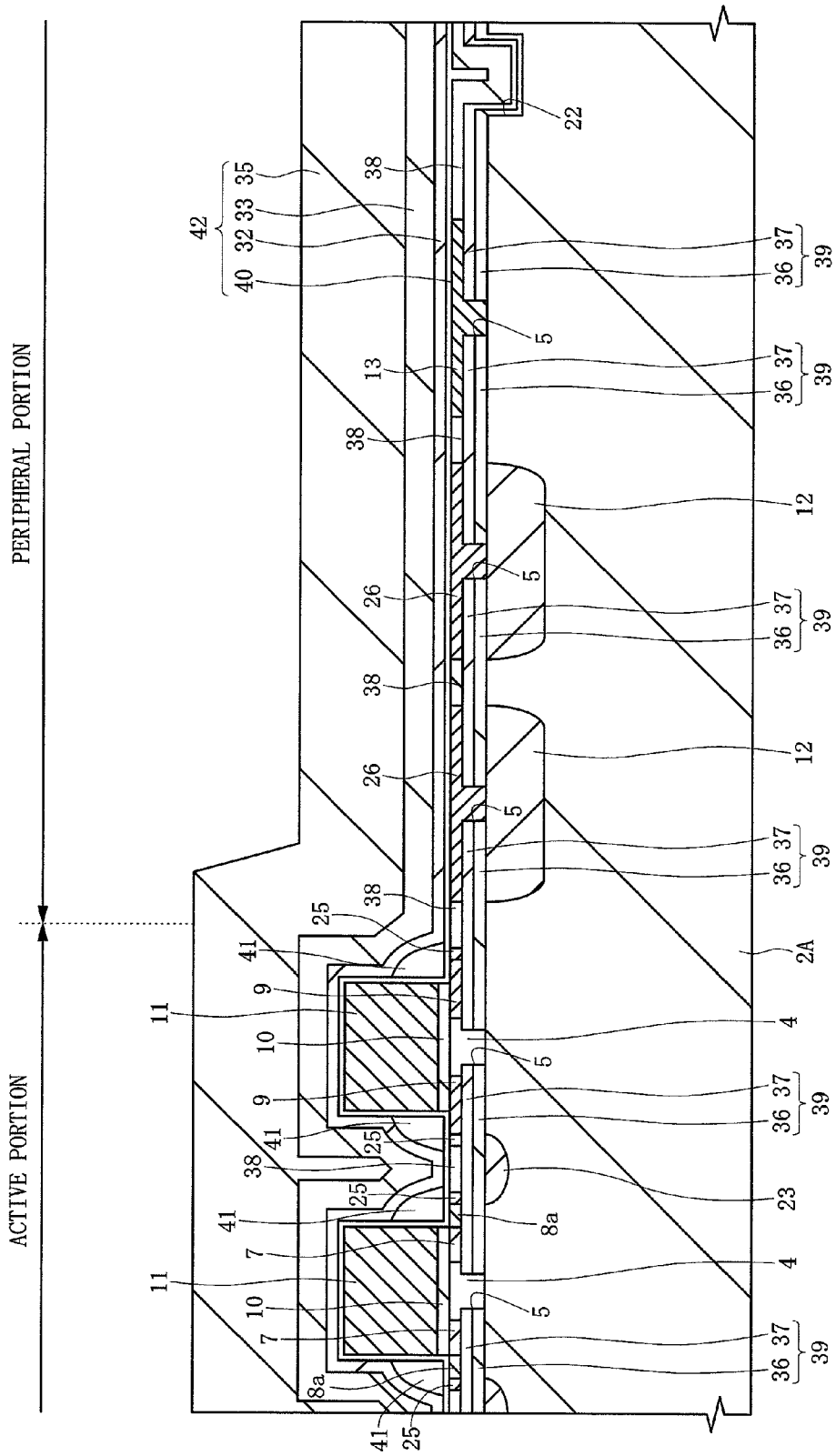
FIG. 50 is a cross-sectional view of main part during the manufacturing step of the semiconductor device continued from FIG. 49.

Then, as shown in FIG. 50, the silicon oxide film 33 and the laminated insulating film 35 of the PSG film and the SOG film are sequentially deposited on the main surface of the substrate 2A. As a result, the interlayer insulating film 42 composed of the silicon oxide film 40, the silicon nitride film 32, the silicon oxide film 33, and the laminated insulating film 35 of the PSG film and the SOG film is formed. The thickness of the silicon oxide film 33 is, for example, 100 to 300 nm, and the thickness of the laminated insulating film 35 of the PSG film and the SOG film is, for example, 200 to 500 nm. Instead of the laminated insulating film 35 of the PSG film and the SOG film, a laminated insulating film of a BPSG film, a PSG film, and a BPSG film or a laminated insulating film of a BPSG film and a SOG film may be formed. Then, the above-described SOG film is baked by subjecting the substrate 2A to thermal treatment.

Figure 51:
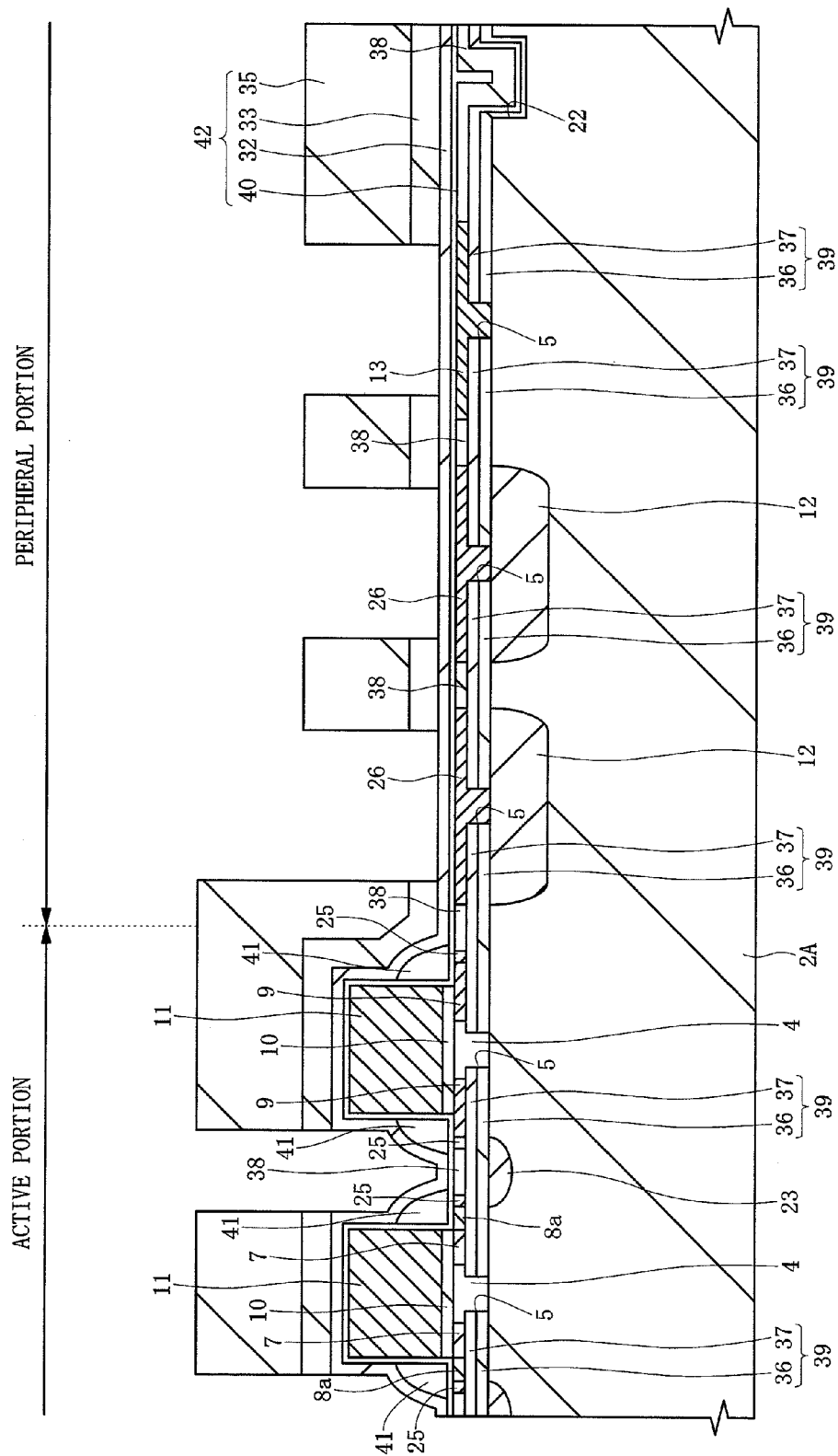
FIG. 51 is a cross-sectional view of main part during the manufacturing step of the semiconductor device continued from FIG. 50.
Figure 52:
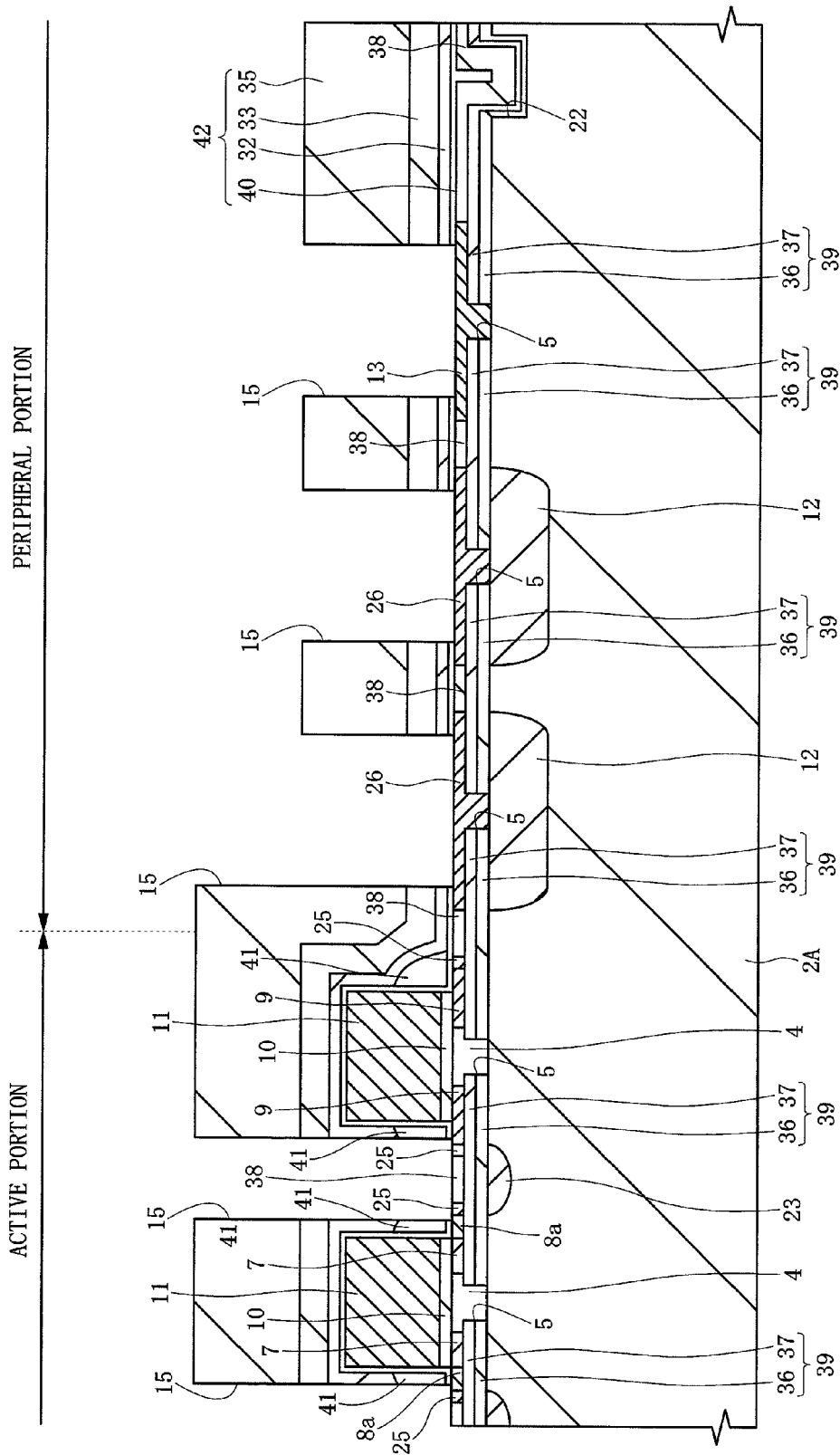
FIG. 52 is a cross-sectional view of main part during the manufacturing step of the semiconductor device continued from FIG. 51.

Then, as shown in FIGS. 51 and 52, the openings 15 which reach the $n^+$-type source layers 8a, the $p^+$-type emitter layers 9, the p-type semiconductor layers 25, the gate electrodes 11, the $p^+$-type semiconductor layers 26, and the n-type guard ring 13 are formed by etching the interlayer insulating film 42 while using a photo resist film, which has been patterned by photolithography techniques, as a mask.

Upon formation of the openings 15, first, the laminated insulating film 35 of the PSG film and the SOG film and the silicon oxide film 33 are sequentially etched while using the silicon nitride film 32 as an etching stopper (FIG. 51). Subsequently, the silicon nitride film 32 is etched while using the silicon oxide film 40 and the spacers 41 as etching stoppers. In this process, even if the silicon nitride film 32 is over-etched, etching does not easily advance to the $n^+$-type source layers 8a, the p+-type emitter layers 9, and the p-type semiconductor layers 25 since the spacers 41 are formed on the side surfaces of the gate electrodes 11. Subsequently, the silicon oxide film 40 and the spacers 41 are etched while using, as etching stoppers, the n+-type source layers 8a, the p+-type emitter layers 9, the p-type semiconductor layers 25, the p+-type semiconductor layers 26, and the n-type guard ring 13 composed of single-crystal silicon and the gate electrodes 11 composed of polycrystalline silicon (FIG. 52). In this process, even if the silicon oxide film 40 and the spacers 41 are over-etched, etching is stopped by the silicon nitride film 37 formed therebelow, and the openings 15 do not reach the substrate 2A.

Figure 53:
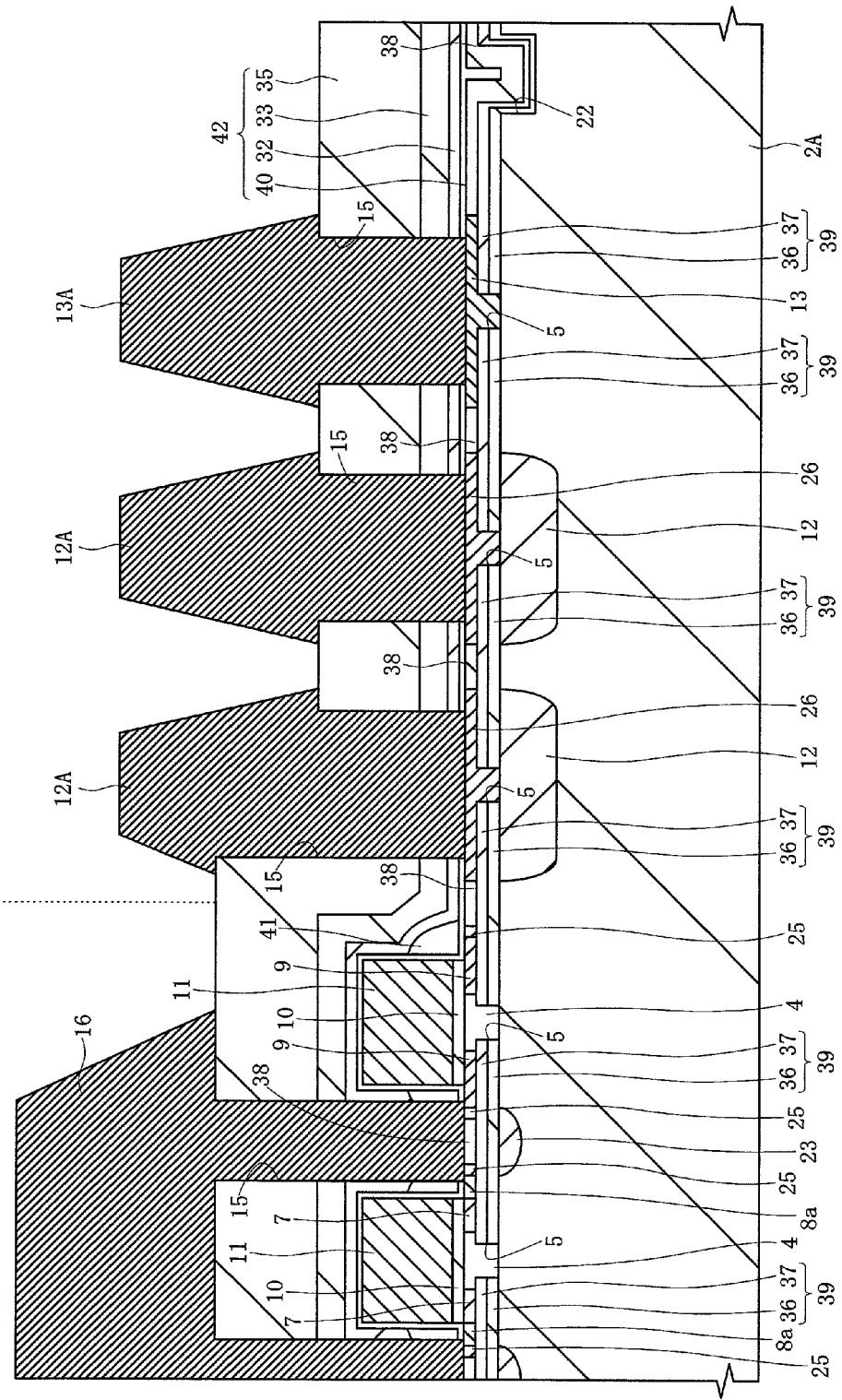
FIG. 53 is a cross-sectional view of main part during the manufacturing step of the semiconductor device continued from FIG. 52.
Figure 54:
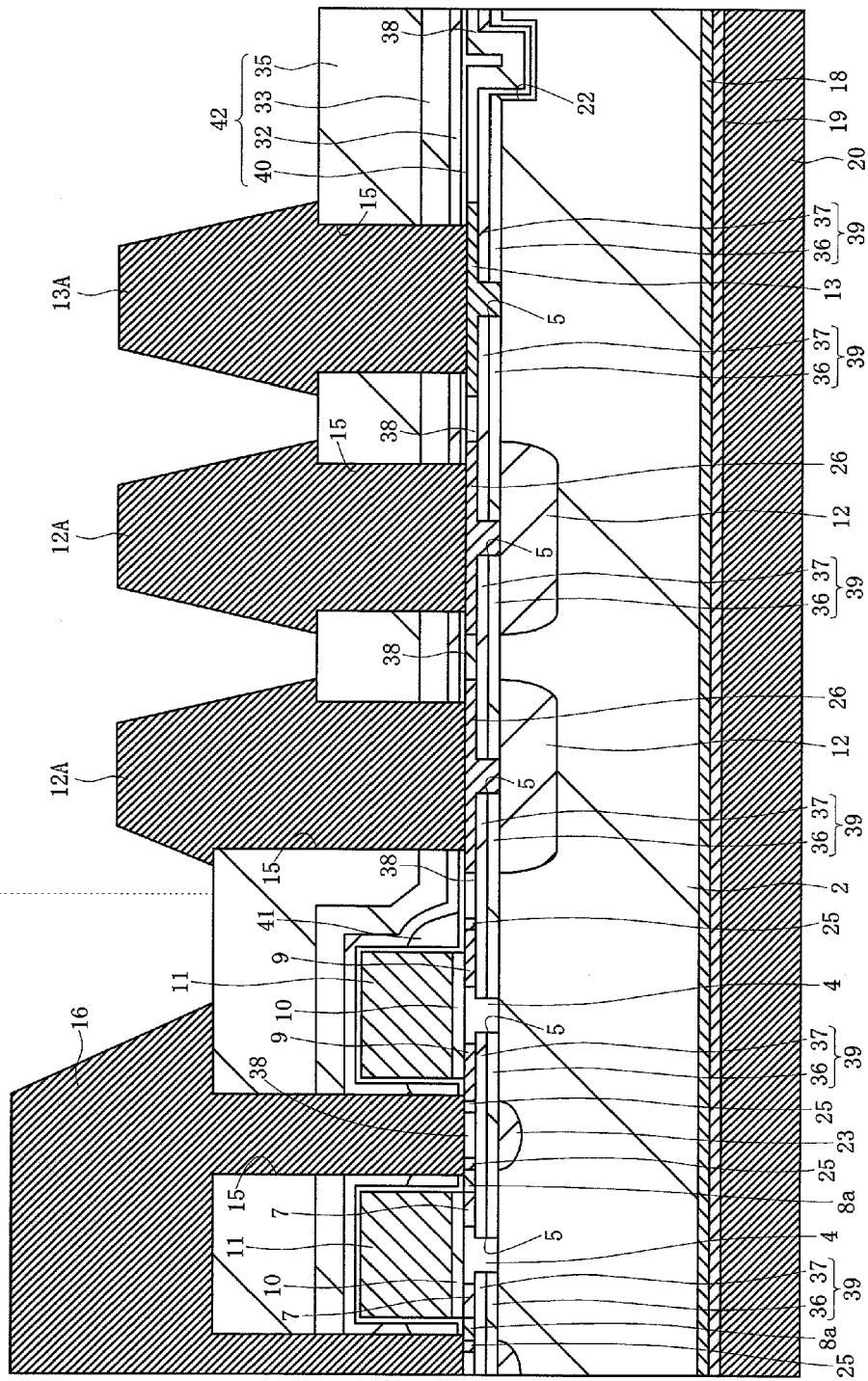
FIG. 54 is a cross-sectional view of main part during the manufacturing step of the semiconductor device continued from FIG. 53.
Figure 55:
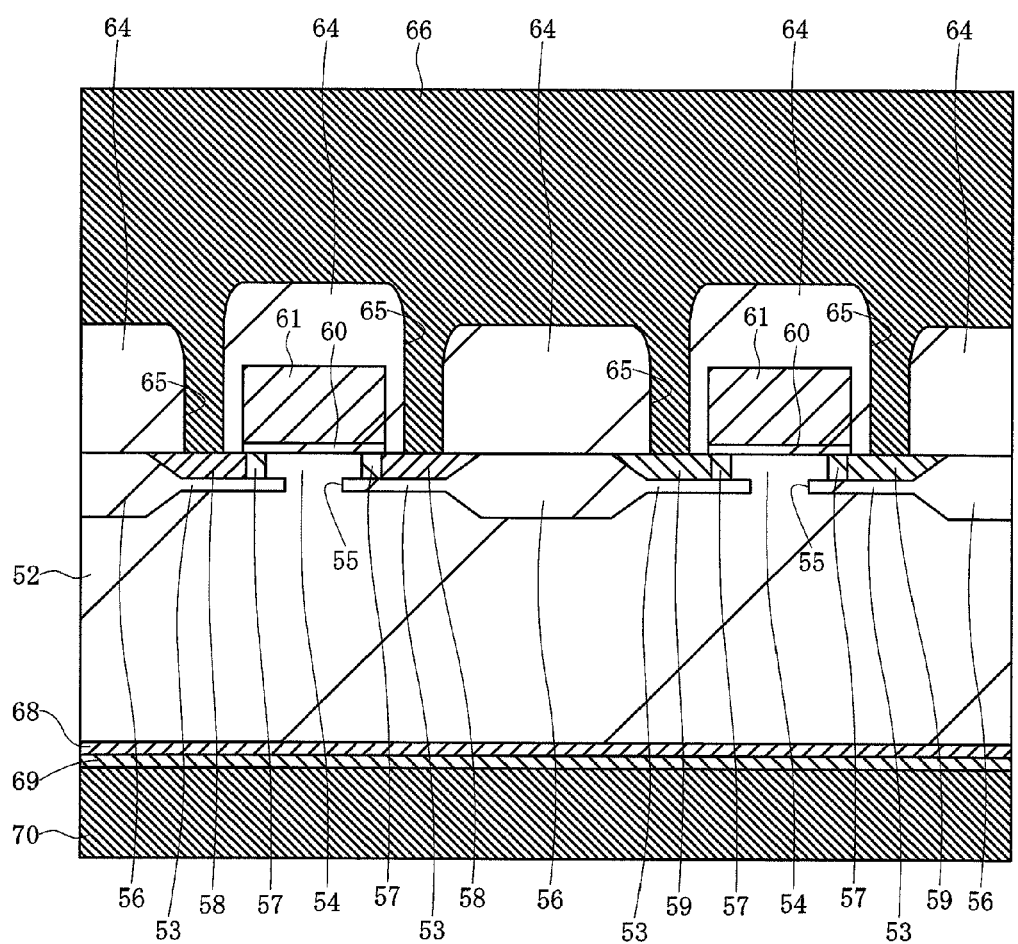
FIG. 55 is a cross-sectional view of main part showing an active portion of a semiconductor chip for forming IGBTs studied by the inventors of the present invention.

Thereafter, as well as the above-described first embodiment, as shown in FIG. 53, the emitter pad (emitter electrode) 16, the field limiting ring electrode 12A, the guard ring electrode 13A, etc. are formed. Furthermore, as shown in FIG. 54, the base layer 2 is formed by grinding the back surface of the substrate 2A. For example, the n-type buffer layer 18, the p-type collector layer 19, and the collector electrode 20 are formed.

In this manner, according to the third embodiment, effects same as those of the first embodiment described above can be surely achieved.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to various inverters such as motor-drive inverters, for example, in railway cars and hybrid cars.

What is claimed is:

1. A method of manufacturing a semiconductor device having an active portion and a peripheral portion outside the active portion and having elements of an IGBT formed in the active portion, the method comprising the steps of:
   (a) preparing a substrate exhibiting n-type conductivity type that is to serve as a base layer of the IGBT;
   (b) forming a first insulating film on a main surface of the substrate, the first insulating film including a plurality of thick-film portions having a first thickness and a thin-film portion having a second thickness smaller than the first thickness;
   (c) forming a spacing portion in the thin-film portion of the first insulating film, the spacing portion reaching the substrate;
   (d) forming a surface semiconductor layer exhibiting n-type conductivity type on the thin-film portion of the first insulating film by burying the spacing portion, the surface semiconductor layer having a thickness of 20 to 100 nm;
   (e) forming a channel layer exhibiting p-type conductivity type of the IGBT in the surface semiconductor layer of the active portion;
   (f) forming an emitter layer exhibiting p-type conductivity type of the IGBT in the surface semiconductor layer of the active portion so that the emitter layer is in contact with the channel layer, the emitter layer having a higher concentration than the channel layer;
   (g) forming a gate insulating film of the IGBT on a surface of the surface semiconductor layer of the active portion;
   (h) forming a gate electrode of the IGBT on the gate insulating film;
   (i) introducing an impurity exhibiting n-type conductivity type into the surface semiconductor layer of the active portion to form a first source layer of the IGBT in the surface semiconductor layer on both sides of the gate electrode;
   (j) forming a sidewall on a side surface of the gate electrode;
   (k) introducing an impurity exhibiting n-type conductivity type into the surface semiconductor layer of the active portion to form a second source layer of the IGBT in the surface semiconductor layer on both sides of the sidewall, the second source layer having a higher concentration than the first source layer;
   (l) forming an interlayer insulating film on the main surface of the substrate, the interlayer insulating film composed of a first oxide film, a nitride film, and a second oxide film;
   (m) etching the second oxide film with using the nitride film as an etching stopper and then sequentially etching the nitride film and the first oxide film to form, in the interlayer insulating film, openings reaching the emitter layer and the second source layer;
   (n) forming an emitter electrode of the IGBT on the emitter layer and the second source layer, the emitter electrode electrically connected to the emitter layer and the second source layer;
   (o) reducing the thickness of the substrate from a back surface to form the base layer of the IGBT;
   (p) forming an buffer layer exhibiting n-type conductivity type of the IGBT on the back surface of the substrate;
   (q) forming a collector layer exhibiting p-type conductivity type of the IGBT on the back surface of the substrate; and
   (r) forming a collector electrode of the IGBT electrically connected to the collector layer.

2. The method of manufacturing the semiconductor device according to claim 1, wherein
   the step (b) further includes the steps of:
   (b1) forming the first insulating film having the first thickness on the main surface of the substrate;
   (b2) forming a resist pattern in a region for forming the thick-film portion; and
   (b3) forming the plurality of thin-film portions having the second thickness in the first insulating film by isotropic wet etching using the resist pattern as a mask.

3. The method of manufacturing the semiconductor device according to claim 1,
   wherein the step (g) further includes the steps of:
   (g1) forming a first oxide film on the surface of the surface semiconductor layer by thermal oxidation; and
   (g2) forming a second oxide film on the first oxide film by CVD; and
   wherein the gate insulating film composed of a laminated film of the first oxide film and the second oxide film is formed.

4. The method of manufacturing the semiconductor device according to claim 1, wherein
   the step (h) further includes the steps of:
   (h1) depositing a polycrystalline silicon film on the main surface of the substrate; and
   (h2) forming a silicide layer on the polycrystalline silicon film,
   wherein the gate electrode composed of a laminated film of the polycrystalline silicon film and the silicide layer is formed.

5. The method of manufacturing the semiconductor device according to claim 1, wherein
   the surface semiconductor layer is epitaxially formed.

6. The method of manufacturing the semiconductor device according to claim 1, further including, before the step (b),
- (s) a step of forming a groove in the peripheral portion of the substrate, the groove functioning as an alignment mark.

7. The method of manufacturing the semiconductor device according to claim 1, wherein
the emitter layer has a flat-surface area larger than a flat-surface area of a source layer composed of the first source layer and the second source layer.

8. The method of manufacturing the semiconductor device according to claim 1, wherein
the surface of the thick-film portion of the first insulating film is formed in the same plane as the surface of the surface semiconductor layer.

* * * * *